(12) United States Patent
Van Der Toorn et al.

(10) Patent No.: US 11,637,512 B2
(45) Date of Patent: Apr. 25, 2023

(54) OBJECT TABLE COMPRISING AN ELECTROSTATIC CLAMP

(71) Applicant: ASML Netherlands B.V., Veldhoven (NL)

(72) Inventors: Jan-Gerard Cornelis Van Der Toorn, Eindhoven (NL); Jeroen Gertruda Antonius Huinck, Eindhoven (NL); Han Willem Hendrik Severt, Beek en Donk (NL); Allard Eelco Kooiker, Waalre (NL); Michaël Johannes Christiaan Ronde, Berghem (NL); Arno Maria Wellink, Veldhoven (NL); Shibing Liu, San Jose, CA (US); Ying Luo, San Jose, CA (US); Yixiang Wang, Fremont, CA (US); Chia-Yao Chen, San Jose, CA (US); Bohang Zhu, San Jose, CA (US); Jurgen Van Soest, Amersfoort (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/351,181

(22) Filed: Jun. 17, 2021

(65) Prior Publication Data
US 2021/0313908 A1    Oct. 7, 2021

Related U.S. Application Data

(63) Continuation of application No. PCT/EP2019/085233, filed on Dec. 16, 2019.
(Continued)

(30) Foreign Application Priority Data

Dec. 20, 2018  (EP) .................................... 18214362
Apr. 30, 2019  (EP) .................................... 19171929

(51) Int. Cl.
*H02N 13/00*    (2006.01)
*G03F 7/20*    (2006.01)

(52) U.S. Cl.
CPC ......... *H02N 13/00* (2013.01); *G03F 7/70708* (2013.01); *G03F 7/70716* (2013.01)

(58) Field of Classification Search
CPC .. H02N 13/00; G03F 7/70708; G03F 7/70716
See application file for complete search history.

(56) References Cited

U.S. PATENT DOCUMENTS 5,872,694 A    2/1999  Hoinkis et al.
6,665,168 B2 *  12/2003  Lin ..................... H01L 21/6831
                                                    361/234
(Continued)

FOREIGN PATENT DOCUMENTS

EP    1118425 A2    7/2001
EP    1118425 A3    2/2004
(Continued)

OTHER PUBLICATIONS

International Search Report issued by the International Searching Authority issued in related PCT Application No. PCT/EP2019/085233, dated Mar. 23, 2020 (4 pgs.).
(Continued)

*Primary Examiner* — Hung V Nguyen
(74) *Attorney, Agent, or Firm* — Finnegan, Henderson, Farabow, Garrett & Dunner, LLP

(57) ABSTRACT

Disclosed is an object table for holding an object, comprising: an electrostatic clamp arranged to clamp the object on the object table; a neutralizer arranged to neutralize a residual charge of the electrostatic clamp; a control unit arranged to control the neutralizer, wherein the residual charge is an electrostatic charge present on the electrostatic clamp when no voltage is applied to the electrostatic clamp.

16 Claims, 27 Drawing Sheets

Related U.S. Application Data

(60) Provisional application No. 62/946,340, filed on Dec. 10, 2019.

(56) References Cited

U.S. PATENT DOCUMENTS

| | | | |
|---|---|---|---|
| 8,840,754 B2* | 9/2014 | Hao | H01L 21/6831 |
| | | | 118/500 |
| 2010/0112819 A1* | 5/2010 | Shindo | H01J 37/32082 |
| | | | 257/E21.218 |
| 2019/0206712 A1 | 7/2019 | Boyd, Jr. et al. | |

FOREIGN PATENT DOCUMENTS

| | | |
|---|---|---|
| JP | H09260475 A | 10/1997 |
| JP | 2004349663 A | 12/2004 |
| JP | 2006303138 A | 11/2006 |
| JP | 2010212678 A | 9/2010 |
| TW | 201903520 A | 1/2019 |
| WO | WO 2018/154706 A1 | 8/2018 |

OTHER PUBLICATIONS

Office Action issued by the Intellectual Property Office (IPO) in related ROC (Taiwan) Patent Application No. 108146586, dated Jul. 22, 2020, 2020 (9 pgs.).

Anonymous, "Research Disclosure", Questel Ireland Ltd, Jun. 20, 2016, www.researchdisclosure.com (6 pgs.).

Notice of Reasons for Rejection from the Japan Patent Office issued in related Japanese Patent Application No. 2021-535560, dated Aug. 1, 2022 (11 pgs.).

Final Notice of Reasons for Rejection from the Japan Patent Office issued in related Japanese Patent Application No. 2021-535560; dated Dec. 23, 2022 (13 pgs.).

Office Action of the Intellectual Property Office of Taiwan issued in related Taiwanese Patent Application No. 108146586; dated Nov. 29, 2022 (16 pgs.).

* cited by examiner

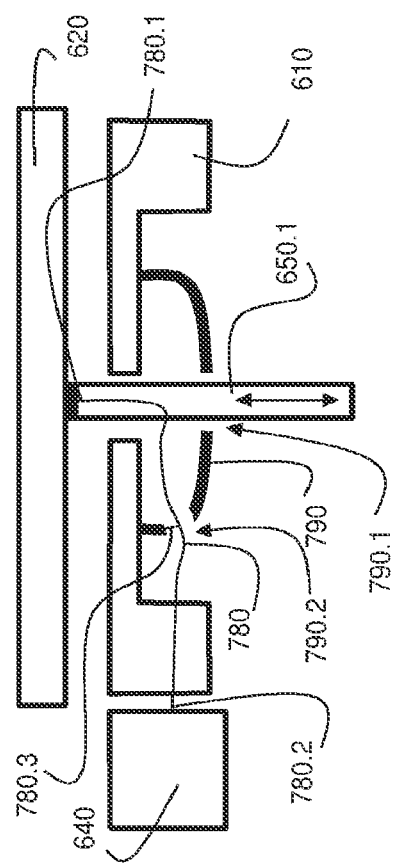

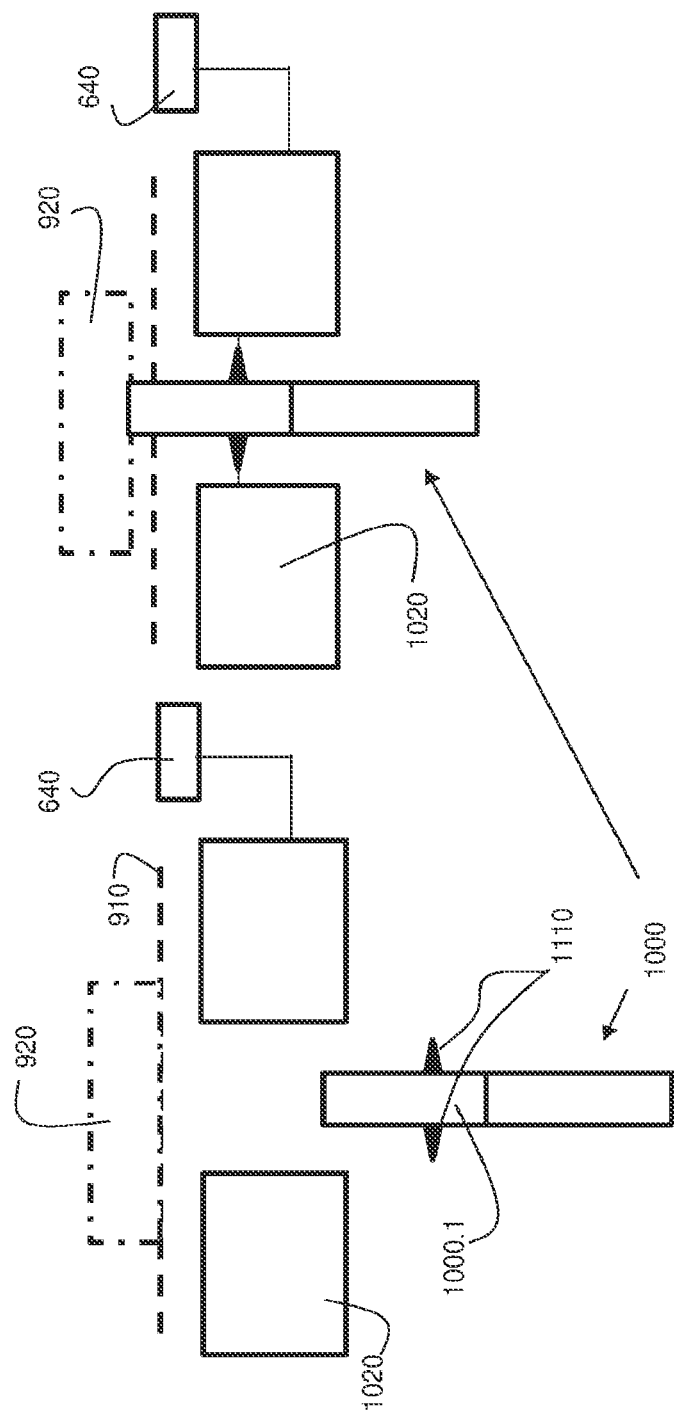

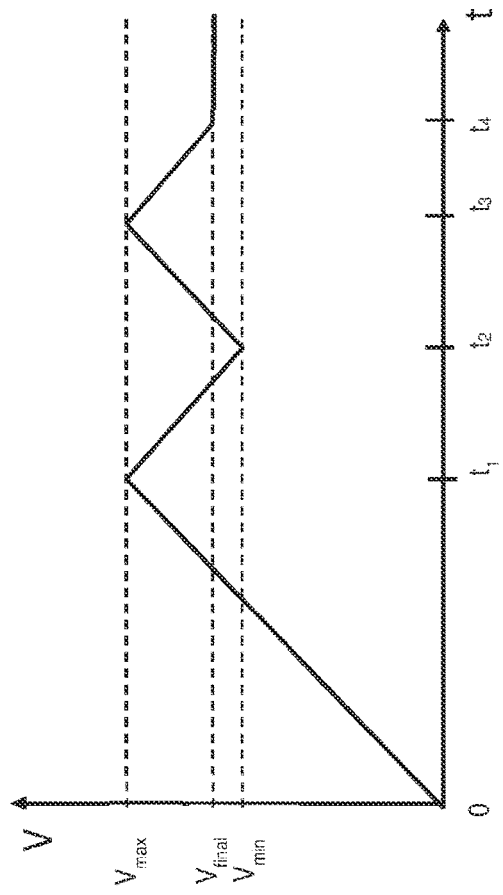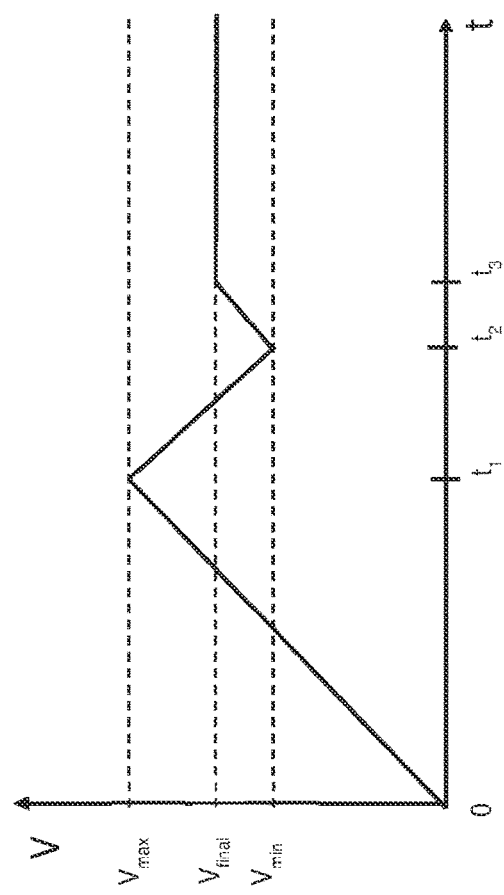

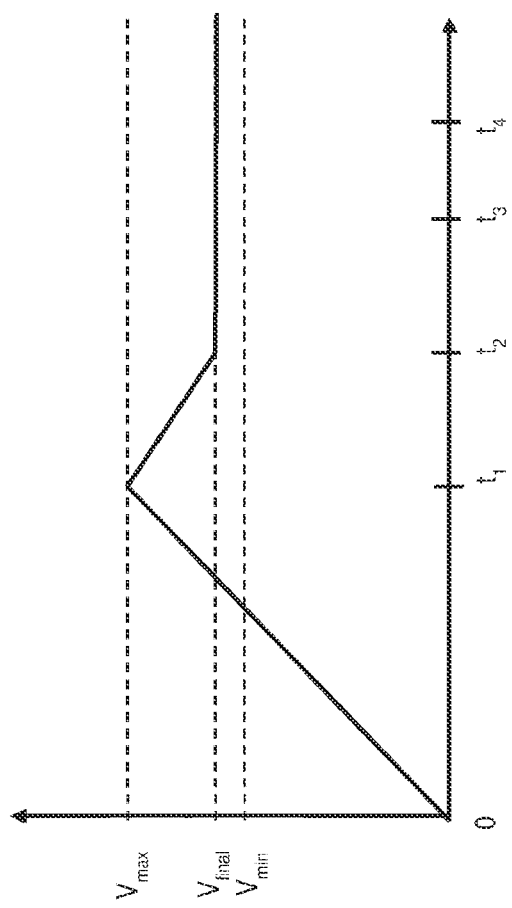

OBJECT TABLE COMPRISING AN ELECTROSTATIC CLAMP

CROSS-REFERENCE TO RELATED APPLICATIONS

This application claims priority of International application PCT/EP2019/085233, which claims priority to EP application 18214362.8, which was filed on Dec. 20, 2018, and to EP application 19171929.3, which was filed on Apr. 30, 2019, and to U.S. application 62/946,340, which was filed on Dec. 10, 2019. Each of these aforementioned applications are incorporated herein by reference in their entireties.

FIELD

The embodiments of the present disclosure relate to an object table, in particular an object table as can be applied in an inspection apparatus such as a particle beam inspection apparatus.

BACKGROUND ART

The embodiments of the present disclosure relate to an object table, in particular an object tables as can be applied in an inspection apparatus such as a particle beam inspection apparatus. Such inspection apparatuses can e.g., be applied for the inspection of objects such as semiconductor substrates, also referred to as wafers, that are applied in lithographic processes. Such inspection apparatuses may also be applied for the inspection of patterning devices, also referred to as reticles.

In semiconductor processes, defects may be generated that may impact device performance and even result in device failure. Device yield may thus be impacted, resulting in cost raise. In order to control semiconductor process yield, defect monitoring is important. One tool useful in defect monitoring is an electron beam inspection system, such as a SEM (Scanning Electron Microscope), which scans a target portion of a specimen using one or more beams of electrons.

During operation of an inspection tool, the substrate is typically held by an object table. The inspection tool will typically comprise a substrate positioning device for positioning the object table, while the substrate is held by the object table, relative to the particle beam such as an e-beam, in order to position a target area on the substrate, i.e., an area that needs to be inspected, in an operating range of the e-beam. Such a substrate positioning device may e.g., comprise a plurality of actuators and motors for realizing the required positioning.

The substrate positioning device e.g., comprises a first part supporting the substrate, for example with an object table of the first part, and a second part that movably supports the first. In these embodiments, movement of the first part with respect to the second part is realized by placing two linear actuator systems on top of each other. The first actuator system is arranged to provide a movement in a first horizontal direction and a second actuation system, supported on the first actuation system is arranged to provide a movement in a second horizontal direction, perpendicular to the first horizontal direction.

The second part supports a short-stroke actuator system that allows to position the object table supporting the substrate in three degrees of freedom, i.e., the vertical direction and rotations about the first and second horizontal directions. This short-stroke position system enables levelling of the substrate in the focal point of the inspection beam.

The inspection E-beam can be manipulated in the first and second horizontal direction by means of a deflection unit in the inspection tool. This functionality may be used for fine positioning of the inspection beam relative to the substrate.

In order to ensure that the object, e.g., the substrate, is maintained at a desired position during the inspection process, the object table is typically configured to apply a clamping force on the object. In order to achieve this, the object table as applied in the inspection apparatus may e.g., comprise an electrostatic clamp that is configured to apply a holding or clamping force onto the object. Such an electrostatic clamp may typically have one or more electrodes, e.g., embedded in a dielectric material. Further, object tables that are used in inspection apparatuses such as particle beam apparatuses may be equipped with an electrode, also referred to as a high-voltage electrode, that is configured to generate an appropriate electric field for the particle beam during the inspection of the object. The application of an electrostatic clamp for holding the object that is to be inspected may pose some problems. In particular, when an electrostatic clamp is used to clamp objects, a charge may build up on a surface of the clamp, which renders the unloading of clamped objects more difficult, i.e., the objects tend to stick to the clamp, even when no voltage is applied to the clamp.

In addition, during the unloading process of an object, there is a risk of sparking or discharging towards the high-voltage electrode or other parts of the object table.

SUMMARY

One of the objects of the present disclosure is to provide an object table for use in an inspection apparatus in which the aforementioned problems are at least mitigated. Such inspection apparatuses can e.g., be applied for the inspection of objects such as semiconductor substrates, also referred to as wafers, that are applied in lithographic processes. Such inspection apparatuses may also be applied for the inspection of patterning devices, also referred to as reticles. The inspection apparatuses in which the object table according to the present disclosure is applied may advantageously also be applied for process control of processes such as lithographic processes. In such arrangements, the inspection apparatuses may e.g., be applied to detect, by inspecting the object, defects on the object, e.g., a substrate, or to assess process parameters such as illumination settings, applied illumination dose, etc. as applied in a lithographic processing of the object. The parameters as determined may then be applied as feedback to adjust the lithographic process.

According to some embodiments of the present disclosure, there is provided an object table comprising:
  a clamping mechanism for holding an object;
  a loading/unloading mechanism configured to contact the object to load or unload the object;
  an electrical conductor configured to electrically connect the object to a voltage source or an electrical ground to apply a predetermined voltage to the object during at least part of an unloading sequence of the object,
wherein the electrical conductor is configured to form a low mechanical stiffness connection when the object is held on the object table.

According to some embodiments of the present disclosure, there is provided an object table for use in an inspection apparatus, the object table being configured to hold an object such as a substrate and comprising:
    an electrostatic clamp configured to hold the object;
    a measurement unit configured to determine an electric characteristic of the electrostatic clamp, the electric characteristic being representative of a charge state of the electrostatic clamp;
    a control unit configured to control, during an unloading of the object, a power supply of the electrostatic clamp, based on the determined electric characteristic.

According to some embodiments of the present disclosure, there is provided an object table for holding an object, comprising:
    an electrostatic clamp arranged to clamp the object on the object table; a neutralizer arranged to neutralize a residual charge of the electrostatic clamp;
    a control unit arranged to control the neutralizer,
wherein the residual charge is an electrostatic charge present on the electrostatic clamp when no voltage is applied to the electrostatic clamp.

According to some embodiments of the present disclosure, there is provided a method for clamping an object on an electrostatic clamp, the method comprising:
    i) providing the object on the electrostatic clamp;
    ii) increasing a clamping voltage until a clamped state is detected in which the object is clamped on the electrostatic clamp;
    iii) determining a first clamping voltage ($V_{max}$) being the clamping voltage at the clamped state;
    iv) providing a second clamping voltage ($V_{final}$) to the electrostatic clamp, which is less than the first clamping voltage ($V_{max}$).

According to some embodiments of the present disclosure, there is provided a method of determining a residual charge of a clamping mechanism of an object table, the method comprising:
    impinging a surface of the clamping mechanism using a particle beam;
    detecting a response of the clamping mechanism caused by the impinging of the surface, and
    determining the residual charge of the clamping mechanism, based on the response.

According to some embodiments of the present disclosure, there is provided a particle beam apparatus comprising:
    a particle beam generator;
    an object table for holding an object, the object table comprising a clamping mechanism for clamping the object to the object table;
    a detector;
    a control unit, the control unit being configured to:
        control the particle beam generator to cause a particle beam to impinge on a surface of the clamping mechanism;
    the detector being configured to detect a response of the clamping mechanism, caused by the clamping mechanism being impinged by the particle beam;
    the control unit further being configured to:
        receive a detector signal from the detector, the detector signal representing the response of the clamping mechanism;
        determine a residual charge on the clamping mechanism, based on the detector signal.

According to some embodiments of the present disclosure, there is provided a method of reducing a surface charge of a clamping mechanism, the method comprising:
    generating a particle beam, the particle beam being configured to have a secondary emission yield (SEY) substantially equal to 1 in a surface of the clamping mechanism;
    impinging the surface of the clamping mechanism using the particle beam.

According to some embodiments of the present disclosure, there is provided a particle beam apparatus comprising:
    a particle beam generator;
    an object table for holding an object, the object table comprising a clamping mechanism for clamping the object to the object table;
    a control unit, the control unit being configured to:
        control the particle beam generator to generate a particle beam, the particle beam being configured to have a secondary emission yield (SEY) substantially equal to 1 in a surface of the clamping mechanism;
        control the particle beam to impinge the surface of the clamping mechanism.

According to some embodiments of the present disclosure, there is provided an object table comprising:
    an electrostatic clamp arranged to clamp the object on the object table; and
    a cleaning device;
wherein the cleaning device is arranged to clean the electrostatic clamp.

According to some embodiments of the present disclosure, there is provided an object table comprising:
    an electrostatic clamp arranged to clamp the object on the object table; and
    one or more electrodes arranged to charge the object;
wherein a first set of the one or more electrodes is arranged to apply an electric charge to the object; and a second set of the one or more electrodes is arranged to electrically discharge the object.

According to some embodiments of the present disclosure, there is provided an object table for holding an object comprising:
    an electrostatic clamp arranged to clamp the object on the object table;
    one or more elevation pins arranged to lift the object up from the object table; and
    a controller configured to send an actuation signal to one or more elevation pin positioning device so as to vibrate the one or more elevation pins and/or at least part of the object table.

BRIEF DESCRIPTION OF THE DRAWINGS

The present disclosure will be readily understood by the following detailed description in conjunction with the accompanying drawings, wherein like reference numerals designate like structural elements, and in which:

FIG. 7c schematically show another arrangement of an electrical conductor, according to some embodiments of the present disclosure.

FIGS. 11a and 11b schematically shows a fourth arrangement of an electrical conductor, according to some embodiments of the present disclosure.

FIG. 17 schematically presents a clamping voltage as provided to the electrostatic clamp according to some embodiments of the present disclosure.

FIG. 18 schematically presents a clamping voltage as provided to the electrostatic clamp according to some embodiments of the present disclosure.

FIG. 19 schematically presents a clamping voltage as provided to the electrostatic clamp according to some embodiments of the present disclosure.

Figure 1:
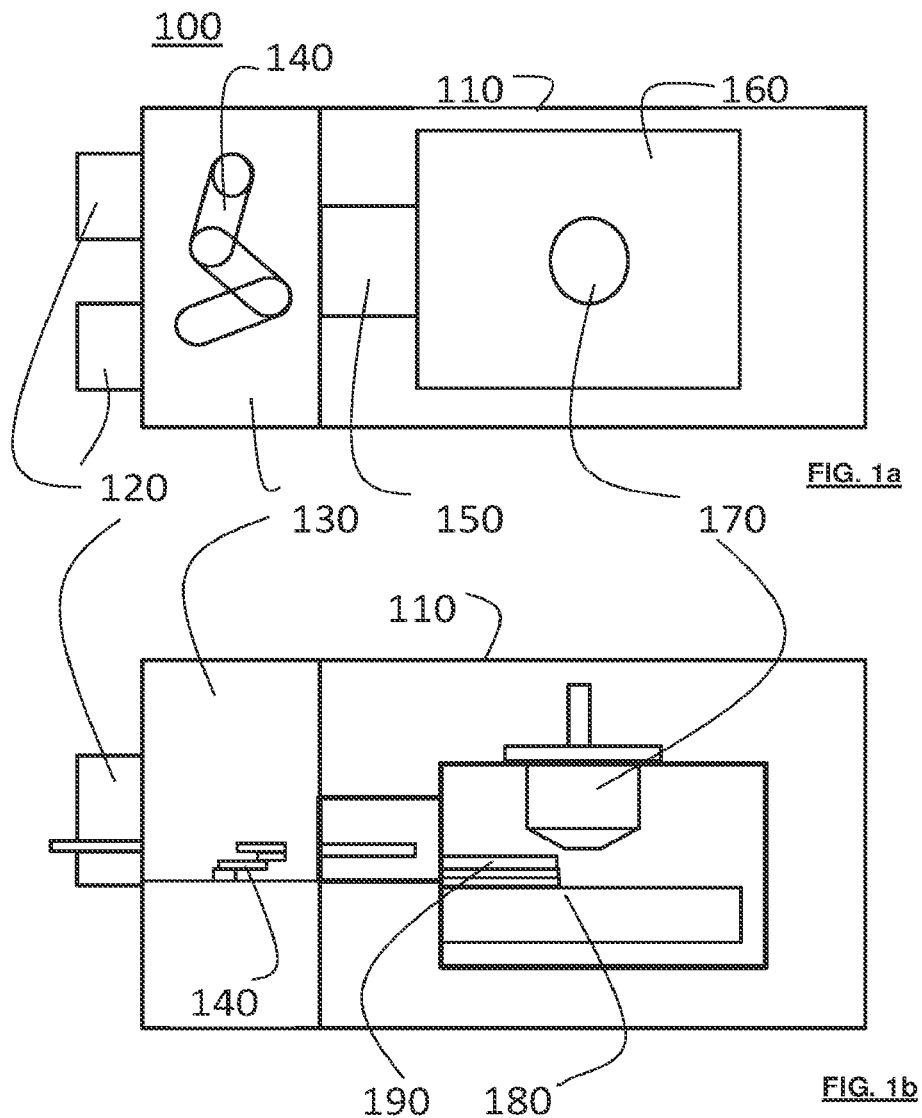
FIG. 1a and 1b are schematic illustrations of an e-beam inspection tool according to some embodiments of the present disclosure.

While the disclosed embodiments are susceptible to various modifications and alternative forms, specific embodiments thereof are shown by way of example in the drawings and may herein be described in detail. The drawings may not be to scale. It should be understood, however, that the drawings and detailed description thereto are not intended to limit the disclosure to the particular form disclosed, but on the contrary, the intention is to cover all modifications, equivalents and alternatives falling within the spirit and scope of the embodiments of the present disclosure as defined by the appended claims.

DETAILED DESCRIPTION OF EXAMPLE EMBODIMENTS

Various example embodiments of the present disclosure will now be described more fully with reference to the accompanying drawings in which some example embodiments of the present disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present disclosure. These embodiments may, however, be embodied in many alternate forms and should not be construed as limited to only the embodiments set forth herein.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure. Like numbers refer to like elements throughout the description of the figures.

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

The term, crossover, refers to a point where the electron beam is focused.

The term, virtual source, means the electron beam emitted from the cathode can be traced back to a "virtual" source.

The inspection tool according to the present disclosure may relate to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure.

FIGS. 1a and 1b schematically depict a top view and a cross-sectional view of an electron beam (e-beam) inspection (EBI) system 100 which may e.g., be according to some embodiments of the present disclosure. The example as shown comprises an enclosure 110, a pair of load ports 120 serving as an interface to receive objects to be examined and to output objects that have been examined. The example as shown further comprises an object transfer system, referred as an EFEM, equipment front end module 130, that is configured to handle and/or transport the objects to and from the load ports. In the example as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the example as shown, the vacuum chamber 160 comprises an electron optics system 170 configured to project an e-beam onto an object to be inspected, e.g., a semiconductor substrate or wafer. The EBI system 100 further comprises a positioning device 180 that is configured to displace the object 190 relative to the e-beam generated by the electron optics system 170.

In some embodiments, the positioning device may comprise a cascaded arrangement of multiple positioners such an XY-stage for positioning the object in a substantially horizontal plane, and a Z-stage for positioning the object in the vertical direction.

In some embodiments, the positioning device may comprise a combination of a coarse positioner, configured to provide a coarse positioning of the object over comparatively large distances and a fine positioner, configured to provide a fine positioning of the object over comparatively small distances.

In some embodiments, the positioning device 180 further comprises an object table for holding the object during the inspection process performed by the EBI system 100. In such an example, the object 190 may be clamped onto the object table by means of a clamp such as an electrostatic clamp. Such a clamp may be integrated in the object table.

In some embodiments, the positioning device 180 comprises a first positioner for positioning the object table and a second positioner for positioning the first positioner and the object table. In addition, the positioning device 180 as applied in the e-beam inspection tool 100 may comprise a heating device that is configured to generate a heat load in the object table.

Figure 2:
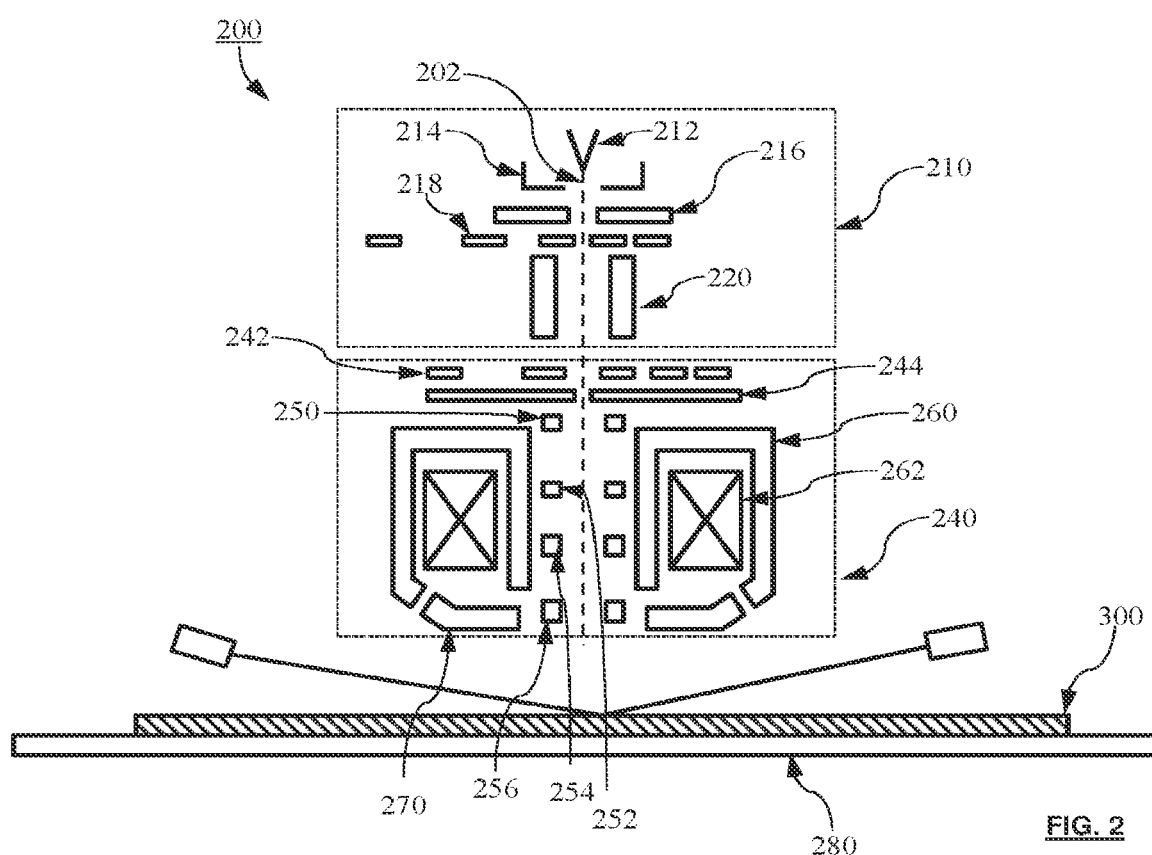
FIGS. 2 and 3 are schematic illustrations an electron optical system as can be applied in some embodiments of the present disclosure.

FIG. 2 schematically depict an example of an electron optics system 200 as can be applied in e-beam inspection tool or system according to the present disclosure. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, in some embodiments the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a ZrO2 is coated on the surface of the tungsten pin and is heated to 1300° C. so as to be melted and cover the tungsten pin but uncover the pinpoint of the tungsten pin. The melted ZrO2 can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g., be an electrostatic lens which can condense the electron beam 202. On the other hand, the condenser 220 can be also a magnetic lens.

Figure 3:
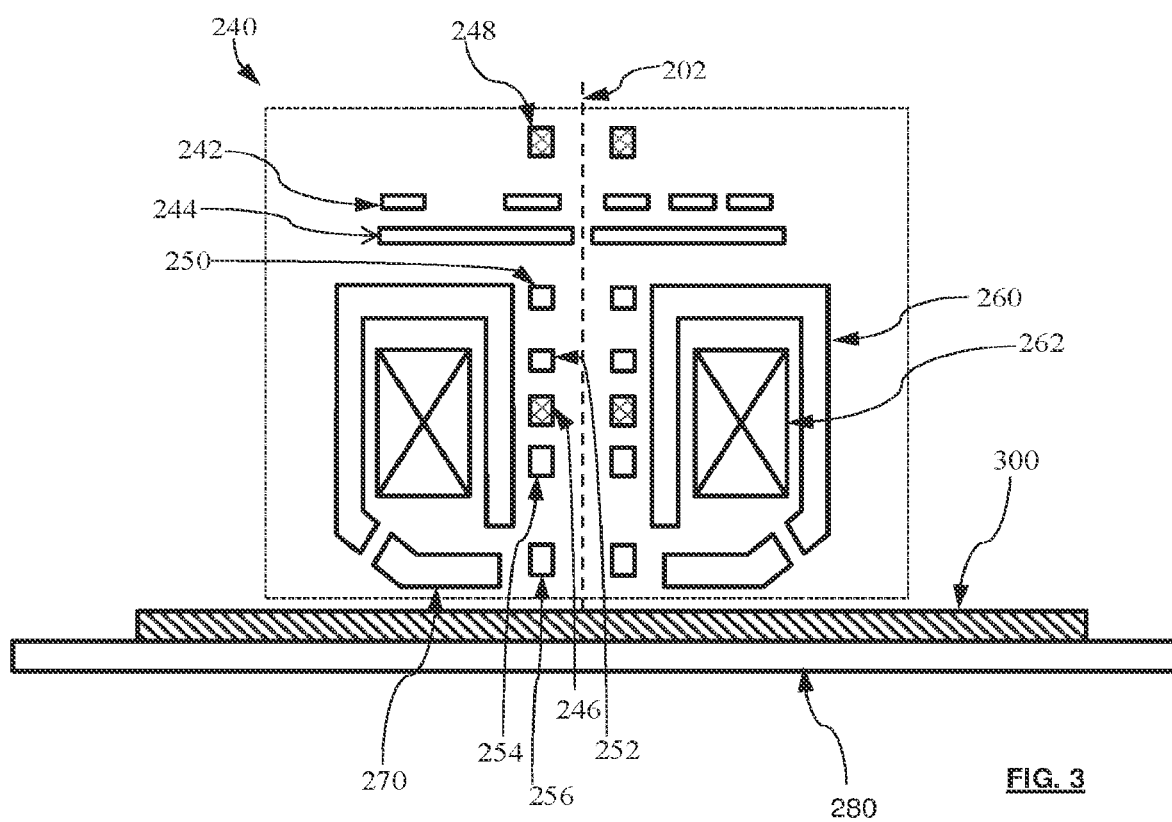

The imaging system 240 as shown in FIG. 3 comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 4:
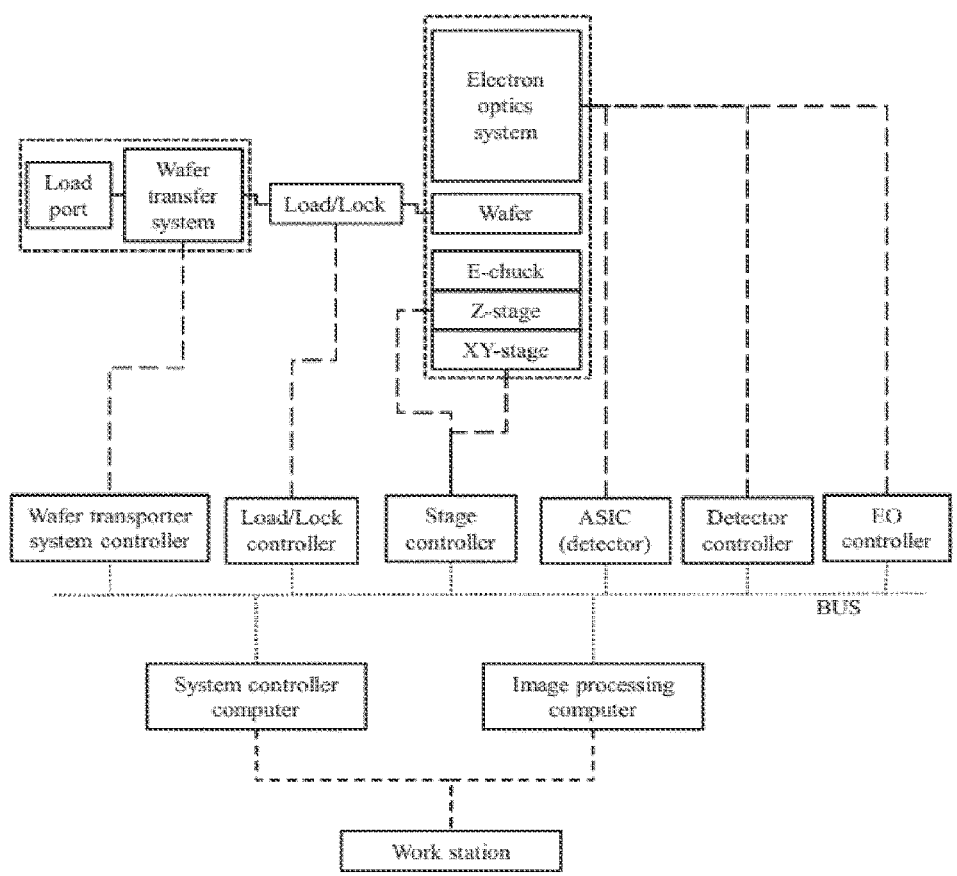
FIG. 4 schematically depicts a possible control architecture of an EBI system according to some embodiments of the present disclosure.

FIG. 4 schematically depicts a possible control architecture of an EBI system according to the present disclosure. As indicated in FIG. 1, the EBI system comprises a load lock, a wafer transfer system, a load/lock, an electron optics system and a positioning device, e.g., including a z-stage and an x-y stage. As illustrated, these various components of the EBI system may be equipped with respective controllers, i.e., a wafer transporter system controller connected to the wafer transfer system, a load/lock controller, an electron optics controller, a detector controller, a stage controller. These controllers may e.g., be communicatively connected to a system controller computer and an image processing computer, e.g., via a communication bus. In the example as shown, the system controller computer and the image processing computer may be connected to a workstation.

The load port loads a wafer to the wafer transfer system, such as EREM 130, and the wafer transfer system controller controls the wafer transfer to transfer the wafer to the load/lock, such as load lock 150. The load/lock controller controls the load/lock to the chamber, such that an object that is to be examiner, e.g., a wafer can be fixed on a clamp, e.g., an electrostatic clamp, also referred to as an e-chuck. The positioning device, e.g., the z-stage and the x-y stage, enable the wafer to move by the stage controller. In some embodiments, a height of the z-stage may e.g., be adjusted using a piezo component such as a piezo actuator. The electron optic controller may control all the conditions of the electron optics system, and the detector controller may receive and convert the electric signals from the electron optic system to image signals. The system controller computer is to send the commands to the corresponding controller. After receiving the image signals, the image processing computer may process the image signals to identify defects.

As mentioned above, during the inspection, the object is held on an object table by means of a clamp or clamping arrangement. Such a clamp or clamping arrangement may e.g., comprise an electrostatic clamp. Such an electrostatic clamp may e.g., comprise one or more electrodes configured to generate an electrostatic field that causes an attractive force between the object, e.g., a substrate, and the clamp. As such, during the inspection process, when the object table may be displaced relative to the inspection beam of radiation, the object can be held at a fixed position on the object table.

In general, the process of inspecting an object such as a substrate may involve the following steps:

In a first step, an object that is to be inspected, is brought in the vicinity of the object table. This can e.g., be done using a robot or handler. Such a robot or handler may e.g., be configured to position the object above the object table, in particular above a support/clamping surface of the object table.

In a second step, the object is mounted to the object table, e.g., onto the support/clamping surface of the object table. This step can e.g., be realized by means of a loading/unloading mechanism of the object table. In some embodiments, such a loading/unloading mechanism may comprise one or more pin-shaped members that can protrude through the object table, support the object and lower the object onto the supporting surface of the object table.

In a third step, once the object is mounted onto the object table, the clamp, e.g., the electrostatic clamp, may be operated in order to clamp the object to the support surface of the object table.

In a fourth step, the inspection process can be performed, during which the object may e.g., be subjected to an inspection beam such as a particle beam, e.g., an electron beam. During such inspection process, the object table and the object as held, can e.g., be displaced relative to the inspection beam by means of a positioner as described above.

In a fifth step, the object may be released, e.g., by de-energizing the clamp or clamp arrangement.

In a sixth step, the object may then be moved away from the support surface, e.g., lifted by the loading/unloading mechanism, in order to be received by a robot or handler, which may then remove the inspected substrate from the inspection apparatus.

It has been observed by the inventors that there may be one or more issues or problems associated with the aforementioned process.

In particular, the following issue may arise when a conventional object table is used in an inspection apparatus during the inspection process as mentioned:

The issue or problem as mentioned relates in particular to the unloading process of the object after the inspection process has been performed. In particular, it has been observed that, when an electrostatic clamp is used to clamp the object, charges may build up on a surface of the electrostatic clamp. Such a build-up of charges may occur gradually, e.g., during the processing of multiple objects. As a result of this surface charge, a voltage of the object may increase when the object is lifted from the object table. This increase of the voltage of the object may cause an electric discharge between the object and the surface of the electrostatic clamp or surroundings, damaging the object, the electrostatic clamp, or the surrounding, or causing contamination of the space around the object and the electrostatic clamp. This may be an issue, especially for any vacuum apparatus where the object and the electrostatic clamp are arranged in a vacuum chamber. Prior to the unloading of the object, the object may e.g., be inspected using a particle beam such as an electron beam. During such inspection, an electrode of the object table, e.g., a high voltage electrode mounted to the object table, may be connected to a voltage source, as well as the object itself. When the object needs to be unloaded, the high voltage electrode may e.g., be grounded and the object is disconnected from the electrode and unloaded by means of a loading/unloading mechanism which can e.g., lift or lower the object from the object table. The remaining surface charge on the electrostatic clamp during the unloading process may also cause an attracting force between the object and the electrostatic clamp. Required force for unloading the object by an unloading mechanism may increase or even the unloading mechanism may not be able to lift and unload the object.

In known arrangements, the lifting or lowering mechanism of an object table will in general be made from electrically insulating members, in order to ensure that no sparking or discharging towards the members occurs during the inspection process. It has been observed by the inventors that the increase of the voltage of the object occurring during the unloading of the object may be such that it causes a discharging or sparking, e.g., towards the high-voltage electrode which is typically grounded during the unloading process.

Figure 5:
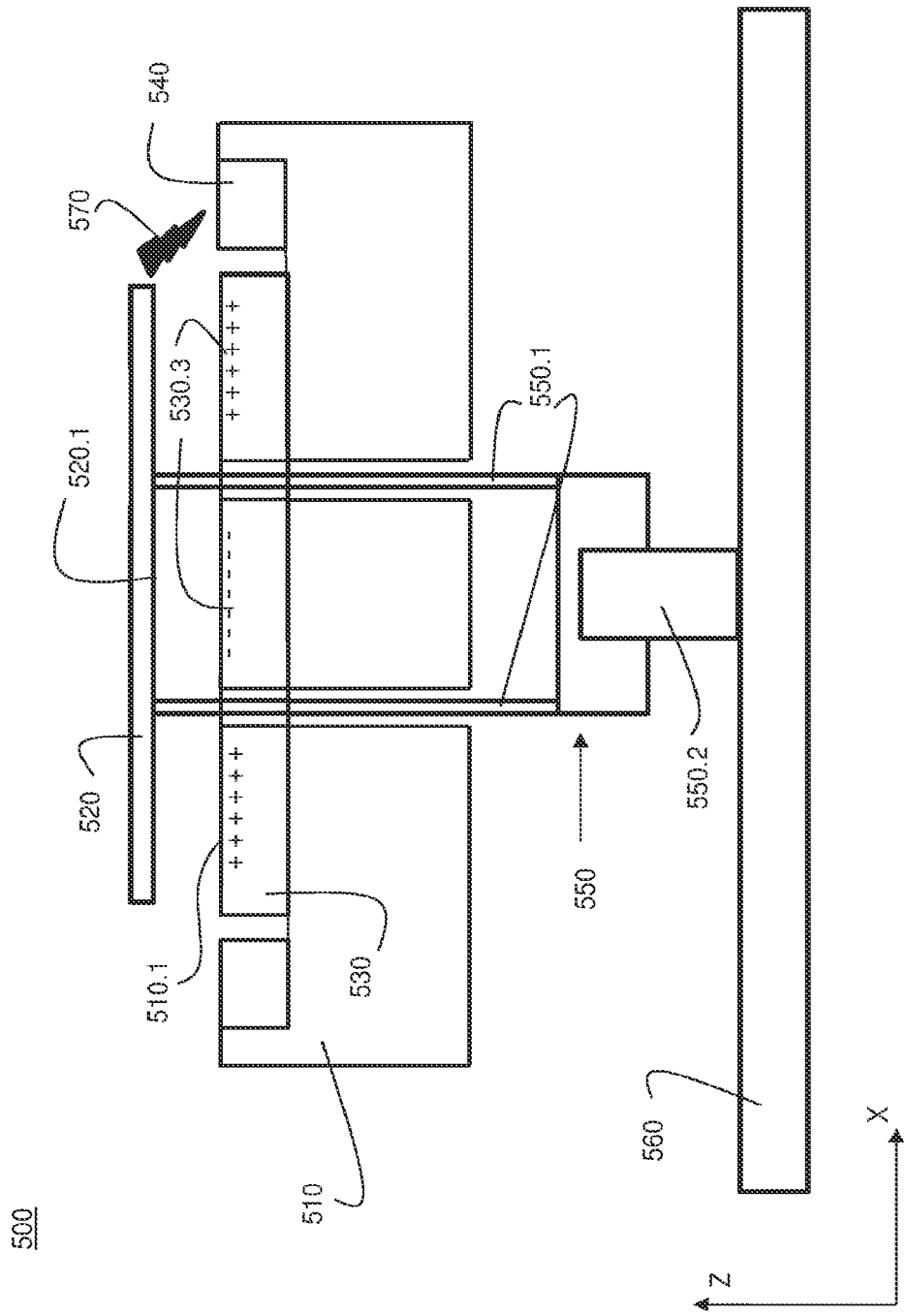
FIG. 5 schematically shows a cross-sectional view of an object table.

An object table that may suffer from the above-mentioned issue or problem is schematically shown in FIG. 5.

FIG. 5 schematically shows a cross-sectional view of an object table as known in the art. FIG. 5 schematically shows a cross-sectional view of an object table 500, the object table 500 comprising a support member 510. The object table 500 further comprises an electrostatic clamp 530 that is arranged in a recess of the support member, the electrostatic clamp 530 having a support surface 510.1 for supporting an object 520, e.g., a semiconductor substrate. Such an electrostatic clamp may be provided with one or more electrodes which can be connected to a voltage supply. The object table 500 further comprises an electrode 540, the electrode 540 surrounding the support surface 510.1 onto which the object 520 is mounted during the inspection. In a particle beam inspection apparatus, such an electrode 540 may e.g., be applied to generate a suitable electric field for inspecting the object. In an electron beam inspection apparatus, the electrode may e.g., be connected to a negative voltage source during the inspection of the object 520. The object table 500 further comprises a loading/unloading mechanism 550 comprising pin-shaped members 550.1. During use, the members 550.1 can be displaced in vertical direction by means of an actuator 550.2, thus enabling the object 520 to be lifted from the support surface 510.1 (i.e., unloaded the object) or enabling the object 520 to be lowered onto the support surface 510.1 (i.e., loading the object). In the arrangement as shown, the actuator 550.2 may e.g., be mounted to a positioning device 560 configured to position the object table 500. Typically, the positioner and the actuator 550.2 would be grounded. Since the electrostatic clamp 530 and the electrode 540 may be at comparatively high voltages during operation, the pin-shaped members 550.1 are typically made from electrically isolated materials, in order to avoid a discharging or sparking. The known object table 500 as schematically shown in FIG. 5 may suffer from the above-mentioned issue. This can be illustrated as follows:

During the clamping of objects such as semiconductor substrates, a gradual build-up or accumulation of charges may occur on the surface of the electrostatic clamp 530. In FIG. 5, such an accumulated charge, also referred to as surface charge, is indicated by + and − signs 530.3. In the arrangement as shown, the surface charge is generated on a surface of the electrostatic clamp 530 that faces a bottom surface of the object 520. As a result of this surface charge, a voltage will be induced in the object 520 when the object 520 is lifted from the support surface 510.1, i.e., when the object is unloaded. This voltage is caused by the fact that the object is insulated from the electrostatic clamp, i.e., at a floating potential. When, during the unloading, the object is lifted from the support surface by means of the insulated pin-shaped members 550.1, a voltage is induced in the object 520 due to the varying capacitance formed by the bottom surface 520.1 of the object 520 and the surface of the electrostatic clamp that is provided with the surface charge 530.3. As the distance between both surfaces increases, the capacitance value decreases, causing an increase of the voltage on the object 520. This increased voltage on the object may cause a spark 570 from the object 520 to a nearby conductive surface, e.g. to the electrode 540.

In order to mitigate this sparking problem, it has been proposed to provide an electrical connection between the electrode of the object table and a top portion or tip of the loading/unloading mechanism. Such a known arrangement is schematically shown in FIG. 6.

Figure 6:
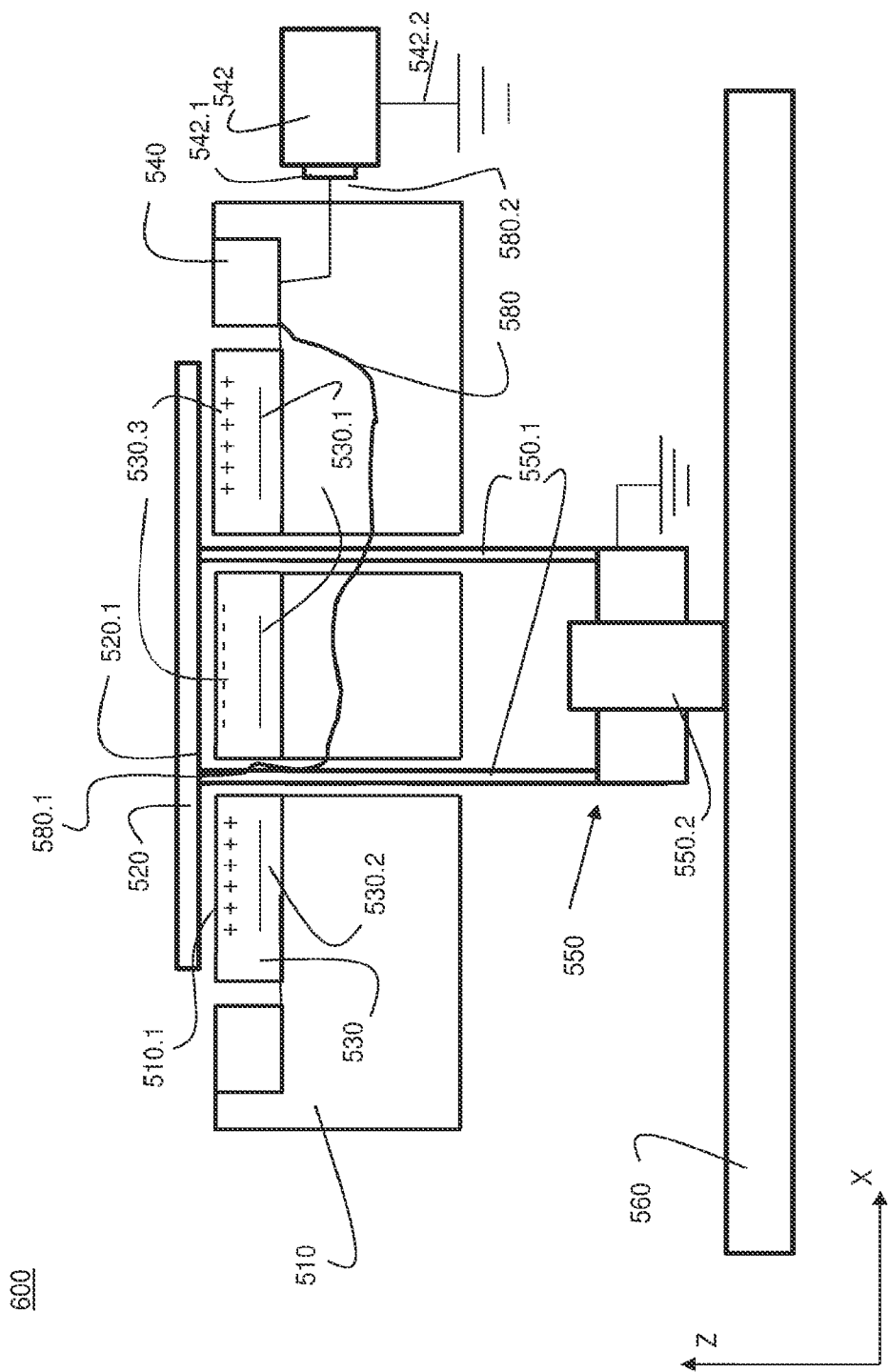
FIG. 6 schematically shows a cross-sectional view of another object table.

FIG. 6 schematically shows a cross-sectional view of an object table as known in the art. FIG. 6 schematically shows a cross-sectional view of an object table 600, the object table 600 comprising, similar to the object table 500 of FIG. 5, a support member 510 and an electrostatic clamp 530 that provides a support surface 510.1 for supporting an object 520, e.g., a semiconductor substrate. In the arrangement as shown, the electrostatic clamp 530 is arranged in a recess of the support member 510. In the arrangement as shown, the electrostatic clamp is be provided with one or more clamping electrodes 530.1 which can be connected to a voltage supply (not shown). In the arrangement as shown, the object table 600 further comprises an electrode 540 arranged adjacent the support surface 510.1. During use, the electrode 540 may e.g., be connected to a voltage source 542, e.g., a negative voltage source. In the arrangement as shown, the voltage source 542 is schematically represented by an output terminal 542.1 via which a suitable voltage can be applied to the electrode 540. The electrode 540, which may also be referred to as the high-voltage electrode 540 may be, during inspection, connected to a suitable voltage such that a substantially uniform electric potential is produced around the object 520. The object table 600 further comprises a loading/unloading mechanism 550 comprising pin-shaped members 550.1. During use, the members 550.1 can e.g., be displaced in vertical direction by means of an actuator 550.2, thus enabling the object 520 to be lifted (i.e., unloaded) from the support surface 510.1 or enabling the object 520 to be lowered (i.e., loaded) onto the support surface 510.1. In the arrangement as shown, the actuator 550.2 may e.g., be mounted to a positioning device 560 configured to position the object table 600. In the arrangement as shown, the pin-shaped members 550.1 are considered to be made from electrically isolated materials. In the arrangement as shown, the object table 600 further comprises an electrical conductor 580 which connects a top surface of the pin shaped member 550.1 to the electrode 540. In particular, in the arrangement as shown, the electrical conductor 580 comprises an electrically conductive wire having one end 580.1 electrically connected to a top surface of the pin-shaped members 550.1 and another end 580.2 connected to the electrode 540. By doing so, the electrical conductor 580 is kept at the same potential as the electrode 540. During the inspection process, the pin-shaped members 550.1 are in a retracted position such that there is no contact between the pin-shaped members 550.1 and the object 520. When the object needs to be unloaded, the voltage source 542 supplying the voltage of electrode 540 will be turned off or will output a low voltage, e.g., 0V. In the example as shown, the same voltage will be applied to the electrical conductor 580. When the object is subsequently unloaded, the pin-shaped members 550.1 will be moved upwards resulting in a contacting of the top surface of the pin-shaped members 550.1 with the bottom surface 520.1 of the object 520. As a result, the object 520 will remain at the voltage as generated by the voltage source 542, and supplied to the electrode 540, e.g., 0 V, during the unloading. By doing so, the risk of sparking, e.g., from the object 520 to the electrode 540, can be reduced.

The arrangement as schematically shown in FIG. 6 has been found to suffer from the following drawbacks:

It has been observed that the application of the electrical conductor 580 as schematically shown in FIG. 6 may result in the generation of a comparatively large electric field in the vicinity of the electrical conductor 580. As a result, an undesired so-called field emission or field electron emission may occur. In particular when the applied voltage to the electrode 540 is comparatively high, such a risk occurs. At present, there is a tendency to increase the voltage as applied to the electrode 540 during inspection, in order to improve the inspection process. As such, voltages in the range of −5 kV to −50 kV or higher may be applied. When such voltages are applied to an electrode 540 as shown in FIG. 6, the application of the electrical conductor 580 in would result in the mentioned field emission.

The known arrangement whereby an electrical connection 580 is provided between the pin-shaped member 550.1 of the loading/unloading mechanism 550 and the electrode 540 may cause mechanical disturbances during the inspection process. As can be seen in FIG. 6, the electrical connection 580 results in a permanent mechanical connection between the electrode 540, which is mounted to the support member 510, and the pin shaped member 550.1, which is mounted to the positioning device 560. Such a mechanical short-circuit between the positioning device 560 and the support member 510 may cause a transmission of vibrations from the positioning device 560 to the support member 510 supporting the object 520. Such vibrations of the support member 510 may adversely affect the inspection process. For accurate positioning of the object, the positioning device 560 may e.g., comprises a cascaded arrangement of a fine positioning device and a coarse positioning device. The fine positioning device may also be referred to as a short stroke positioning device, whereas the coarse positioning device may also be referred to as a long stroke positioning device. In such an example, the support member 510 may e.g., be accurately positioned by a short stroke positioning device (not shown) while the support member 510, together with the short stroke positioning device can be displaced over comparatively large distances by the positioning device 560. In such an example, 560 may e.g., refer to the mover of a linear or planar motor which is configured to move the support member, together with the short stroke positioning device, over comparatively large distances.

One of the objects of the present disclosure is to overcome or at least mitigate the aforementioned drawbacks of the arrangement as shown in FIG. 6.

In particular, in accordance with a first aspect of the present disclosure, measures are taken to avoid or mitigate the occurrence of field electron emissions and/or to avoid or mitigate the transmission of vibrations towards the support member supporting the object that is inspected.

In accordance with the first aspect of the present disclosure, there is therefore provided, in some embodiments, an object table comprising:
  a clamping mechanism for holding an object such as a substrate;
  a loading/unloading mechanism configured to contact a bottom surface of the object to load or unload the object;
  and wherein the object table further comprises an electrical conductor configured to electrically connect the object to a predetermined voltage during at least part of an unloading sequence of the object.

In some embodiments, the electrical conductor is configured to form a low mechanical stiffness connection when the object is held on the object table. In some embodiments, such a low mechanical stiffness connection may be realised by appropriate shaping or forming the electrical conductor. With respect to the meaning of a 'low mechanical stiffness', it can be pointed out that, within the meaning of the present disclosure, a mechanical stiffness equal to zero is considered an example of a low mechanical stiffness. In particular, in various embodiments of the present disclosure, the electrical conductor can be configured to electrically connect the object to a predetermined voltage during at least part of an unloading sequence of the object and may be open, i.e. mechanically disconnected when the object is held on the object table.

In some embodiments, the electrical conductor may e.g. have a cross-section and a mechanical stiffness of the electrical conductor is lower than the mechanical stiffness of an electric wire having the same cross-section.

Such an example may e.g. be realised by providing the electrical conductor with a coil-shaped or spiral-shaped portion.

Figure 7A:
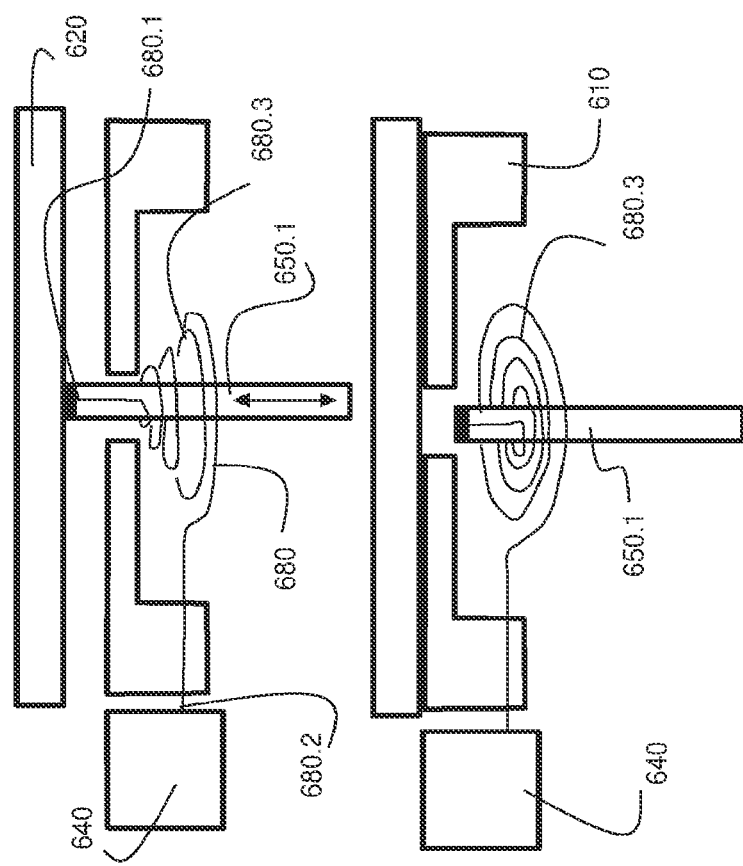
FIGS. 7a and 7b schematically show a first arrangement of an electrical conductor, according to some embodiments of the present disclosure.
Figure 7B:
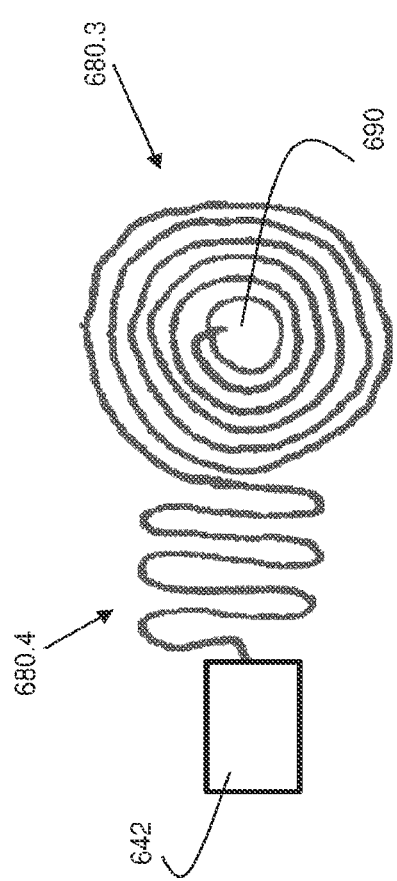

In some embodiments according to the first aspect of the present disclosure, the electrical conductor as applied comprises a coil shaped portion. An example of such an electrical conductor is schematically shown in FIGS. 7a and 7b. In the example as shown, an electrical connector or wire 680 is connected to an electrode 640 during the inspection of an object 620. As such, the wire 680 may be at a comparatively high, e.g., negative, voltage during an inspection process. In the example as shown, the electrical connector 680 is connect at one end 680.1 to the top of a pin-shaped member 650.1 and at the other end 680.2 to the electrode 640. In the example as shown, the electrical wire 680 is advantageously arranged in a particular shape, in order to mitigate the electric field that is generated when the wire is at the comparatively high voltage. In particular, the wire 680 comprises a coil-shaped portion 680.3, i.e., a portion whereby the wire 680 is arranged in a spiraling manner. As a result, the maximum electric field that is generated by the wire when connected to a voltage source is reduced, thus reducing the risk of so-called field emission or field electron emission. Within the meaning of the present disclosure, coil-shaped refers to having multiple windings or turns or being arranged in a spiraling manner. It may also be referred to as spring shaped.

As an alternative to the use of an electrical wire as the electrical conductor, the use of a flexible PCB connector can be mentioned as well. Such a flexible PCB or flex PCB may be described as a sheet of conductive material that is covered on both sides by an insulating layer. Such a flex PCB may easily be cut into a coil or spiral shape and applied as flexible conductor in some embodiments of the present disclosure.

FIGS. 7a and 7b schematically show a possible arrangement of the electrical conductor 680 as can be applied in some embodiments of the present disclosure. The electrical conductor 680 may e.g., be a bare wire, i.e., an uninsulated wire, shaped as e.g., shown in FIGS. 7a, 7b. A part of the electrical conductor 680 may also be an electrically insulated or shielded cable that is arranged between the pin-shaped member 650.1, in particular the top or tip thereof, and the electrode 640 or a flex PCB. The electrical conductor 680 may also comprise a first part comprising a bare, uninsulated wire and a second part comprising an electrically insulated or shielded cable.

FIG. 7a schematically shows a cross-sectional view of a pin-shaped member 650.1 and an electrical conductor 680 for two different positions of the pin-shaped member. In the top portion of FIG. 7a, the pin-shaped member. 650.1 is in an elevated position, thereby contacting the object 620, whereas in the bottom portion of FIG. 7a, the pin-shaped member 650.1 is in a retracted position, such that the object 620 is arranged on the object table 610. In the example as shown, the electrical wire 680, i.e., the electrical wire forming the electrical conductor 680, is arranged in a spiraling manner around the pin-shaped member 650.1 and is arranged between the top of the pin-shaped member 650.1 and an electrode 640. The electrode 640 may also be arranged on the object table 610, e.g., in a similar manner as electrode 540 is arranged on the support member 510. By arranging the electrical wire 680 in a spiraling, i.e., coil-shaped manner, the electric field as generated around the conductor can be mitigated.

FIG. 7b schematically shows a top view of a possible arrangement of an electrical wire 680 between a top 690 of a pin-shaped member and an electrode 640. In the example as shown, a first portion 680.3 of the electrical wire 680 is arranged in a spiraling manner around the top, a second portion 680.4 of the electrical wire 680 is arranged in a meandering manner towards the electrode 640.

In the embodiments as shown in FIGS. 6, 7a and 7b, the electrical conductor 680 is arranged to connect a top surface of a pin-shaped lifting member 650.1 to an electrode 640 of the object table 600. As will be appreciated by the skilled person, the electrical conductor 680 may also be made between the top surface of the pin-shaped lifting member 650.1 and an output terminal of a voltage source, e.g., a voltage source such as voltage source 542. In such an example, the electrical conductor 680 may comprise an electrically conductive wire having one end 680.1 connected to a top surface of the pin-shaped members 650.1 and another end 680.2 connected to an output terminal such as output terminal 542.1 of a voltage source 542. By doing so, the electrical conductor 680 is kept substantially at the same potential as the electrode 640.

Regarding this alternative example, it can be pointed out that the voltage source 542 may e.g., be arranged on the positioner 660. As such, the electrical conductor 680 would preferably at least partially be a shielded wire or cable extending between the output terminal 542.1 of the voltage source 542 and the pin-shaped member 650.1. in such arrangement, it may be advantageous to have at least one unshielded portion on the electrical connection, such unshielded portion having a lower stiffness so as to mitigate the transfer of vibrations between the positioner 660 and the object table 600.

As an alternative to providing the electrical conductor 680 with a coil shaped or spiraling portion, in order to mitigate or avoid field electron emission, the application of an electrically conducting shield may be considered as well. Such an example is schematically shown in FIG. 7c. FIG. 7c schematically shows a cross-sectional view of a pin-shaped member 650.1 and an electrical conductor 680, the pin-shaped member 650.1 being in an elevated state, thereby lifting the object 620 above the object table 610. In the example as shown, an electrical wire 780 is arranged at one end 780.1 to the top of the pin-shaped member 650.1 and, at another end 780.2 to an electrode 640. The electrode 640 may e.g., be arranged on the object table 610, e.g., in a similar manner as electrode 540 is arranged on the support member 510. The example as shown further comprises an electric shield 790 that can e.g., be mounted to the object table 610. In the example as shown, the electric shield may e.g., have a semi-spherical shape and comprises a first aperture 790.1 allowing the pin-shaped member to protrude and a second aperture 790.2 allowing the electrical wire 780 to pass through. Such an electric shield 790 enables to mitigate or avoid field electron emission as well.

In the example as shown, the electrical wire 780 comprises a conductor 780.3 connecting the wire to the shield 790, thus ensuring that the shield is at the same voltage as the wire it is shielding. Alternatively, the electrical wire 780 may comprises a first wire connecting the electrode 640 to the shield 790 and a second wire connecting the shield 790 to the pin-shaped member 650.1, in particular to a conductive top-portion of the pin-shaped member. Alternatively, the shield may be mechanically connected to the pin-shaped member 650.1 and move along with the pin-shaped member. In such an example, the electrical wire 780 may also comprise a first wire connecting the electrode 640 to the shield 790 and a second wire connecting the shield 790 to the pin-shaped member 650.1. alternatively, the shield may be mechanically connected to a conductive top portion of the pin-shaped member 650.1. In such an example, only an electrical wire between the electrode 640 and the shield 790 is required.

In the an example as described with reference to FIGS. 7a and 7b, the application of an electrical conductor having a coil shaped portion also provides a reduced mechanical stiffness between the pin-shaped member 650.1 and the electrode 640. By arranging at least part of the electrical conductor 680 in a spiraling or meandering manner, a reduced mechanical stiffness of the conductor is obtained. As a result, a transmission of vibrations, e.g., from the pin-shaped member 650.1 to the electrode 640, is reduced. This enables a more accurate inspection process of the object 620.

In some embodiments of the present disclosure, the loading/unloading mechanism comprises one or more lifting members, e.g., pin-shaped lifting members, of which a contact area that is configured to contact the object during loading and unloading, is permanently grounded. This can e.g., be realized, in some embodiments, by making the lifting members from an electrically conducting material. Alternatively, an electrically conducting wire can be connected between the contact area, e.g., a top surface of the pin-shaped members, and an electric ground terminal.

It should be pointed out that in such an example, the pin-shaped lifting members may need to be retracted over comparatively large distances, in order to avoid a sparking during the inspection process.

Depending on the applied voltage to the electrode 640 during the inspection process, it may be required to retract the pin-shaped lifting members, for example, several centimeters below the electrostatic clamp, e.g., 50 mm. In such an example, the permanently grounded pin-shaped member should be retracted or lowered such that a distance between the pin-shaped member and the electrode 640, i.e., the high voltage electrode of the object table, is large enough to avoid a discharge between the pin-shaped member and the electrode.

In an alternative example, the object table is provided with a dedicated pin-shaped member for grounding the object during the unloading or at least part of the unloading sequence of the object. Such an example is schematically shown in FIG. 8.

Figure 8:
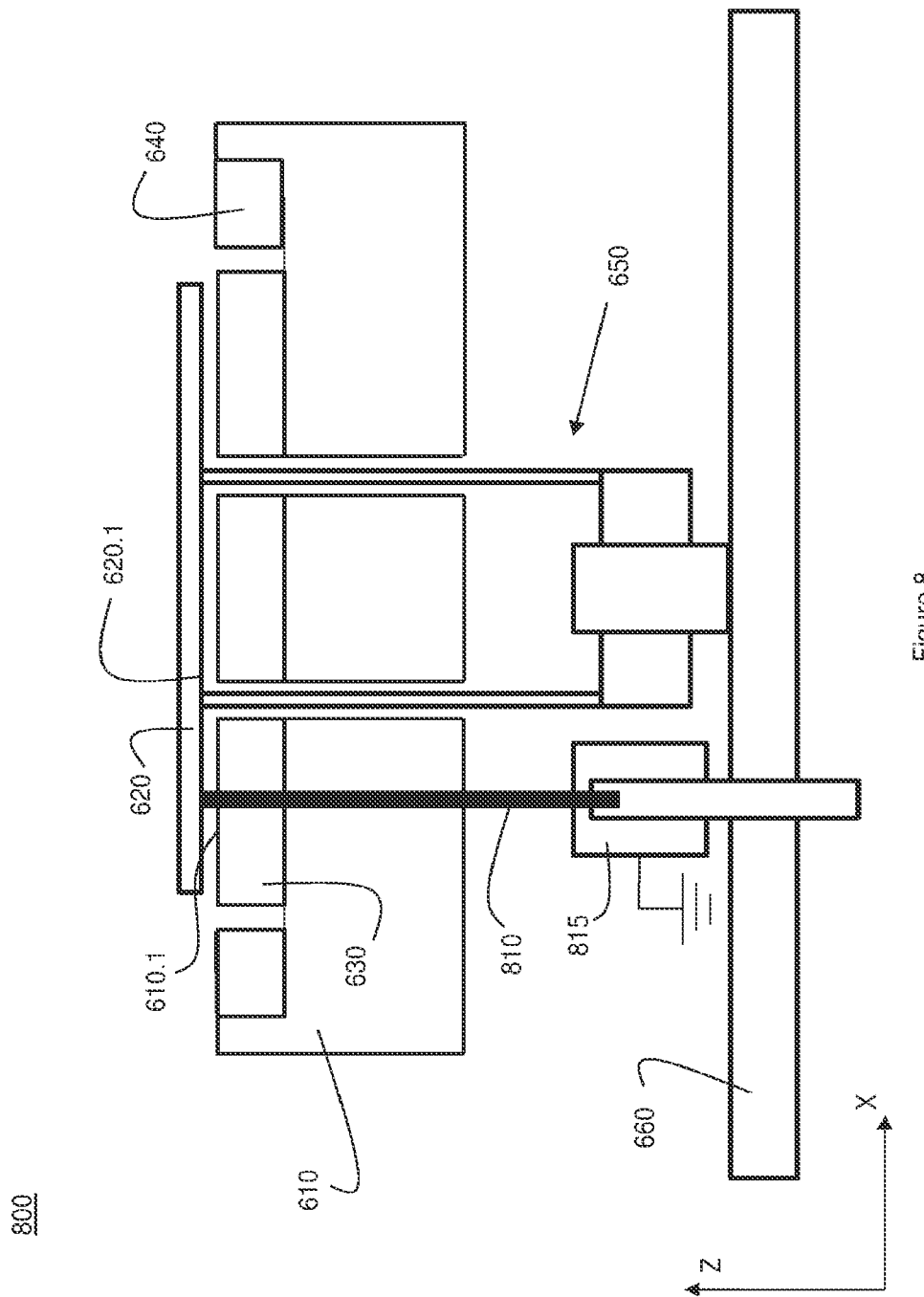
FIG. 8 schematically shows a cross-sectional view of a second object table, according to some embodiments of the present disclosure.

In FIG. 8, an object table 800 according to some embodiments of the present disclosure is schematically shown, the object table 800 including, a support member 610 and an electrostatic clamp 630 that provides a support surface 610.1 for supporting an object 520, e.g., a semiconductor substrate. a support member 610 having a support surface 610.1 for supporting an object 620, e.g., a semiconductor substrate or reticle. In the example as shown, an electrostatic clamp 630 is arranged in a recess of the support member 610. The object table further comprises an electrode 640 and a loading/unloading mechanism 650. Further details such as the electrode arrangement of the electrostatic clamp 630 or the voltage supply for the electrode 640 are omitted for clarity. In the example as shown, the object table 800 further comprises a pin-shaped member 810 that is configured to contact the object 620, in particular a bottom surface 620.1 of the object 620. In the example as shown, the pin-shaped member 810 is considered to be made from an electrically conducting material and is permanently grounded. In the example as shown, the pin-shaped member 810 can be moved in the indicated Z-direction by means of an actuator 815. In accordance with the present disclosure, the permanently grounded pin-shaped member 810 can be applied to, before and/or during an unloading sequence, or part thereof, ground the object 620, by raising the member 810 such that it contacts the object 620, during the unloading. As a result of the grounding, there will be no voltage induced in the object 620 such that the risk of sparking of the object 620, e.g., towards the electrode 640, is reduced. Also, in these embodiments, it is important to ensure that the pin-shaped member 810 is configured to be sufficiently retracted or lowered during the inspection, such that a distance between the pin-shaped member 810 and the electrode 640, i.e., the high voltage electrode of the object table, is large enough to avoid a discharge between the pin-shaped member and the electrode.

The above-described embodiments whereby a permanently grounded pin-shaped member is applied provides the advantage that there is no wired electrical connection between the pin-shaped member and a high voltage electrode of the object table which could result in a transmission of vibrations. It can also be pointed out that the application of such a dedicated permanently grounded pin-shaped member may be comparatively straightforward since this member only needs to contact the object during unloading. An accurate position control of the member, e.g., to control the position of the object during loading/unloading, is therefore not required. In some embodiments of the present disclosure, whereby the object table is provided with a high voltage electrode as described above, a discharging towards the high voltage electrode is avoided or mitigated by increasing a distance between the high voltage electrode and the object that is to be unloaded, prior to the unloading sequence. This can e.g., be realized by configuring the high voltage electrode in such manner that it can be retracted, e.g., lowered or moved away from the object. In such an example, the high voltage electrode may e.g., be configured as a retractable high voltage ring, which can e.g., be lowered prior to the unloading of the object. Alternatively, the clamping mechanism for holding an object of the object table can be configured to be moved away from the high voltage electrode, prior to the unloading sequence. In such an example, the clamping mechanism holding the object may be elevated, relative to the high voltage electrode. As a result, the distance between the clamping mechanism and the high voltage electrode is increased, thus reducing the risk of a discharging from the object to the high voltage electrode.

Figure 9:
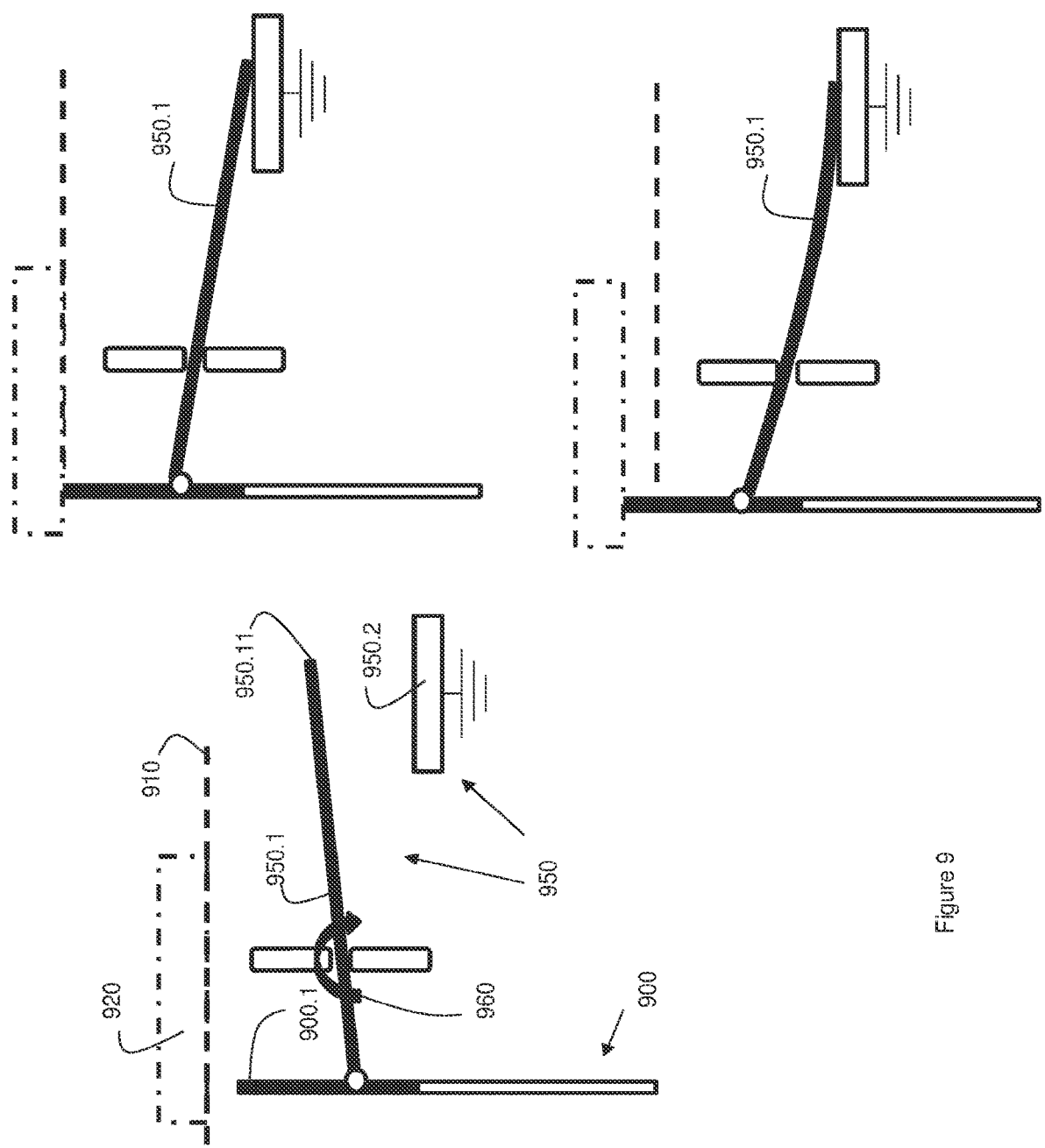
FIG. 9 schematically shows a second arrangement of an electrical conductor, according to some embodiments of the present disclosure.
Figure 10:
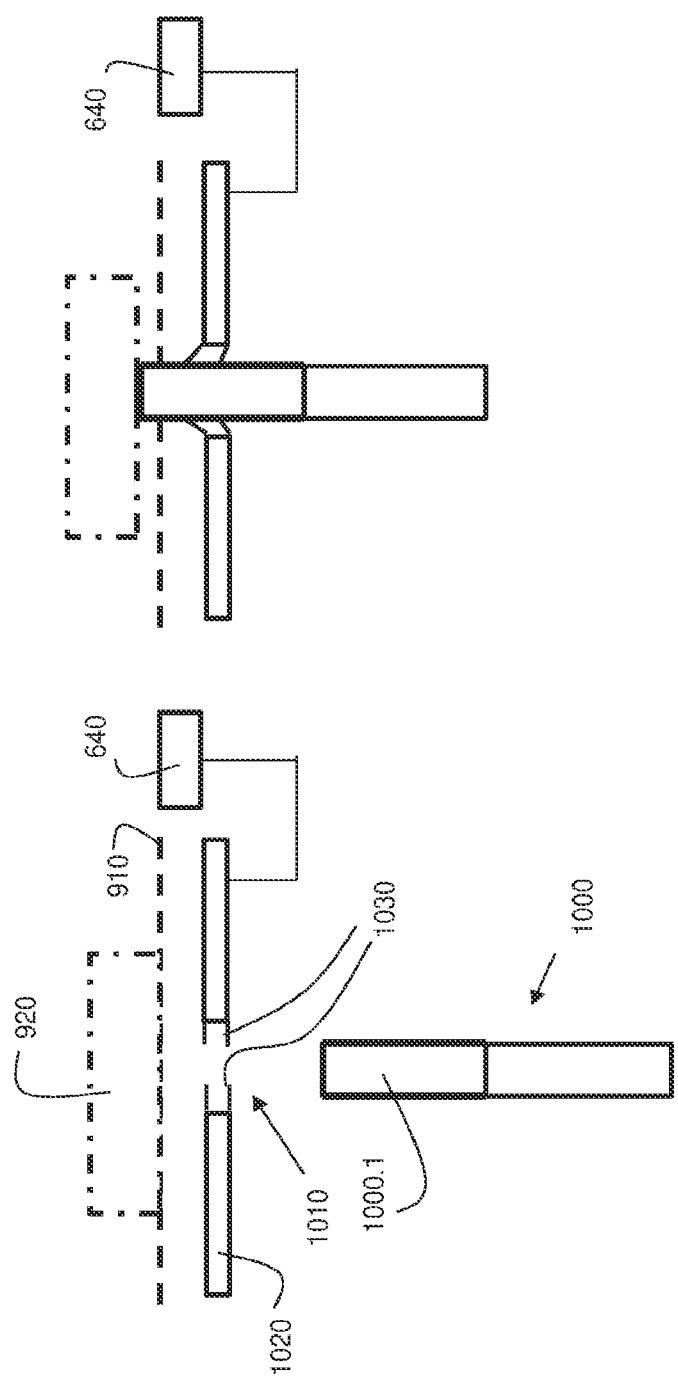
FIG. 10 schematically shows a third arrangement of an electrical conductor, according to some embodiments of the present disclosure.

In some embodiments, the electrical connector as applied in the object table according to the present disclosure comprises two members. In such an example, the two members of the electrical connector may be configured to form an electrical connection under certain conditions. In particular, the two members of the electrical connector may be configured to connect when the loading/unloading mechanism is in a certain position or in a certain range. By doing so, one can e.g., ensure that a mechanical connection between the two members is absent during an inspection process and is only present during at least a part of the unloading sequence. A transmission of vibrations via the electrical connection during an inspection process may thus be avoided. FIGS. 9 and 10 schematically show two possible embodiments of such an arrangement. FIG. 9 schematically shows a pin-shaped member 900 as can be applied in a loading/unloading mechanism as is applied in an object table according to the present disclosure. The pin-shaped member 900 is shown in two different positions relative to a support surface 910 onto which an object 920 can be supported. The pin-shaped member 900 as schematically shown has a top portion 900.1 that is electrically conductive. The arrangement as shown further comprises an electrical conductor 950 comprising a first conductor member 950.1, e.g., a flexible, bendable, rod shaped electrical conductor that is hinged to the top portion 900.1 of the pin-shaped member 900.1. The first conductor member 950.1 is further configured such that it can pivot or rotate as indicated by the arrow 960, when the pin-shaped member 900 is moved upwards. As a result of the pivoting or rotating, an end 950.11 of the first conductor member 950.1 can be made to contact a second conductor member 950.2 of the electrical conductor 950. This is schematically shown in the upper part of the right part of FIG. 9. In the arrangement as shown, the end 950.11 is made to contact the second conductor member 950.2 when the top portion 900.1 of the pin-shaped member 900 touches the object 920. In the example as shown, the second conductor member 950.2 may be connected to an electrical ground or ground potential. When the pin-shaped member 900.1 is moved further upwards, as shown in the lower part of the right part of FIG. 9, the first conductor member 950.1 may bend, while remaining in contact with the second conductor member 950.2. The first conductor member 950.1 can be considered to operate as a cantilever. By suitable selection of the position of the pivot point 960, one can arrange that a comparatively small displacement of the pin-shaped member 900 results in a comparatively large displacement of the end 950.11 of the first conductor member 950.1 thereby ensuring that a sufficiently large gap exists between the end 950.11 and the grounded second conductor member 950.2. Note that, instead of an electrical grounding of the second conductor part or member 950.2, the second conductor member 950.2 may also be connected to an electrode such as the electrode 640 described above, or to the voltage source 642.

FIG. 10 schematically shows an alternative example whereby the electrical connector is configured to provide a connection when the loading/unloading mechanism is in a particular position or range. In the example as shown, the electrical conductor can also be considered to have two members.

In the example as shown, a top portion 1000.1 of the pin-shaped member 1000 is considered to be conductive, e.g., made of a conductive material or comprising a conductive coating. Such conductive top portion can thus be considered a first conductive member of an electrical conductor. In the example as shown, the pin-shaped member is configured to protrude through an aperture 1010 of a second conductive member 1020 of an electrical connection or connector, whereby, when the pin-shaped member 1000 protrudes the aperture 1010, an electrical connection is made between the pin-shaped member 1000 and the conductive member 1020, which is, as schematically shown, connected to an electrode 640, which can e.g. be connected to a voltage source as discussed above. The conductive member 1020 may also be directly connected to the voltage source. In order to ensure the electrical contact, the aperture may be provided with a plurality of fine conductive elements 1030, e.g., brush or hair like conductive wires which may be arranged to at least partly obscure the aperture and which can deflect, as e.g., shown in the right portion of FIG. 10, when the pin-shaped member 1000 protrudes the aperture 1010. As such, during at least part of an unloading sequence of an object 920 that is supported on a support surface 910, the object 920 is electrically connected to a predetermined voltage or potential, i.e., the potential applied to the electrode 640.

In the embodiments as shown, the second conductor members 950.2, 1020 are connected to potential predefined voltage source, either directly or indirectly, e.g., via a high voltage electrode. These embodiments thus also ensure that during at least part of an unloading sequence of the object 920, the object 920 is connected to predefined voltage. By doing so, as indicated above, the voltage of the object can be controlled; a voltage increase of the object 920, e.g., caused by a surface charge of an electrostatic clamp of the object table and a reducing capacitance during the unloading, can be avoided or mitigated.

In some embodiments of the present disclosure whereby the object table comprises an high voltage electrode as described above, a discharging to the high voltage electrode, e.g. during an unloading of the object, can be avoided or mitigated by applying an elevated voltage on the high voltage electrode during said unloading or at least part of said unloading.

In some embodiments, similar to the example as shown in FIG. 10, the electrical connection as applied is configured in such manner that, during at least part of the unloading sequence of the object, a controlled discharging of any build up charge on the object is realized. By appropriate shaping of at least one member of the electrical connector, in particular by e.g., shaping it as a sharp needle, a controlled discharge can occur between the two conductor members. Such an example is schematically shown in FIGS. 11a and b.

Figure 11A:
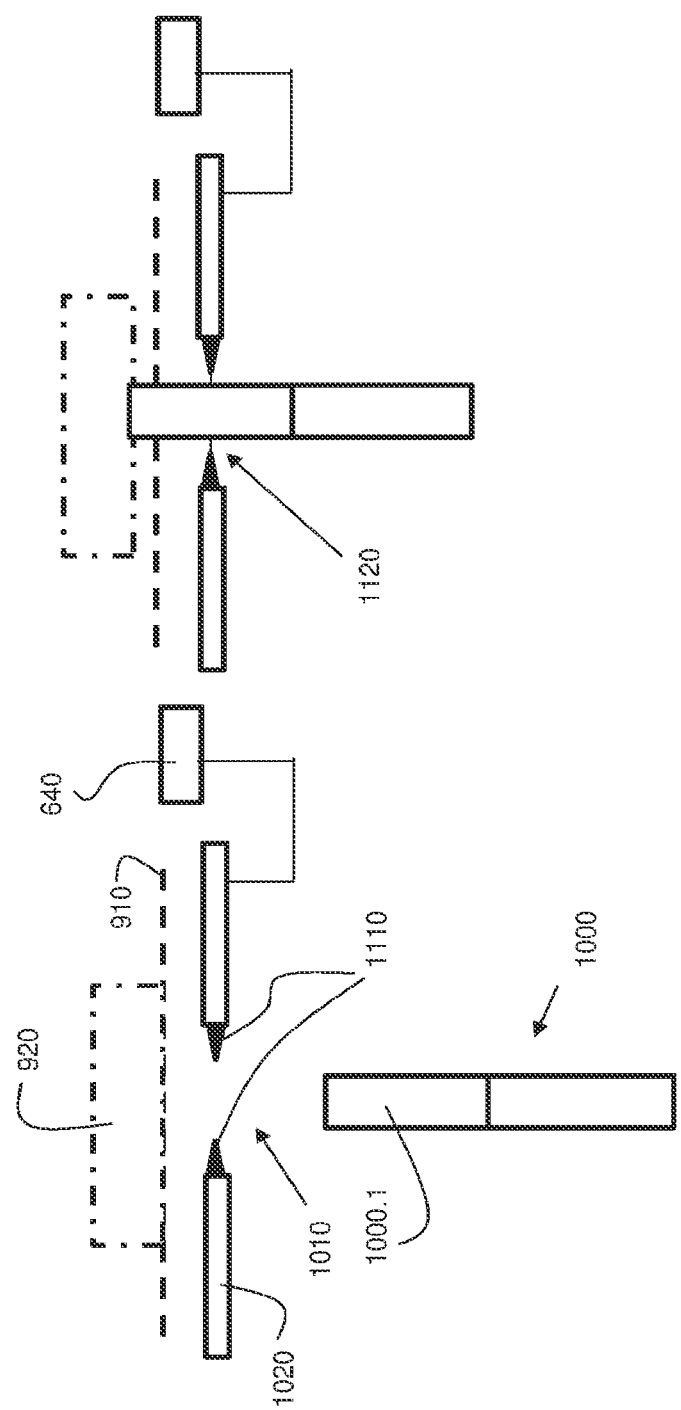

FIG. 11a can be considered similar to FIG. 10, apart from the following:

In FIG. 11a, the second electrical conductor member 1020, which is connected to electrode 640, is provided with one or more needle shaped electrical conductors 1110 arranged along the circumference of the aperture 1010, e.g., pointing inwards. Note that the needle shaped conductors need not obscure the passage of the pin-shaped member 1000 through the aperture 1010. When the pin-shaped member 1000 protrudes the aperture 1010, e.g., to unload the object 920 from the support surface 910, a voltage increase of the object can be prevented since the electrical connection or connector, formed by the conductive top portion 1000.1 and the second electrical conductor member 1020 provided with the needle shaped conductors 1110, will enable a discharging 1120 of the object, during at least part of the unloading sequence.

Due to the controlled discharge 1120, the object's voltage will no longer rise during the unloading stage; the risk of a sparking or discharging towards the object table, e.g., towards the electrode on the object table is therefore mitigated.

As will be understood, alternative arrangements whereby a conductive portion of the pin-shaped member is configured to make an electrical connection in a certain positional range and is disconnected in another range can be devised as well.

In the example as shown, the needle shaped conductors 1110 are provided on the second electrical conductor member 1020. Alternatively, they may also be provided on the conductive top portion 1000.1 of the pin-shaped member 1000 as well. In such an example, the second electrical conductor member 1020 may be suitably shaped, in order to form the electrical connection in a required positional range. Such an example is schematically shown in FIG. 11b. In the example as shown, the conductive top portion 1000.1 of the pin-shaped member 1000 is provided with needle shaped conductors 1110. When the pin-shaped member is elevated, as can be seen on the right of FIG. 11b, the needle shaped conductors 1110 may interact with the second electrical conductor member 1020 so as to allow a discharge. As will be understood, the embodiments of FIGS. 11a and 11b may be combined as well thus having needle shaped conductors 1110 on both the second electrical conductor member 1020 and the conductive top portion 1000.1 of the pin-shaped member 1000.

Figure 12:
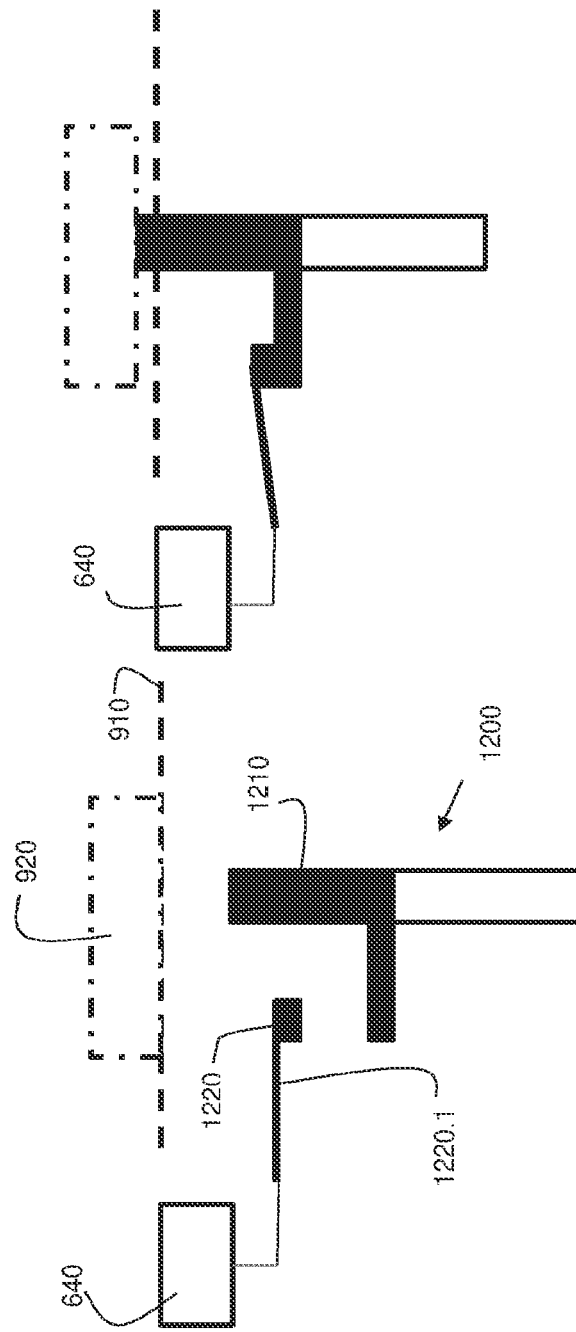
FIG. 12 schematically shows a fifth arrangement of an electrical conductor, according to some embodiments of the present disclosure.

FIG. 12 e.g., shows an arrangement whereby a first conductor member 1210 of a pin-shaped member 1200 of a loading/unloading mechanism is configured to contact a second conductor member 1220 having a flexible conductive member 1220.1. When the pin-shaped member 1200 is lifted, e.g., to unload an object 920 from a support surface 910, as shown in the right portion of FIG. 12, the first conductor member 1210 can contact the second conductor member 1220, thereby establishing a contact between the object 920 and a predefined voltage, e.g., via a connection to an electrode 640, during at least part of the unloading sequence of the object 920.

Figure 13:
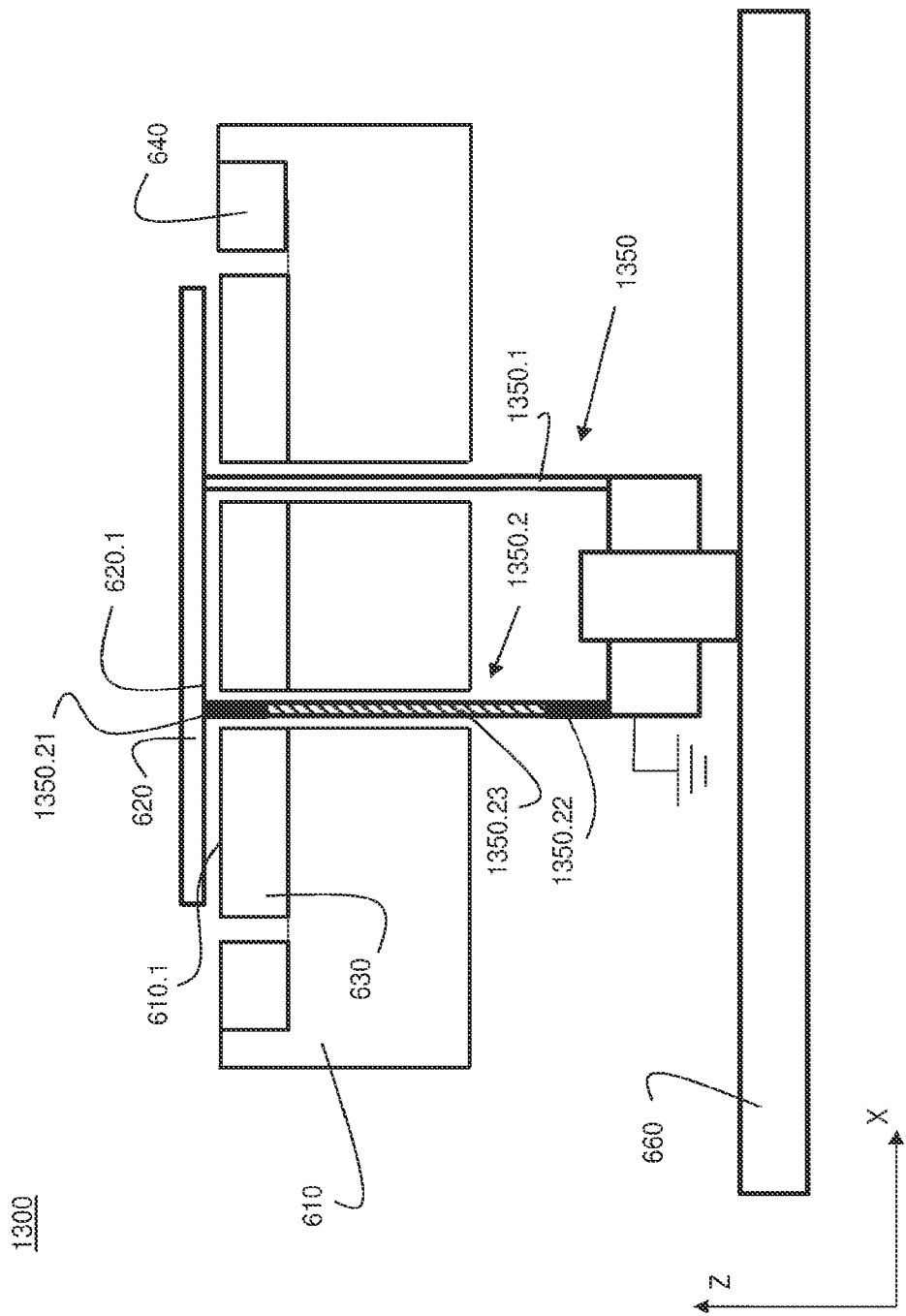
FIG. 13 schematically shows a cross-sectional view of a third object table, according to some embodiments of the present disclosure.

Yet an alternative manner to switch the pin-shaped member between a connected state, whereby the top surface of pin-shaped member is e.g., grounded or connected to an HV source and a disconnected state, whereby the top surface is e.g., allowed to adjust its potential, i.e., have a floating potential, is schematically shown in FIG. 13.

In FIG. 13, an object table 1300 according to some embodiments of the present disclosure is schematically shown, the object table 800 including a support member 610 and an electrostatic clamp 630 that provides a support surface 610.1 for supporting an object 520, e.g., a semiconductor substrate or reticle. In the example as shown, the electrostatic clamp 630 is arranged in a recess of the support member 610. The object table further comprises an electrode 640 and a loading/unloading mechanism 1350 comprising pin-shaped members 1350.1 and 1350.2. Further details such as the electrode arrangement of the electrostatic clamp 630 or the voltage supply for the electrode 640 are omitted for clarity.

In FIG. 13, pin-shaped member 1350.1 may e.g., be a conventional isolated pin-shaped member as e.g., applied in a known loading/unloading arrangement. The pin-shaped member 1350.2 however comprises a conductive top-portion 1350.21, a conductive bottom portion 1350.22, e.g., configured to be grounded, and a middle portion 1350.23 which can be filled with a gas that can be ionized. The middle portion 1350.23 may e.g., be a tube provided with a pair of electrodes for ionizing the gas. In such an arrangement, the conductivity of the pin-shaped member 1350.2 can be controlled; by controlling the voltage supplied to the pair of electrodes, an ionized gas can be generated in the middle portion 1350.23, thereby rendering the middle portion conductive. By doing so, the top portion 1350.21 becomes electrically grounded to the bottom portion 1350.22. In such an example, the pin-shaped member 1350.1 may thus be made conductive when an object is to be loaded or unloaded and may be made to isolate when the object is being inspected.

As an alternative to ionizing the gas that is inside the middle portion, one or more of the pin-shaped members may be configured to receive a gas that is already ionized. In such an example, the conductivity of the one or more pin-shaped members may be controlled by supplying and evacuating already ionized gas to and from the pin-shaped member, rather than ionizing a gas that is inside the pin-shaped member.

Suitable gases that may be comparatively easily ionized may e.g., include Argon or Neon.

In the embodiments as discussed so far, the object is configured to be connected to a predetermined voltage or voltage source during at least part of the unloading stage via the loading/unloading mechanism, in particular via a pin-shaped member of said mechanism. Alternative arrangements of the electrical connector may however be devised as well.

As an example, the electrical connection between the object and the predetermined voltage may be realized by contacting the edge or even the top surface of the object, e.g., using a movable electrode or electrical connector. A gripper of a handler or handling robot may be suited for this. As such, in some embodiments, the object table according to the present disclosure can be configured to e.g. co-operate with a robot handler, such a robot handler e.g. comprising and end effector gripper, e.g. a conductive or semi-conductive end effector gripper, which is configured to contact the object that is to be unloaded, e.g. an edge or a top surface of the object, during at least part of the unloading sequence of the object. When the end effector gripper is grounded, such an arrangement also enables to ensure the, at least during part of the unloading sequence, the object is connected to a predefined voltage or voltage source. Alternative to the application of the end effector gripper to contact the object during at least part of the unloading sequence, the end effector gripper of the robot handler may comprise an electrode or contact, e.g., a thin flexible conducting wire, for contacting the object during at least part of the unloading. In some embodiments, a high voltage electrode of the object table may be electrically isolated from the object by a semi-conductive end effector gripper inserted in between the object and the high voltage electrode during such an unloading or during at least part of such unloading.

Figure 14:
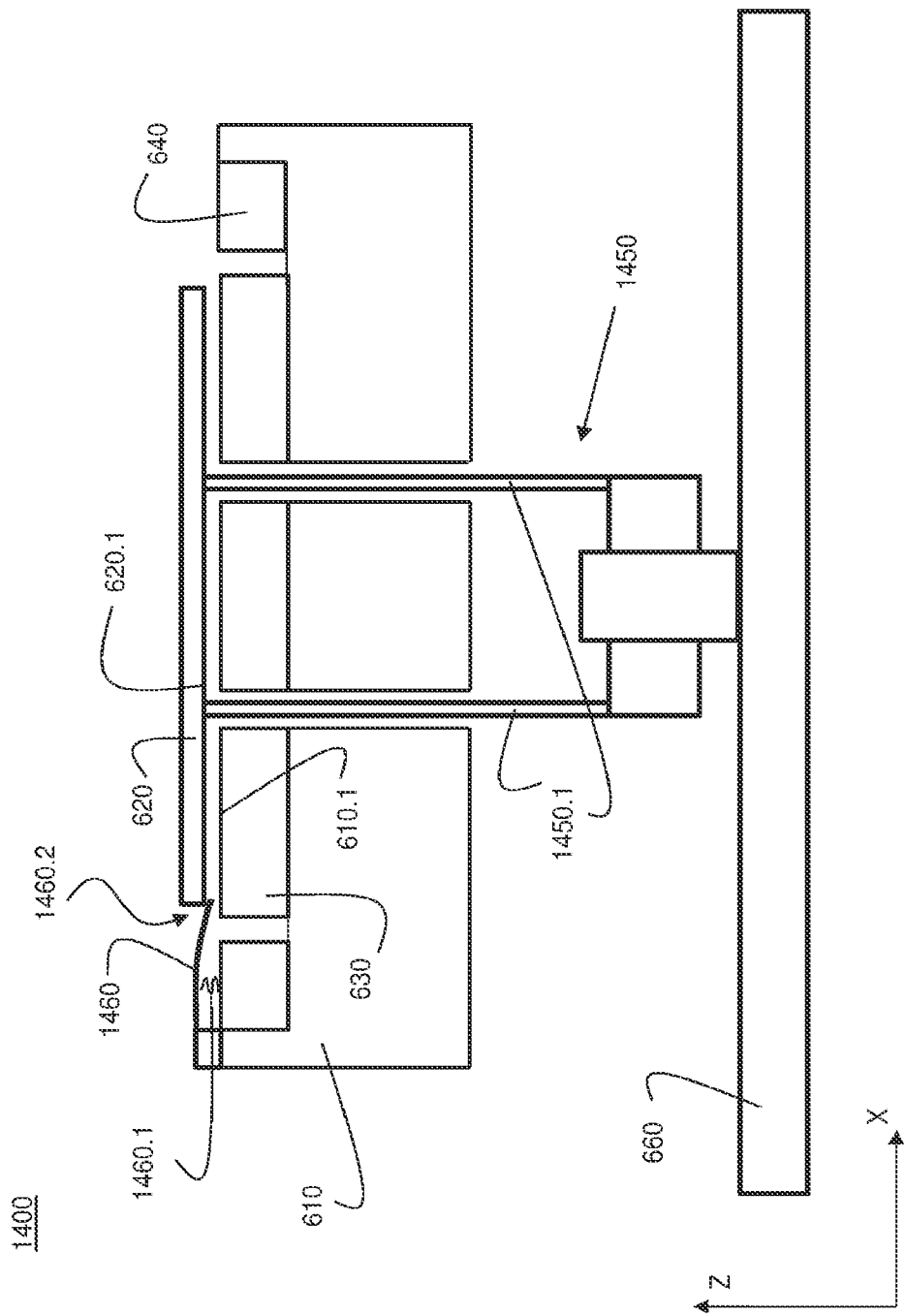
FIG. 14 schematically shows a cross-sectional view of a fourth object table, according to some embodiments of the present disclosure.

Alternatively, a flexible conductive contact can be provided, e.g., along the edge of the object, such that, during at least part of the unloading sequence of the object. Such an example is schematically shown in FIG. 14. The object table 1400 as schematically shown in FIG. 14 comprises, a support member 610 and an electrostatic clamp 630 that provides a support surface 610.1 for supporting an object 520, e.g., a semiconductor substrate. a support member 610 having a support surface 610.1 for supporting an object 620, e.g., a semiconductor substrate or reticle. In the example as shown, the electrostatic clamp 630 is arranged in a recess of the support member 610. The object table further comprises an electrode 640 and a loading/unloading mechanism 1450 comprising pin-shaped members 1450.1. In some embodiments, the loading/unloading mechanism 1450 may e.g., comprise three pin-shaped members. Further details such as the electrode arrangement of the electrostatic clamp 630 or the voltage supply for the electrode 640 are omitted for clarity. In the example as shown, the object table 1400 further comprises a flexible electrical connector or contact 1460 for connecting to an edge or bottom surface of the object 620, during at least part of an unloading sequence of the object 620. As shown, the flexible electrical connector 1460 is connected the electrode 640, e.g., via an electrical wire 1460.1. The flexible electrical connector 1460 can e.g., be configured to contact the object in a sliding manner. Alternatively, a roller contact can be provided at the end portion 1460.2 of the flexible electrical connector 1460, thereby mitigating the risk of generating particles. The electrical connector 1460 can e.g., be a leaf-spring or leaf-spring like member that can bend downward when the object is loaded and can bend upward during at least part of an unloading, so as to remain in contact with the object 620.

As an alternative to the arrangement as shown in FIG. 14, the flexible electrical connector 1460 may e.g., be a spring-shaped connector that is mounted underneath the bottom surface 620.1 of the object, i.e., between the support surface 610.1 and the bottom surface 620.1 of the object. Said spring may than be connected to the high voltage electrode 640, in a similar manner as the connector 1460 is connected to the electrode.

As an alternative to the electrical connector 1460 as shown in FIG. 14, the electrical connector as applied may comprise an electrically conductive spring or spring like conductor that is arranged between the support surface 610.1 and the bottom surface 620.1 of the object that is supported. Such a spring or spring like conductor can be configured to be compressed when the object 620 is loaded and configured to expand during at least part of an unloading sequence of the object, so as to remain in contact with the object 620. It may further be connected to the electrode 640 via an electrical wire.

Yet an alternative manner to provide in an electrical connection between the object and a predetermined voltage, e.g., an electric ground potential, is by purging the volume between the object and the electrostatic clamp with an ionized gas. Such a gas can be considered to form an electrical connection between the object and any material in the vicinity, e.g., an electrode surrounding the object such as electrode 640 shown above. As such, an ionized gas may, within the meaning of the present disclosure, be considered to an electrical conductor as well, i.e., a gaseous electrical conductor. It can further be pointed out that the application of such an ionized gas flow may also, at least partly, result in a cancelling or compensation of the surface charge that was generated on the surface of the electrostatic clamp 630.

As such, in some embodiments of the present disclosure, a purging of the volume underneath the object and/or above the electrostatic clamp using an ionized gas is performed, e.g., periodically, in order to mitigate or avoid the build-up of a surface charge on a surface of the electrostatic clamp 630.

In such an example, rather that attempting to mitigate any adverse effects of the build-up surface charge, e.g., by grounding the object during the unloading, the surface charge itself is mitigated or removed.

According to a second aspect of the present disclosure, there is provided an object table configured to hold an object such as a substrate, the object table comprising:
  an electrostatic clamp configured to hold the object;
  a measurement unit configured to determine an electric characteristic of the electrostatic clamp, the electric characteristic being representative of a charge state of the electrostatic clamp;
  a control unit configured to control, during an unloading of the object, a power supply of the electrostatic clamp, based on the determined electric characteristic.

According to the second aspect of the present disclosure, there is provided an object table that enables to control, before and/or during an unloading of the object a power supply of the electrostatic clamp of the object table, based on a determined electric characteristic of the electrostatic clamp, whereby the electric characteristic represents a charge state of the electrostatic clamp, especially the residual charge on the electrostatic clamp when no voltage is applied to the electrostatic clamp.

As explained above, with reference to FIG. 5, the use of an electrostatic clamp for holding an object such as a semiconductor substrate on an object table, may result in the occurrence of a surface charge on a surface of the electrostatic clamp. This surface charge causes an attractive force, also referred to as a sticking force, between the object and the object table, in particular between the object and the electrostatic clamp of the object table. As will be understood by the skilled person, this sticking force has to be overcome, in order to unload the object from the object table. Phrased differently, an unloading of the object from the object table will require a force to be exerted on the object that is at least equal to and directed in opposite direction to the sticking force. So, the larger the sticking force, the larger the unloading force, i.e., the force needed to unload the object, will need to be. As the unloading force is typically performed using a loading/unloading mechanism comprising one or more pin-shaped members, the unloading force that can be generated may be comparatively small. Also, the application of a comparatively large unloading force via the one or more pin-shaped members onto the object may cause damage to the object.

In a typical object table, as e.g., described with reference to FIG. 5, an electrostatic clamp as applied in the object table would not be powered during the unloading of the object. In accordance with the second aspect of the present disclosure however, it is proposed to control the power supply of the electrostatic clamp, i.e., the power as supplied to the electrostatic clamp, during the unloading, based on a determined electric characteristic which represent a charge state of the electrostatic clamp. By doing so, as will be explained in more detail below, account can be taken of the charge stage of the electrostatic clamp and appropriate measures can be taken to compensate, counteract or mitigate the effect of the charge state on clamping force, i.e., the residual or permanent clamping force.

As an alternative, or in addition, to controlling the power supply of the electrostatic clamp during the unloading, the power supply of the electrostatic clamp may also be controlled during the clamping of the object, based on the determined electric characteristic. In particular, in some embodiments of the present disclosure, the charge state of the electrostatic clamp or the effect of the charge state on the clamping force may be taken into account during the clamping of the object: by appropriately powering the electrostatic clamp, the effect of the measured or determined charge state of the electrostatic clamp can be taken into account thus ensuring that a required clamping force is obtained. As an example, when the charge on the clamp surface near a negative electrode of the clamp is negative, a smaller clamping voltage is required to result in the same net clamping force. Similarly, a negative charge near a positive clamping electrode would require a larger positive voltage on the positive clamping electrode to achieve the same clamping force, since the surface charge counteracts the clamping force there.

In accordance with the second aspect of the present disclosure, the power supply of the electrostatic clamp, or the power supplied to the electrostatic clamp can be controlled, based on the determined electric characteristic, in such manner that the sticking force at least partly can be compensated, counteracted or mitigated. Further, by doing so, a discharging between the object and the object table, e.g., a high voltage electrode on the object table, may be avoided as well.

Figure 15:
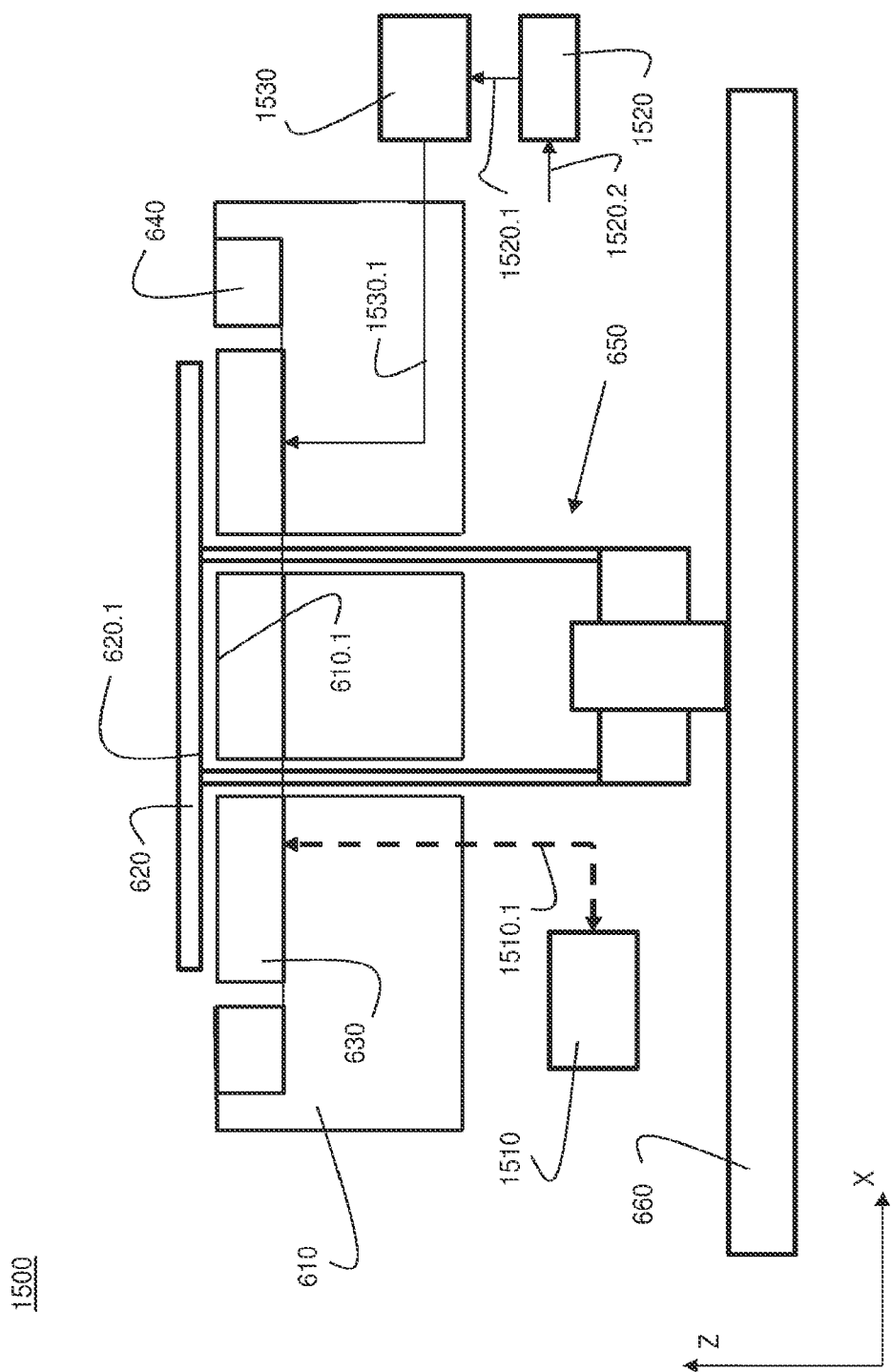
FIG. 15 schematically shows a cross-sectional view of a fifth object table, according to some embodiments of the present disclosure.

FIG. 15 schematically shows an example of an object table 1500 according to the second aspect of the present disclosure. In FIG. 15, an object table 1500 according to some embodiments of the present disclosure is schematically shown, the object table 1500 including, similar to the object table 600 of FIG. 6, a support member 610 having a support surface 610.1 for supporting an object 620, e.g., a semiconductor substrate. In the example as shown, an electrostatic clamp 630 is arranged underneath the support surface 610.1, e.g., embedded in the support member 610. In the example as shown, the object table further comprises, as optional features, an electrode 640 and a loading/unloading mechanism 650. Further details such as the electrode arrangement of the electrostatic clamp 630 or the voltage supply for the electrode 640 are omitted for clarity. In accordance with the second aspect of the present disclosure, the object table 1500 further comprises a measurement unit 1510 configured to determine an electric characteristic of the electrostatic clamp, indicated by the dotted line 1510.1, the electric characteristic being representative of a charge state of the electrostatic clamp 630. In accordance with the second aspect of the present disclosure, the object table 1500 further comprises a control unit 1520 configured to control, during an unloading of the object 620, a power supply 1530 of the electrostatic clamp 630, based on the determined electric characteristic. Line 1530.1 indicates the powering of the electrostatic clamp 630 by the power supply 1530.

The power supply 1530 can e.g., power the electrostatic clamp 630 by providing an appropriate voltage to the one or more electrodes of the electrostatic clamp 630. The power supply 1530 can e.g., be controlled by a control unit 1520 of the object table 1500. In accordance with the second aspect of the present disclosure, the control unit 1520 is configured to control, during an unloading of the object 620, the power supply 1530 of the electrostatic clamp 630, indicated by the arrow 1520.1, based on the determined electric characteristic, which can e.g., be provided by means of an input signal 1520.2 to the control unit 1520.

In accordance with the second aspect of the present disclosure, the measurement unit 1510 of the object table 1500 is configured to determine an electric characteristic which is representative of a charge state of the electrostatic clamp. The charge state of the electrostatic clamp can e.g., be indicative for a surface charge that has been build up on a surface of the electrostatic clamp.

In accordance with the present disclosure, various methods are devised to determine the electric characteristic and to control the power supply of the electrostatic clamp based on the determined electric characteristic.

A first manner to determine the electric characteristic of the electrostatic clamp is to perform a measurement during an initial portion of an unloading sequence of the object, e.g., a portion of the unloading sequence which starts when the object is still on the support surface.

In some embodiments, the measurement unit 1510 is configured to determine, during said initial portion, the electric characteristic of the electrostatic clamp representing a charge state of the clamp by performing a measurement. Said measurement can e.g., be a measurement of a characteristic of the electrostatic clamp or a measurement of a characteristic of the object that is being unloaded.

In the former case, i.e., where a measurement of a characteristic of the electrostatic clamp is performed, the measurement unit 1510 may e.g., be configured to measure a current from or towards the one or more electrodes of the clamp as the electric characteristic. In such case, the power supply 1530 may e.g., be configured to maintain the electrodes, during the initial portion of the unloading sequence, at a predetermined potential, e.g., zero volt, i.e., whereby the power supply provides a voltage of 0 V to the electrodes.

However, in order to maintain the voltage at 0 V during the unloading, a current will flow to or from the electrodes, due to the presence of the charges on the electrostatic clamp. This can be understood as follows: when the object is unloaded, i.e., the distance between the object and the clamp is increased, a voltage will be induced in the object (as explained above) due to the changed capacitance formed by the object and the clamp and the surface charge on the electrostatic clamp. This change in capacitance also affects the electrodes of the electrostatic clamp in that, due to the presence of the surface charge, the voltage on the electrodes would also change, in case it was not imposed by the power supply. As such, in order to remain at 0 V, there will be a current from or towards the electrodes, during the unloading sequence, when the power supply 1530 of the electrostatic clamp 630 holds the clamp at 0 V. As this current occurs due to the presence of the surface charge on the clamp, it can be considered to be representative of the charge state of the electrostatic clamp or the surface charge on the clamp. After measurement of the current as the electric characteristic representing the charge state, the control unit 1520 may then control the power supply 1530 of the electrostatic clamp 630 based on the electric characteristic. In particular, the control unit 1520 can control the power supply in such manner that a voltage is provided to the one or more electrodes which counteracts or mitigates the effect of the charge state of the electrostatic clamp.

The required voltage for mitigating the effect of the charge state of the electrostatic clamp can e.g., be determined based on empirical data, e.g., experimental data, e.g., combined with simulations.

In another example, the measurement unit can be configured to measure, as an electric characteristic of the electrostatic clamp representing the charge state of the clamp, a voltage of the one or more electrodes of the clamp, e.g., during the unloading sequence or a part thereof. In such an example, the power supply 1530 may e.g., be configured to disconnect the one or more electrodes of the electrostatic clamp from the power supply during the unloading sequence or a part thereof. By doing so, the potential or voltage at the one or more electrodes becomes floating or undefined. As a result, the potential or voltage of the electrodes can vary during the unloading sequence or a part thereof. When a surface charge is present on the electrostatic clamp, the voltage at the one or more electrodes will indeed vary when the object is unloaded, due to the changed capacitance. As such, in these embodiments, the measurement unit 1510 may be configured to measure a voltage at the one or more electrodes of the electrostatic clamp as an electric characteristic representing a charge state of the electrostatic clamp, during the unloading sequence of the object. Based on this electric characteristic, the control unit 1520 controlling the power supply 1530 may then, control the power supply of the electrostatic clamp 630. In particular, the control unit 1520 may control the power supply 1530 in such manner that a voltage is provided to the one or more electrodes which counteracts or mitigates the effect of the charge state of the electrostatic clamp.

In yet another example, as mentioned above, the measurement unit 1510 is configured to determine the electric characteristic representing a charge state of the electrostatic clamp by performing a measurement on the object, rather than on the electrostatic clamp. As explained above with respect to the first aspect of the present disclosure, when an object is unloaded from an electrostatic clamp having a surface charge, a voltage will be induced (assuming that the object is not grounded) in said voltage, due to the surface charge and due to the change in capacitance when the object is moved away from the clamp. As such, in some embodiments, the measurement unit as applied in an object table according to the present disclosure can be configured to determine, during an initial portion of an unloading sequence, measure a voltage induced in the object. As the induced voltage is directly related to the surface charge or charge state of the electrostatic clamp 630, it can be used to determine an electric characteristic of the electrostatic clamp, the electrical characteristic representing a charge state of the clamp. Once the electric characteristic is determined, it can be applied in a similar manner as discussed above, to control the power supply 1530 which powers the electrostatic clamp 630. In order to measure the voltage induced in the object during the initial portion of the unloading sequence, electrical connectors or conductors as described above may e.g., be applied. In particular, use can e.g., be made of a conductive pin-shaped member of a loading/unloading mechanism to serve as a probe to measure an induced voltage in the object. As such, based on the measured voltage induced in the object during an initial portion of the unloading sequence, the control unit can control the power supply powering the electrostatic clamp in such manner that a voltage is provided to the one or more electrodes which counteracts or mitigates the effect of the charge state of the electrostatic clamp.

In yet another example, the measurement unit 1510 is configured to determine the electric characteristic representing a charge state of the electrostatic clamp by performing a current measurement on the object. In case the object is connected, during the unload sequence, to a predetermined potential, e.g., an electric ground potential, a current will flow to or from the object when the object is unloaded, in a similar manner as a current will flow to or from the electrodes of the electrostatic clamp when these electrodes are connected to a zero-voltage source during the unloading. Since this current is directly related to the surface charge or charge state of the electrostatic clamp 630, it can be used to determine an electric characteristic of the electrostatic clamp, the electrical characteristic representing a charge state of the clamp. Once the electric characteristic is determined, it can be applied in a similar manner as discussed above, to control the power supply 1530 which powers the electrostatic clamp 630. In order to measure the current that flows to or from the object during the initial portion of the unloading sequence, electrical connectors or conductors as described above may e.g., be applied. As described above, such electrical connectors or conductors are configured to keep contact with the object, at least during part of the unloading sequence thus enabling the monitoring/measuring of the voltage of the object. As such, based on the measured voltage induced in the object during an initial portion of the unloading sequence, the control unit can control the power supply powering the electrostatic clamp in such manner that a voltage is provided to the one or more electrodes which counteracts or mitigates the effect of the charge state of the electrostatic clamp.

In the embodiments of the object table according to the second aspect of the present disclosure as described so far, the object table, in particular the measurement unit and the control unit of the object table, is configured to, when unloading a particular object:

Determine an electric characteristic of the electrostatic clamp by performing a measurement during an initial portion of the unloading sequence, and Controlling the power supply powering the electrostatic clamp before and/or during at least part of the unloading sequence based on the electric characteristic.

In the embodiments as described, the electric characteristic was of the electrostatic clamp was determined based on a current or voltage measurement of the electrostatic clamp or the object, during the unloading sequence or a portion thereof.

Such a determination can e.g., be performed during a portion or part of the unloading sequence, e.g., an initial portion of an unloading sequence of an object. When the electrical characteristic of the clamp is determined during an initial portion of the unloading, this information may immediately be applied to control the power supply powering the clamp during a next of following portion of the unloading sequence. In such an example, the control of the power supply during unloading of an object is thus based on measurements performed during an initial part of the unloading sequence of said object. Such arrangement may require a comparatively fast processing of the measurements and/or comparatively fast control of the power supply. The following describes an alternative approach.

It is important to point out that the electrical characteristic of the electrostatic clamp which represent a charge state of the electrostatic clamp may also be determined in other ways. In this respect, it is worth mentioning that the surface charge of the electrostatic clamp does not change rapidly, rather, it changes gradually during the processing of multiple objects. When considering this, it can be realized that one can also determine an electric characteristic of the electrostatic clamp at other instants than during an initial portion of an unloading sequence of an object. In particular, the electric characteristic representing a charge state of the electrostatic clamp may also be determined earlier than during an initial portion of the unloading sequence of the object.

In particular, the electric characteristic representing a charge state of the electrostatic clamp may also be determined during a loading of the object. During a loading of the object, the object may e.g., be lowered onto the electrostatic clamp, e.g., by a loading/unloading mechanism as described above, during which a voltage may be induced in the object, or a current may flow from or towards the object, depending on whether the object is isolated or grounded. Such induced voltage or occurring current may also be used to determine the electric characteristic of the electrostatic clamp, since it is directly related to or caused by the charge state of the electrostatic clamp. As such, in some embodiments, of the present disclosure, the object table may be configured to:

Determine an electric characteristic of the electrostatic clamp by performing a measurement during a loading sequence of an object on the electrostatic clamp, and Controlling the power supply powering the electrostatic clamp before and/or during at least part of the unloading sequence of the object, based on the electric characteristic.

Alternatively, the electrical characteristic representing a charge state of the electrostatic clamp may be determined during a loading or unloading of a previous object. In such an example, the charge state as determined during the loading or unloading of a first object is used to control the powering of the electrostatic clamp during at least part of the unloading sequence of a second, subsequent, object. Such an example provides the advantage that there is more time available to determine the charge state and to determine the required power control of the electrostatic clamp.

Since it has been observed that the charge state of the electrostatic clamp only gradually changes over time, one does not even have to determine the electric characteristic of the electrostatic clamp for every object that is to be unloaded. Phrased differently, it may be sufficient to determine the electric characteristic representing the charge state of the electrostatic clamp once per n objects that are processed, n e.g., being equal to 5 or 10. In some embodiments, the number n may e.g., be determined based on an identified charge state of the electrostatic clamp or a history of the identified charged stage. As an example, when the identified charge state is large or when the change of the charge states in a consecutive measurement is large, a smaller number n can be selected. N may however be as small as 1.

In such an example, the electric characteristic of the electrostatic clamp may thus be determined during the loading and/or unloading of a first object, whereas the electric characteristic as determined is used to control the power supply during the unloading of a second object, different from the first object. As such, in some embodiments, the object table according to the second aspect of the present disclosure can be configured to:

Determine an electric characteristic of the electrostatic clamp by performing a measurement during a loading and/or unloading sequence of a first object on or resp. off the electrostatic clamp, and Controlling the power supply powering the electrostatic clamp before and/or during at least part of the unloading sequence of a second object that is different from the first object, based on the electric characteristic.

The charge state distribution of the electrostatic clamp across all, or part, of the clamp surface may be inhomogeneous. That is to say, the charge state may be unevenly distributed over a region of the clamp surface that corresponds to clamping electrodes of the electrostatic clamp. For example, across the region there may be a combination of negative and positive charges, or multiple equally-signed but different magnitude charges.

A clamping voltage may be applied to these clamping electrodes to generate a repelling force or to neutralize the charge on the clamp surface. For each electrode, the applied voltage may be determined dependent on the net charge of the clamp surface. However, such a single voltage for these clamping electrodes may not be appropriate or not sufficient in the situation of the charge distribution. Residual force distribution, being uneven across all or part of the clamp surface because the single determined voltage may be too low, or too high, for some parts of the clamp surface when, across the clamp surface, there may be a combination of negative and positive surface charges or multiple equally-signed but different magnitude surface charges around these clamping electrodes.

In yet another example, the above-identified problem may be avoided by arranging for the charge distribution to be evenly distributed over the all or part of the lamp surface. For example, a semi-conductive coating may be applied to regions of the clamp surface. The semi-conductive coating should be arranged so that it does not electrically connect regions of the clamp surface corresponding to different clamping electrodes such that some of these clamping electrodes electrically are not electrically connected and form electric short circuit.

In yet another example, the above-identified problem is solved by providing two or more electrodes and separately controlling the voltages applied to each electrode. For example, instead of having a single positive electrode and a single negative electrode, the present example includes there being two or more positive electrodes and/or two or more negative electrodes. Separate voltages may be applied to each electrode as appropriate for overcoming an uneven charge distribution of the region of the clamp surface around the electrode. Each applied voltage to an individual electrode may be determined according to at least some of the techniques for determining a voltage to be applied at an electrode according to the second aspect of the present disclosure. Each electrode may also be a clamping electrode for applying a holding force to, or releasing, an object. Alternatively, one or more of the electrodes may be used to only apply a force for counteracting the residual force caused by the local charge distribution at said one or more electrodes with said one or more electrodes not being used to apply a holding force to an object.

Specific orientations have been given when describing the relative arrangement of components. It will be appreciated that these orientations are given purely as examples and are not intended to be limiting. For example, the xy-stage of the positioning device 180 has been described as being operable to position an object in a substantially horizontal plane. The xy-stage of the positioning device 180 may alternatively be operable to position an object in a vertical plane or in an oblique plane. Orientations of components may vary from the orientations described herein whilst maintaining their intended functional effect of said components.

Figure 16:
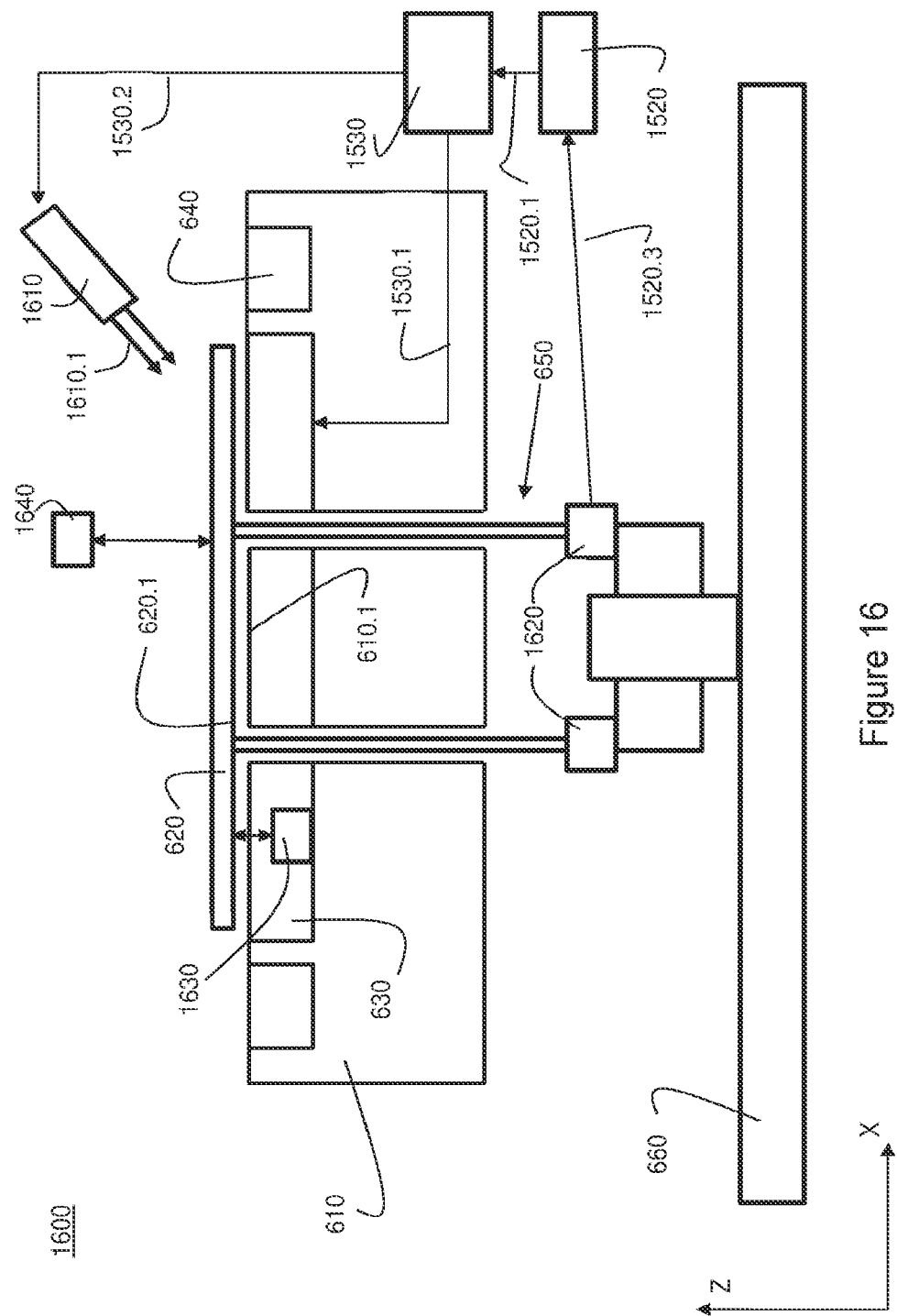
FIG. 16 schematically shows a further example of an object table, according to some embodiments of the present disclosure.

FIG. 16 schematically depicts an example of an object table 1600 according to the third aspect of the present disclosure. The object table 1600 may substantially have the same structure as the object tables described above, except for the following. The object table 1600 is for holding an object 620. The object table 1600 comprises an electrostatic clamp 630, an ionizer device 1610, a control unit 1520 and a measurement unit, e.g. including a force sensor 1620 and/or a gap sensor 1630 and/or a height sensor 1640. The electrostatic clamp 630 is for clamping the object 620 on the object table 610. The measurement unit is configured to provide a force signal 1520.3 representative of a residual force applied by the electrostatic clamp 630 on the object 620 while unloading the object 620 from the electrostatic clamp 630. The ionizer device 1610 is configured to provide an ionized flow of gas 1610.1 to the electrostatic clamp 630, working as a neutralizer to neutralize the residual charge on the electrostatic clamp 630. The control unit 1520 is arranged to control the ionizer device 1610 based on the force signal 1520.3.

In an alternative example, the object table 1600 may comprise the electrostatic clamp 630, the ionizer device 1610 and the control unit 1520. The electrostatic clamp is for clamping the object 620 on the object table 610. The ionizer device 1610 is for providing an ionized flow of gas. The control unit 1520 is arranged to control the ionizer device 1610 to provide the ionized flow of gas to the electrostatic clamp.

The control unit 1520 may be arranged to receive an information signal representative of a residual force or a residual charge. The residual force is applied by the electrostatic clamp 630 on the object 620 during unloading of the object 620 from the electrostatic clamp 630. The residual charge is an electrostatic charge present on the electrostatic clamp 630 when no charge voltage is applied to the electrostatic clamp 630. The control unit 1520 may be arranged to control the ionizer device 1610 based on the information signal. Ideally, there is no residual force and no residual charge during unloading of the object 620 from the electrostatic clamp 630. However, due to charge build-up on the electrostatic clamp 630, a residual force and/or a residual charge remain, even when no charge voltage is applied to the electrostatic clamp 630.

The information signal may comprise measurement information. As indicated below, a measurement unit may provide measurement information in the form of a measurement signal. More examples of measurement information are given below and may include information about the amount of force needed to lift the object 620 from the object table 610, or information about a gap or a capacitance between the object 620 and the object table 610. Other measurement information may represent a shape of the object 620 and/or the amount of power needed to unclamp and unload the object 620 from the object table 610. The information signal may be an internal signal of the electrostatic clamp 630 and/or an loading/unloading mechanism representing the residual force and/or the residual charge such as a signal representing a detection that the loading/unloading mechanism is not able to lift the object 620 from the electrostatic clamp 630.

The information signal may comprise estimated information. Whereas measurement information is based on measurements representative of the residual force or residual charge, the estimated information is based on other parameters, such as empiric data and simulations. Estimated information may include that after a certain amount of time or after unloading a certain amount of objects 620, the control unit 1520 needs to control the ionizer device 1610 and/or the discharge voltage to counter the build-up residual charge or residual force. Simulations may predict after how much time or how many times unloading an object 620 the residual charge and the residual force are at the edge of an acceptable level. The estimated information may include information obtained from outside the object table 1600, for example via an external measurement device measuring the residual charge of the object 620 outside the object table 1600, for example in a further processing step of the object 620. The estimated information may include the estimated residual charge according to embodiments of the present disclosure, particularly the embodiments of the second aspect and the fifth and sixth aspect of the present disclosure. The control unit 1520 may make use of measurement information or estimated information or a combination of measurement information and estimated information.

The object table 1600 may further comprise a measurement unit. The measurement unit is configured to provide a measurement signal representative of the residual force or the residual charge. The information signal comprises the measurement signal. The control unit 1520 is arranged to control the ionizer device 1610 based on the measurement signal.

In some embodiments, there is provided the object table 1600, comprising the electrostatic clamp 630 and the control unit 1520. The electrostatic clamp 630 is for clamping the object 620 on the object table 610. The control unit 1520 is arranged to provide to the electrostatic clamp 630 a charge voltage to clamp the object 620 on the electrostatic clamp 630 and a discharge voltage to unclamp the object 620 from the electrostatic clamp 630. The discharge voltage may unclamp the object 620 by reducing the clamping force to, for example, substantially zero, or by providing a repulsing force to push the object 620 away from the electrostatic clamp 630. The control unit 1520 is arranged to receive the information signal representative of a residual force or a residual charge. The control unit 1520 is arranged to provide the discharge voltage by a power source, working as a neutralizer to neutralize the residual charge on the electrostatic clamp 630, based on the information signal.

The discharge voltage may have a polarity opposite to the charge voltage. In some embodiments, the object table 1600 may also comprise an ionizer device such as the ionizer device 1610 for providing the ionized flow of gas 1610.1 to the electrostatic clamp 630. The control unit 1520 is arranged to control the ionizer device 1610 based on the information signal.

After using the electrostatic clamp 630 to clamp the object 620, a residual charge may remain on the electrostatic clamp 630 even though the charge voltage is no longer applied. Ideally, there would be no residual charge and thus no force applied by the electrostatic clamp 630 on the object 620 when the charge voltage is no longer applied. A residual force is created by the residual charge and by gravity. Gravity adds to the residual force by the weight of the object 620 that is supported by the electrostatic clamp 630. The contribution to the residual force by the residual charge may be much bigger than the contribution of gravity, for example 10 times or 100 times or more. The residual force keeps the object 620 clamped on the electrostatic clamp 630. To unload the object 620 from the electrostatic clamp 630, an unloading force needs to be applied to the object 620 that exceeds the residual force. However, the higher the unloading force, the more particles are generated during unloading the object 620. The particles may pollute the object 620 or the environment in which the object 620 is processed. After repeatedly loading and unloading objects 620 on and from the electrostatic clamp 630, the residual force may become so large that at a certain moment it is no longer possible to unload the object 620 from the electrostatic clamp 630 without extreme measures. An extreme measure may be unloading the object 620 from the electrostatic clamp 630 manually.

The object table 1600 as schematically shown in FIG. 16 enables to remove, alleviate or mitigate the necessity of such measures, by using an ionizer device 1610, by applying a discharge voltage, or a combination thereof. When the measurement unit 1620 provides the measurement signal, the control unit 1520 is arranged to evaluate whether the measurement signal 1520.3 is within an acceptable range. When the measurement signal is within the acceptable range, the object 620 can be properly removed from the electrostatic clamp 630. However, when the measurement signal is not within the acceptable range, the control unit 1520 can take action.

The control unit 1520 may be arranged to send a control signal 1520.1 to the power supply 1530. Power supply 1530 is arranged to provide power 1530.2 to the ionizer device 1610. By providing power, the control unit 1520 can switch the ionizer device 1610 on and may control the amount of the ionized flow of gas 1610.1. The control unit 1520 may control a movement of the ionizer device 1610 to move across the surface of the electrostatic clamp 630 to provide the ionized flow of gas 1610 to the entire surface of the electrostatic clamp 630. Alternatively, the ionizer device 1610 may be stationary and arranged to fill the space surrounding the electrostatic clamp 630 with ionized gas. In another example, the ionizer device 1610 is stationary and the object table 620 is moved by the control unit 1520 to provide the ionized flow of gas 1610.1 to the entire surface of the electrostatic clamp 630. The ionized gas neutralizes the residual charge on the electrostatic clamp 630.

Note that the ionized flow of gas 1610.1 should be able to make contact with the electrostatic clamp 630. Therefore, preferably no object 620 should be present on the electrostatic clamp 630 when operating the ionizer device 1610. So when the control unit 1520 determines that the information signal is not within an acceptable range when unloading the object 620, the object 620 is first unloaded before the ionizer device 1610 is activated. The residual charge for the next object 620 will be lower due to the neutralization of the residual charge by the ionizer device 1610. The acceptable range may be set such that when the information signal is just outside the acceptable range, the object 620 can still be unloaded from the electrostatic clamp 630 without generating too much particles.

Alternatively, the control unit 1520 can send a control signal 1520.1 to power supply 1530 which provides power 1530.1 to the electrostatic clamp 630. During clamping of the object 620, the control unit 1520 provides the charge voltage, via the power supply 1530, to the electrostatic clamp 630 so as to clamp the object 620. When unloading, the control unit 1520 stops providing the charge voltage. When, during unloading, the control unit 1520 evaluates that the information signal is not with an acceptable range, the control unit 1520 provides a discharge voltage to the electrostatic clamp 630. The discharge voltage may at least partly neutralize the residual charge. By neutralizing the residual charge, unloading the object 620 may be done with an acceptable unloading force. Applying the discharge voltage by be especially beneficial when the unloading force is not sufficient to remove the object 620 from the electrostatic clamp 630.

In some embodiments, the control unit 1520 may control both the ionizer device 1610 and the electrostatic clamp 630. In such an example, the object table 1600 may be operated until the information signal exceeds the acceptable range. The control unit 1520 controls the discharge voltage to temporarily reduce the residual charge, so the object 620 can be properly removed from the electrostatic clamp 620. After the object 620 is removed from the electrostatic clamp 620, the control unit 1520 stops providing the discharge voltage, which increases the residual charge on the electrostatic clamp 620. Then, the ionizer device 1610 is used to neutralize the residual charge from the electrostatic clamp 620. These embodiments may have the advantage that the ionizer device 1610 is used as little as possible, so the operational use of the object table 1600 is disturbed as little as possible.

The control unit 1520 may be arranged to receive an updated information signal representative of an updated residual force or an updated residual charge. The updated residual force or updated residual charge is based on the residual force or residual charge and the discharge voltage provided to the electrostatic clamp 630. When the control unit 1520 provides the discharge voltage to the electrostatic clamp 630, the measurement unit may detect a change in the measurement signal. The change in the measurement signal causes the measurement signal to form the updated information signal. The control unit 1520 can use the updated information signal to adjust the discharge voltage. The updated information signal may be lower than the information signal. In that case, the polarity of the discharge voltage is correct. However, when the updated information signal is higher than the information signal, the polarity of the discharge voltage may be incorrect. As a result, the control unit 1520 may apply a discharge voltage with an opposite polarity or may apply a smaller discharge voltage.

The object table 1600 may comprise an unloading mechanism to unload the object 620 from the electrostatic clamp 630. The unloading mechanism may comprise a lift pin, like the pin-shaped member 650, or may comprise any other type of mechanism such as a robot arm, a gripper to engage with the bottom surface 620.1 of the object 620, or a vacuum gripper to engage with the top surface of the object 620. The measurement unit may be arranged to monitor a lift force applied by the unloading mechanism on the object 620 to lift the object 620 from the electrostatic clamp 630 during unloading. The lift force is based on the residual force and/or the residual charge. To lift the object 620 from the electrostatic clamp 630, the unloading mechanism needs to provide a lift force to overcome the residual force and the gravity force due to the weight of the object 620. In general, the measurement unit as applied may comprise any type of sensor suitable to monitor the lift force. For example, the measurement unit may comprise a strain gauge attached to the unloading mechanism, a power gauge that monitors the amount of power needed by the unloading mechanism to lift the object 620 from the electrostatic clamp 630, and/or a force sensor that monitors the lift force applied by the unloading mechanism.

In the example of FIG. 16, the unloading mechanism comprises the pin-shaped member 650. The pin-shaped member is provided with a force sensor 1620, which forms part of the measurement unit. The force sensor 1620 is arranged to monitor the lift force. When the pin-shaped member 650 pushes up against the object 620 to unload the object 620 from the electrostatic clamp 630, the lift force is created. The lift force propagates from the object 620 through the pin-shaped member 650 and the force sensor 1620. The force sensor 1620 sends the force signal 1520.3 to the control unit 1520.

The measurement unit may comprise a gap sensor 1630 arranged to provide the measurement signal based on the object 620 in a first state and the object 620 in a second state. In the first state, the object 620 is held by the electrostatic clamp 630. In the second state, the object is away from the electrostatic clamp 630. For example, in the second state, the object 610 is held by the unloading mechanism. When the object 620 is in the first state, the gap sensor 1630 may measure a distance or gap between the gap sensor 1630 and the object 620, for example the bottom surface 620.1. In the second state, the gap sensor 1630 may measure a larger distance or larger gap between the gap sensor 1630 and the object 620, because the object 620 is further away from the electrostatic clamp 630. In the second state, part of the object 620, for example a centre part, may be further away from the electrostatic clamp 630, whereas another part of the object 620, for example an edge part, is still clamped to the electrostatic clamp 630.

The object 620 may perform a movement from the first state to the second state. The object 620 may jump from the first state to the second state. A change in the jump, may indicate a change of the residual force or residual charge. The measurement signal may be representative the movement, for example a distance or a velocity of the movement. When the unloading mechanism starts providing the lift force to the object 620, the object 620 may remain in the first state. When the unloading mechanism increases the lift force, the object 620 may suddenly detach from the electrostatic clamp 620 when the lift force exceeds the residual force. The suddenly detachment may cause the object 620 move a certain distance or at a certain velocity. The higher the residual force, the higher the certain distance or the certain velocity may be. The gap sensor 1630 may monitor the distance and/or velocity as a measure of the residual force. Other known parameters that may influence the distance or the velocity may be a stiffness, mass or damping of the unloading mechanism and a stiffness, mass or damping of the object 620. The gap sensor 1630 may comprise or may be a capacitive sensor. The gap sensor 1630 may be arranged in or at the electrostatic clamp 630.

As an alternative or in addition to the gap sensor 1630, a height sensor 1640 may be used. The height sensor 1640 is arranged to determine a height of the object 620, for example relative to the object table 1600 or any other reference. The height sensor 1640 may be arranged to determine a flatness of the object 620. The height sensor 1640 may be arranged as part of the object table 1600 or may be arranged separately, for example attached to a metrology frame. The height sensor 1640 may be an optical distance measurement sensor, such as an interferometer.

The control unit 1520 is arranged to compare the information signal with a threshold value. When the force signal does not exceed the threshold value, the control unit 1520 does not need to take any action. When the information signal exceeds the threshold value, the control unit 1520 is arranged to take action, as described above.

The object table 1600 may be used in any suitable apparatus, such as one of a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus and a metrology apparatus.

The object 620 may be unloaded from the electrostatic clamp 630 by performing the following method: unloading the object 620 from the electrostatic clamp 630; and providing an ionized flow of gas to the electrostatic clamp 630. Providing the ionized flow of gas may occur after the object 620 has been unloaded from the electrostatic clamp 630.

The method may further comprise the steps of providing an information signal representative of a residual force or a residual charge. The residual force is applied by the electrostatic clamp 630 on the object 620 during unloading of the object 620 from the electrostatic clamp 630. The residual charge is present on the electrostatic clamp 630 when no charge voltage is applied to the electrostatic clamp 630. The method further comprises the step of providing a discharge voltage to unclamp the object 620 from the electrostatic clamp 630 based on the information signal. The method may further comprise providing an ionized flow of gas 1610.1 to the electrostatic clamp 630 based on the information signal.

Note that the power supply 1530 may be divided into separate power supplies for each of the ionizer device 1610 and the electrostatic clamp 630. The power supply 1530 may be integrated with the ionizer device 1610 and/or the electrostatic clamp 630.

When clamping the object 620 onto the electrostatic clamp 630, the charge voltage, also referred to as clamping voltage, needs to be sufficient to properly clamp the object 620. Properly clamped means that the object 620 is pressed sufficiently flat against the electrostatic clamp 630. Before the object 620 is clamped, the object 620 may not be flat, but may be for example bowl-shaped, or saddle-shaped or umbrella-shaped. To flatten the object 620 against the electrostatic clamp 630, a high clamping voltage is required. However, if the clamping voltage becomes higher, more particles are being generated. It is therefore desirable to apply a clamping voltage that is as low as possible, while properly clamping the object 620 on the electrostatic clamp 630.

According to a fourth aspect of the present disclosure, this may be done by clamping the object 620 on the electrostatic clamp 630 with the following method: i) providing the object 620 on the electrostatic clamp 630; ii) increasing a clamping voltage of the electrostatic clamp 630 until a clamped state is detected in which the object 620 is clamped on the electrostatic clamp 630; iii) determining a first clamping voltage being the clamping voltage at the clamped state; iv) providing a second clamping voltage to the electrostatic clamp 630, which is less than the first clamping voltage. The clamped state may be detected when a clamping parameter is within a threshold. The clamping parameter may comprise one of a flatness of the object, a change in shape of the object caused by a change in the clamping voltage, and a center portion of the object being in contact with the electrostatic clamp.

With this method, the first clamping voltage is a clamping voltage that is sufficient to properly clamp the object 620 on the electrostatic clamp 620. By doing so, one can avoid a voltage that is too high, i.e. an unnecessary high clamping voltage. Further, the inventors have discovered that the first clamping voltage as applied is needed to flatten the object 620, but that a lower clamping voltage is sufficient to keep the object 620 flat on the electrostatic clamp 620. Therefore, after the first clamping voltage is applied, the second clamping voltage can be set at a lower value than the first clamping voltage. As a result, the second clamping voltage provides less particles than if the first clamping voltage would be kept.

FIG. 17 schematically presents the clamping voltage V as provided to the electrostatic clamp 630 according to some embodiments of the present disclosure, as a function of time t. At t=0, the clamping voltage is increased till at time t=$t_1$ the first clamping voltage $V_{max}$ has been reached. During the period 0–$t_1$, the deformation of the object 620 is monitored, for example by the gap sensor 1630 or the height sensor 1640 or any other suitable deformation sensor. As such, during the period 0–$t_1$, the deformation of the object 620 is determined as a function of the clamping voltage increase. For a bow-shaped object 620, the deformation may change much when the clamping voltage increase starts. But when the bow-shaped object 620 is flattened against the electrostatic clamp 630, the deformation will no longer change or will change only negligibly little in response to another clamping voltage increase. So the deformation due to a clamping voltage increase can be found to be lower than a threshold, e.g. a predetermined threshold. When a further clamping voltage increase does not lead to any substantial difference in the deformation, it may be concluded that the object 620 is flattened on the electrostatic clamp 630. With reference to FIG. 17, such condition occurs at t=$t_1$. The voltage as applied at t=$t_1$ may then be considered the first clamping voltage $V_{max}$.

After providing the first clamping voltage $V_{max}$ to the electrostatic clamp 630, the clamping voltage is decreased by providing a clamping voltage decrease to the electrostatic clamp 630, and the deformation of the object 620 is determined caused by the clamping voltage decrease. This is repeated until the deformation is higher than a further threshold. The clamping voltage is decreased until the clamped state is no longer detected. Then, a third clamping voltage $V_{min}$ is determined when the deformation is higher than the further threshold. The third clamping voltage $V_{min}$ is the clamping voltage at which the clamped state is no longer detected, for example the first value of the clamping voltage at which the clamped state is no longer detected. The second clamping voltage $V_{final}$ is applied to the electrostatic clamp 630. The final clamping voltage $V_{final}$ is higher than the third clamping voltage $V_{min}$.

As shown in FIG. 17, between t=$t_1$ and t=$t_2$, the clamping voltage is decreased from the first clamping voltage $V_{max}$ to the third voltage $V_{min}$. At $V_{min}$, the clamping force applied by the electrostatic clamp 630 has been reduced to the extent that the object 620 becomes unflat again. The determined deformation of the object 620 indicates that the object 620 has become unflat. Note that at t=$t_2$, the object 620 may still be much more flat than at t=0.

In FIG. 17, between t=$t_2$ and t=$t_3$, the clamping voltage is increased to the first clamping voltage $V_{max}$. This may be done by simply applying the same clamping voltage as at time $t_1$ or by determining the deformation of the object 620 until the deformation is again lower than the threshold. At time $t_3$, the object 620 is flattened against the electrostatic clamp 630. After $t_3$, the clamping voltage is reduced to the second clamping voltage $V_{final}$ which is higher than the third clamping voltage $V_{min}$ and lower than the first clamping voltage $V_{max}$. This way, the object 620 maintains a proper flatness at a low clamping voltage.

In the example described above, instead of determining the first clamping voltage $V_{max}$, the second clamping voltage $V_{final}$ and the third clamping voltage $V_{min}$ based on a deformation of the object 620, one or more of those clamping voltages may be based on whether a center portion of the object 620 is in contact with the electrostatic clamp 630, or based on any other suitable clamping parameter.

The second clamping voltage $V_{final}$ may be less than 150% of the third clamping voltage ($V_{min}$), for example less than 140% or less than 130% or less than 120% or less than 110% or less than 105%

FIG. 18 schematically presents the clamping voltage as provided to the electrostatic clamp 630 according to another example of the present disclosure. Similarly to the example of FIG. 17, the clamping voltage is set to the first clamping voltage $V_{max}$ at t=$t_1$, and to the third clamping voltage $V_{min}$ at t=$t_2$. However, in these embodiments, the flatness at the third clamping voltage $V_{min}$ is sufficient for processing the object 620. Therefore, between t=$t_2$ and t=$t_3$, the clamping voltage is increased from the third clamping voltage $V_{min}$ to the second clamping voltage $V_{final}$. Because the flatness at the third clamping voltage $V_{min}$ is sufficiently flat, it is not required to increase the clamping voltage back to the first clamping voltage $V_{max}$ to re-flatten the object 620. The clamping voltage is increased from the third clamping voltage $V_{min}$ to the second clamping voltage $V_{final}$ to make sure that the object 620 remains clamped to the electrostatic clamp 630 during processing of the object 620.

FIG. 19 schematically presents the clamping voltage as provided to the electrostatic clamp 630 according to yet another example of the present disclosure. When the first clamping voltage $V_{max}$ is applied on time $t_1$, a clamping force between the object 620 and the electrostatic clamp 630 is determined. The second clamping voltage $V_{final}$ is provided based on the clamping force. For example, a high clamping force at the first clamping voltage $V_{max}$ may indicate a good clamping of the object 620, so the second clamping voltage $V_{final}$ may be set relatively low. On the other hand, a low clamping force at the first clamping voltage $V_{max}$ may indicate a poor clamping of the object 620, so the second clamping voltage $V_{final}$ may be set relatively high.

The object table 1600 may be arranged to set the clamping voltages as shown in FIGS. 17-19. The object table 1600 may comprise the electrostatic clamp 630 for clamping the object 620 and may comprise the control unit 1520 for providing the clamping voltage to the electrostatic clamp 630. The object table 1600 may comprise the measurement unit for providing the control unit 1520 with a measurement signal representative of the deformation of the object 620. For example, the measurement unit comprises the gap sensor 1630. The gap sensor 1630 may be arranged to determine a gap between the object and the electrostatic clamp 630. Alternatively, the measurement unit is arranged separately from the object table 1600, such as the height sensor 1640 which may be arranged on a metrology frame. The height sensor 1640 may be arranged to determine the height of the object 620. The measurement unit may be arranged to determine whether the object 620 is flat or bow-shaped. Based on whether the object 620 is flat or bow-shaped, the control unit 1520 may use the method of either FIG. 17, 18 or 19, or any other suitable method.

Figure 20:
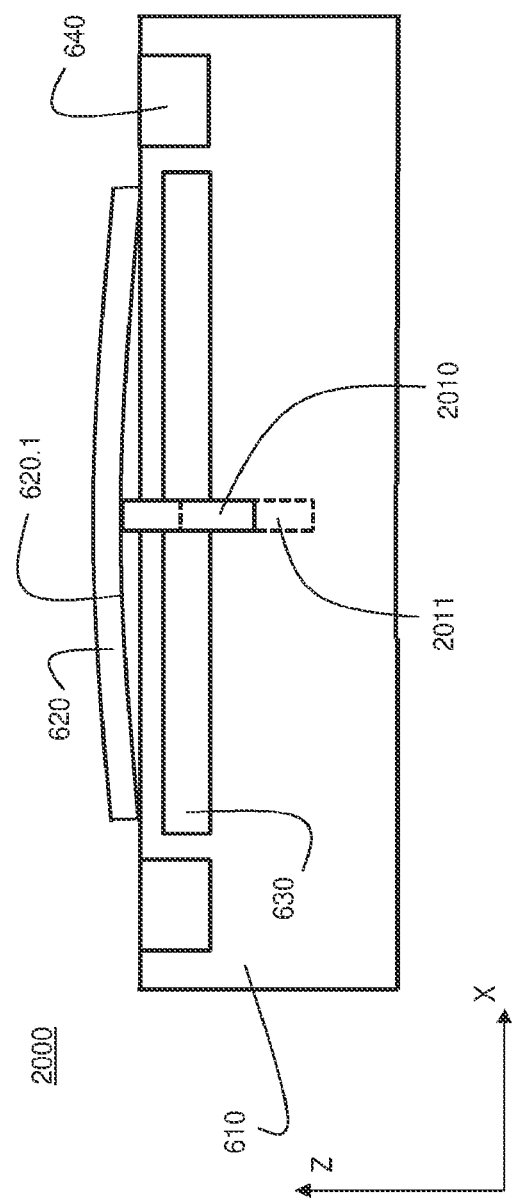
FIG. 20 schematically presents yet another example of an object table, according to some embodiments of the present disclosure.

FIG. 20 shows a further example of the present disclosure. An object table 2000, which may be the same as the object table 1600, except for the following. The object table 2000 comprises a force sensor 2010. The force sensor 2010 may be the same as force sensor 1620. The force sensor 2010 may extend beyond the surface of the electrostatic clamp 630 such that during time $t_1$, when the maximum clamping voltage $V_{max}$ is applied, the object 620 is partly clamped on the force sensor 2010. This way, the force sensor 2010 is arranged to detect the clamping force with which the object 620 is clamped on the electrostatic clamp 630 while the first clamping voltage $V_{max}$ is applied to the electrostatic clamp 630. After the clamping force at time $t_1$ is determined, the force sensor 2010 may be moved in a down-position 2011, indicated by the dashed line. In the down-position 2011 the force sensor 2010 is retracted below the surface of the electrostatic clamp 630, so the force sensor 2010 is not in contact with the object 620. When the force sensor 2010 is in the down-position, the object 620 is able to be properly flattened on the electrostatic clamp 630. Even though FIG. 20 shows a single force sensor 2010, a plurality of force sensors 2010 may be applied distributed along the electrostatic clamp 630.

The control unit 1520 may comprise a machine learning unit arranged to predict the third clamping voltage $V_{min}$ based on the clamping voltage and the clamping parameter. For example, the machine learning unit may take into account, the change in clamping voltage over time, the deformation over time, and/or the clamping force determined by the force sensor 2010. The machine learning unit may be provided with information of the object 620 that was acquired outside the object table 1600, such as the material of the object 620, the dimensions of the object 620 and other measurement information about the object 620.

According to a fifth aspect of the present disclosure, there is provided a method of determining a residual charge of a clamping mechanism of an object table. As indicated above, a residual charge may build up over time on isolates surfaces such as surfaces of clamping mechanisms as applied in lithographic apparatuses or inspection apparatuses such as particle beam inspection tools or electron beam inspection tools. Such a residual charge can e.g. build up over multiple object processing cycles and may affect the clamping of an object to the clamping mechanism. Within the meaning of the present disclosure, a residual charge of a clamping mechanism may also refer to a charge on a surface or surfaces that are close to the clamping surface of the clamping mechanism or surfaces covering it. Such surfaces that surround or enclose or cover the actual surface where the clamping force is generated, can be considered, within the meaning of the present disclosure, as being part of the clamping mechanism.

Figure 21:
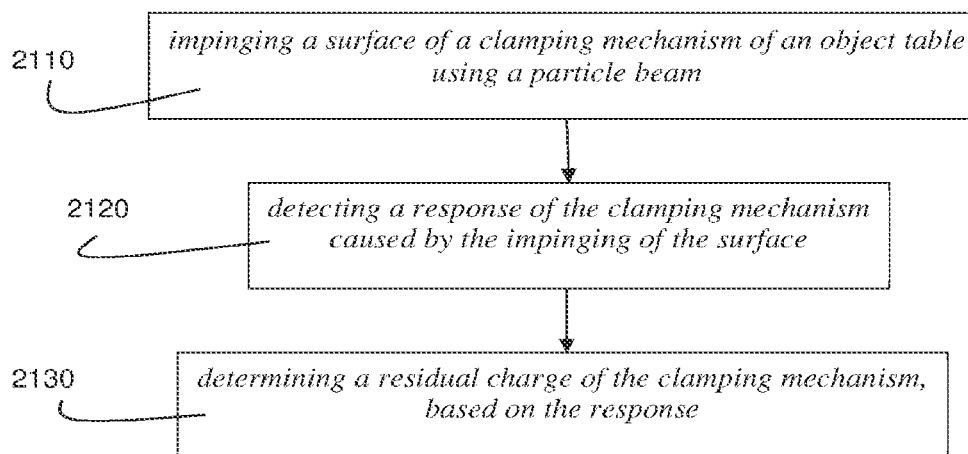
FIG. 21 schematically shows a flowchart of a method of determining the residual charge of a clamping mechanism, according to some embodiments of the present disclosure.

In some embodiments according to the fifth aspect of the present disclosure, it is proposed to determine or estimate the residual charge that is present on a clamping mechanism by probing the clamping mechanism with a particle beam, e.g. a particle beam available in the inspection apparatus. In particular, in some embodiments, the present disclosure provides in a method of determining a residual charge of a clamping mechanism by impinging or probing the surface of the clamping mechanism using a particle beam, determining or detecting a response of the clamping mechanism to the impinging or probing of the surface, and determining the residual charge of the clamping mechanism based on the detected response. FIG. 21 schematically shows a flowchart 2100 of the method of determining the residual charge of a clamping mechanism according to the present disclosure. In a first step 2110, the method comprises impinging a surface of a clamping mechanism of an object table using a particle beam. Particles beams such as ion beams or electron beams are generally known and applied in inspection apparatuses for inspecting surfaces or structures of objects such as semiconductor substrates. In such apparatuses, the object that is to be inspected is typically held, e.g. clamped, onto a clamping mechanism of an object table. During the inspection, a particle beam such as an electron beam is used to probe or impinge the object. Such probing or impinging may result in the generation of radiation and particles, emitted by the object. As an example, the probing of an object by an electron beam may cause the object to emit secondary electrons or generate scattered electrons. In the method according to the present disclosure, the particle beam, e.g. an electron beam, is used to impinge the surface of the clamping mechanism of an object table, rather than the object which is typically held on the object table. Considering the typical layout of an object table as applied in an inspection apparatus, the application of a particle beam to a surface of the clamping mechanism will require that the object table is not holding an object. In the absence of such an object, the particle beam can be made to interact with the clamping mechanism rather than with an object.

In a second step 2120, the method according to the present disclosure comprises detecting a response of the clamping mechanism to the impinging of the surface by the particle beam. When a particle beam is made to impinge on a surface of a clamping mechanism, e.g. an electrostatic clamp, this may cause the generation of radiation and/or particles that are emitted by the surface. As an example, an electron beam impinging on the surface of a clamping mechanism may cause the generation of secondary electrons or scattered electrons. Said electrons may, in some embodiments of the present disclosure, be detected by a detector. Such a detector may e.g. be configured to determine the amount of secondary electrons and/or the energy or energy spectrum of the secondary electrons.

In a third step 2130, the method according to the present disclosure comprises determining the residual charge of the clamping mechanism, based on the response. With respect to this third step, it can be pointed out that, when there is a residual charge on the clamping mechanism, the response to the particle beam, as detected by the detector, will be different. This can be understood as follows: particle beams such as electron beams are known to be used to inspect objects such a semiconductor substrates. During such inspection, a voltage difference is applied between the object and the particle beam source, said voltage difference causing the particles to impinge on the object with a particular amount of energy. The response of the object to the impinging particles, i.e. the effect of the impinging particles, will depend on this amount of energy. The amount of energy of the particles when impinging the object may also be referred to as the landing energy (LE). Depending on the amount of energy the particles have when impinging the object, the response will be different; the amount of radiation and/or emitted particles, such as secondary electrons, that is generated will depend on the landing energy. In case a charge, either positive or negative, is present on the object that is examined, this will affect the landing energy of the particles that impinge on the object. As such, a charge on the object will result in a different response of the object to the impinging particle beam. In case a clamping mechanism, e.g. including an electrostatic clamp, is subjected to a particle beam, one can thus determine the presence of a charge on the clamping mechanism, based on the response of the clamping mechanism due to the impinging particle beam. In some embodiments, the presence of a charge on the clamping mechanism may be determined using e.g. an experimental data set and/or a model representing a relationship between the impinging particle beam and the response of the clamping mechanism.

As an alternative to determining the residual charge using a particle beam, the use of an electrostatic voltmeter or voltage meter can also be mentioned. In such an example, care should be taken to position the voltmeter sufficiently close to the substrate or object table but sufficiently far from the high voltage area.

As will be appreciated by the skilled person, the presence of a charge on the clamping mechanism may either cause a repelling or attractive force to the applied particle beam. In case the particle beam includes an electron beam, a positive charge on the clamping mechanism will result in an attractive force on the electrons of the electron beam, causing an increased landing energy. In case of a negative charge on the clamping mechanism, the electrons of an electron beam will be repelled, causing a reduced landing energy.

In some embodiments of the present disclosure, the clamping mechanism as applied comprises an electrostatic clamp. Such an electrostatic clamp may comprise one or more electrodes, e.g. embedded in a surface of the electrostatic clamp.

In some embodiments, the step 2110 of impinging the surface of the clamping mechanism comprises impinging the surface at a plurality of different locations on the surface. By doing, the presence of a charge on the clamping mechanism can be determined for the different locations. In such an example, the method according to the present disclosure can include determining a residual charge distribution across the surface of the clamping mechanism. In such an example, the method may e.g. comprise positioning the clamping mechanism relative to the particle beams, e.g. using a stage apparatus, such that the particle beams impinge on the different locations on the surface. Alternatively or in addition, the position of the particle beam may be controlled as well, thereby controlling at which the location on the clamping mechanism the particle beam impinges.

Some embodiments according to a sixth aspect of the present disclosure provide a particle beam apparatus that is configured to perform the method 2100 according to the present disclosure. An example of such an apparatus is schematically shown in FIG. 22.

Figure 22:
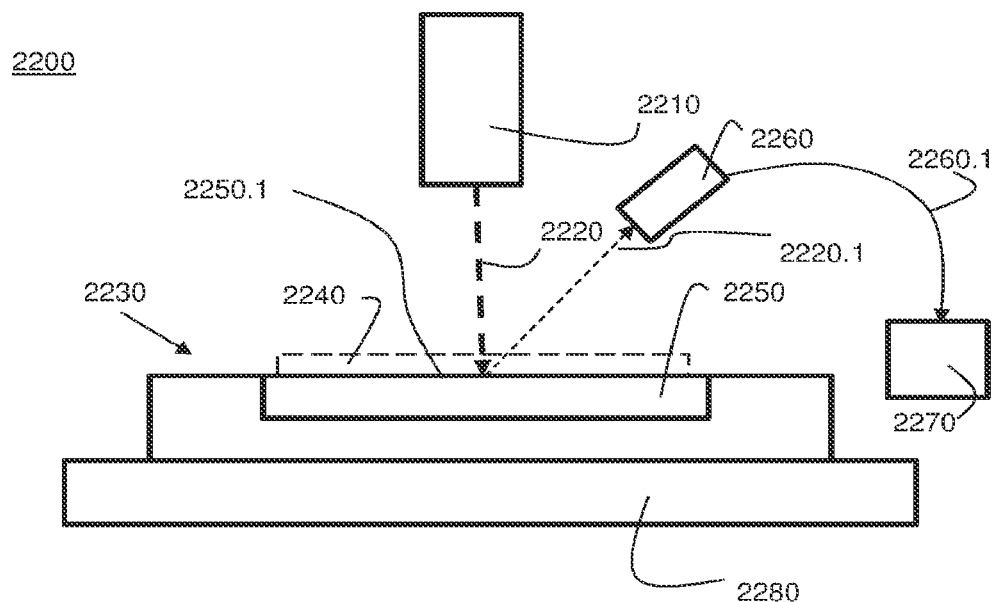
FIG. 22 schematically shows a particle beam apparatus according to some embodiments of the present disclosure.

FIG. 22 schematically shows a particle beam apparatus 2200 according to some embodiments of the present disclosure. In the example as shown, the particle beam apparatus comprise a particle beam generator 2210, the particle beam generator being configured to generate a particle beam 2220, e.g. an ion beam or electron beam or multiple electron beams. In the example as shown, the apparatus 2200 further comprises an object table 2230 for holding an object 2240, the object table 2230 comprising a clamping mechanism 2250 for clamping the object 2240 to the object table 2230. In some embodiments, the clamping mechanism 2250 can e.g. comprise an electrostatic clamp. Such an electrostatic clamp can comprise one or more electrodes which can be connected to a power source. In the example as shown, the apparatus 2200 further comprises a detector 2260. Such a detector 2260 may be configured to detect a response of the object 2240 when the object 2240 is subjected to the particle beam 2220. In particular, the detector 2260 may be configured to detect radiation and/or particles that are generated in response to an impinging of the object 2240 by the particle beam 2220. In response to an impinging of the object by a particle beam, the object may e.g. emit secondary electrons or scattered electrons, which may be detected by the detector 2260. In accordance with some embodiments of the present disclosure, the detector 2260 is configured to detect a response 2220.1 of the clamping mechanism 2250, when the clamping mechanism is impinged by the particle beam 2220. In the example as shown, the apparatus 2200 further comprises a control unit 2270. In accordance with some embodiments of the present disclosure, the control unit is configured to:

control the particle beam generator 2210 to cause a particle beam 2220 to impinge on a surface 2250.1 of the clamping mechanism 2250;

receive a detector signal 2260.1 from the detector 2260, the detector signal 2260.1 representing the response of the clamping mechanism 2250 to the impinging particle beam 2220, and determine a residual charge on the clamping mechanism 2250, based on the detector signal 2260.1.

The apparatus 2200 according to some embodiments of the present disclosure thus enables to determine a residual charge that is present on a clamping mechanism. Having knowledge of such a residual charge may facilitate the unloading of an object, such as object 2240, when it has been processed by the apparatus.

In some embodiments, the apparatus 2200 according to the present disclosure is configured to impinge the surface of the clamping mechanism at a plurality of different locations on the surface. By doing so, the presence of a charge on the clamping mechanism 2250 can be determined for the different locations. In order to do so, the apparatus 2200 further comprises a stage or stage apparatus 2280 that is configured to position the object table 2230 relative to the particle beam 2220. In particular, the stage apparatus 2280 can be configured to scan the clamping mechanism 2250 underneath the particle beam 2220. Such a stage apparatus 2280 may e.g. comprise one or more motors or actuators for positioning the object table 2230. In such an example, the control unit 2270 may be configured to control the positioning of the object table 2230 as well, e.g. by generating suitable control signals for the motors or actuators of the stage or stage apparatus 2280. In some embodiments, the apparatus 2200 may further comprise a position measurement system, e.g. an interferometer based or encoder based measurement system, that is configured to measure a position of the stage apparatus 2280 relative to the particle beam generator 2210, or relative to a reference or reference frame. When the residual charge of the clamping mechanism 2250 is determined at various locations, the control unit 2270 can be configured to determine a residual charge distribution across the surface of the clamping mechanism 2250.

The residual charge as determined may advantageously be used to control or adjust the unloading process of an object 2240 that has been processed on the object table 2230. As an example, the clamping mechanism as applied may e.g. be or comprise an electrostatic clamp having one or more electrodes. The voltage as applied to the electrodes during an unloading sequence of the object 2240 can be controlled taking account of the determined residual charge or residual charge distribution. In some embodiments, a repelling force can be generated between the object 2240 and the clamping mechanism 2250. This can e.g. be done by applying the same voltage to the object 2240 and the clamping mechanism 2250. In the example, the clamping mechanism 2250 may have one or more electrodes to apply a voltage to the object 2240. This creates a repelling force between the object 2240 and the clamping mechanism 2250 that is constant over distance. In some embodiments the force applied by a loading/unloading mechanism such as the loading/unloading mechanism 550, 650 described above, may be removed first, and then the repelling force may be applied between the object 2240 and the clamping mechanism 2250. The repelling force may be smaller than the gravitational force. Then the loading/unloading mechanism may be used to lift the object 2240. If the object 2240 still sticks to the clamping mechanism 2250, a higher repelling force may be used. The higher repelling force may be stopped as soon as the object 2240 is moving. Therefore the loading/unloading mechanism may be set to touch the object 2240 and apply a small force. The position of the loading/unloading mechanism can be measured. As soon as movement is detected (e.g. 50 µm displacement), the repelling force must be removed.

According to a seventh aspect of the present disclosure, there is provided a method of reducing a surface charge of a clamping mechanism. Such a method is schematically described in the flowchart of FIG. 23. In accordance with the present disclosure, the method of reducing a surface charge of a clamping mechanism 2300 makes use of a particle beam for reducing a surface charge on a clamping mechanism, e.g. a clamping mechanism as applied on an object table of a particle beam apparatus. In particular, the method according to some embodiments of the present disclosure comprises a first step 2310 of generating a particle beam, the particle beam being configured to have a secondary emission yield (SEY) substantially equal to 1 in a surface of the clamping mechanism. As will be appreciated by the skilled person, when a particle beam is applied to the surface of an object, e.g. an electron beam as applied to a semiconductor substrate for the purpose of inspection, an interaction takes place between the electron beam and the object. Such an interaction may e.g. cause the generation of secondary electrons. The amount of generated secondary electrons will in general depend on the applied voltage difference between the object and the particle beam source. As such, by controlling the applied voltage difference, one can control the amount of generated secondary electrons. In accordance with the first step 2310 of the method 2300 according to the present disclosure, a particle beam is generated that has a secondary emission yield (SEY) that is substantially equal to 1. Within the meaning of the present disclosure, the application of an electron beam having an SEY substantially equal to 1 implies that, on average, the number of electrons that is caused to interact with the object, corresponds to the number of electrons, referred to as a secondary electrons, that is emitted by the object. In order to arrive at such condition, i.e. whereby, on average, a secondary electron is emitted for each electron that arrives at the object, the arriving or landing electron needs to have a specific energy or energy level. The energy of an electron when landing on an object or surface of an object is in general referred to as the landing energy. As will be appreciated by the skilled person, the landing energy (LE) of an electron depends a.o. on the applied voltage difference between the object and the particle beam source. As such, the landing energy of electrons of an electron beam can be controlled by controlling the voltage difference between the object and the particle beam source. As such, one can control the applied voltage difference such that the landing energy (LE) of the electrons is such that an SEY substantially equal to 1 is obtained. In this respect, it can be pointed out that in an inspection apparatus for inspecting objects using a particle beam, the object table holding the object may be equipped with one or more additional electrodes, e.g. electrodes that are different from e.g. electrodes of a clamping mechanism Such electrodes may e.g. be referred to as high-voltage plates. Such electrode or electrodes may e.g. be arranged along a circumference of the object or object table and may be connected, during use, to a voltage source such as a high-voltage source. When such electrodes are applied, it will be clear to the skilled person that these electrodes may also have an effect on the landing energy (LE) of the electrons. Such electrodes should thus also be taken into account when determining the required voltage difference to arrive at a suitable landing energy (LE), resulting in an SEY substantially equal to 1. As will be explained in more detail below, the landing energy (LE) can also depend on a charge state of the object. As such, when referring to a voltage difference or landing energy LE resulting in an SEY of approx. 1, it is assumed that the object is in a neutral state, i.e. absent of surface charges. In some embodiments of the present disclosure, the first step 2310 of the method 2300 can be preceded by or comprise the steps of:

determining a voltage difference between a source of the particle beam and the clamping mechanism required to obtain the SEY to be substantially equal to 1, and generating the particle beam by applying the determined voltage difference.

In a second step 2320 of the method 2300 according to the present disclosure, the surface of the clamping mechanism is impinged using the particle beam as generated. by subjecting the surface of the clamping mechanism to a particle beam that is conditioned to have an SEY substantially equal to 1, it can be shown that a residual charge on the clamping mechanism can be reduced.

As will be appreciated by the skilled person, the LE which results in a SEY substantially equal to 1 will in general depend on the material that is subjected to the particle beam. As such, in order to ensure that the particle beam as generated results in an SEY substantially equal to 1, the material of the clamp mechanism and its SEY vs. LE characteristic, at least a required value of the LE to arrive at the SEY substantially equal to 1, should be known, in order to determine which voltage difference to be applied between the particle beam source and the object. It can be pointed out that such material characteristics, e.g. a value of the LE corresponding to an SEY substantially equal to 1, an SEY vs. LE characteristic, can be determined empirically.

Figure 24:
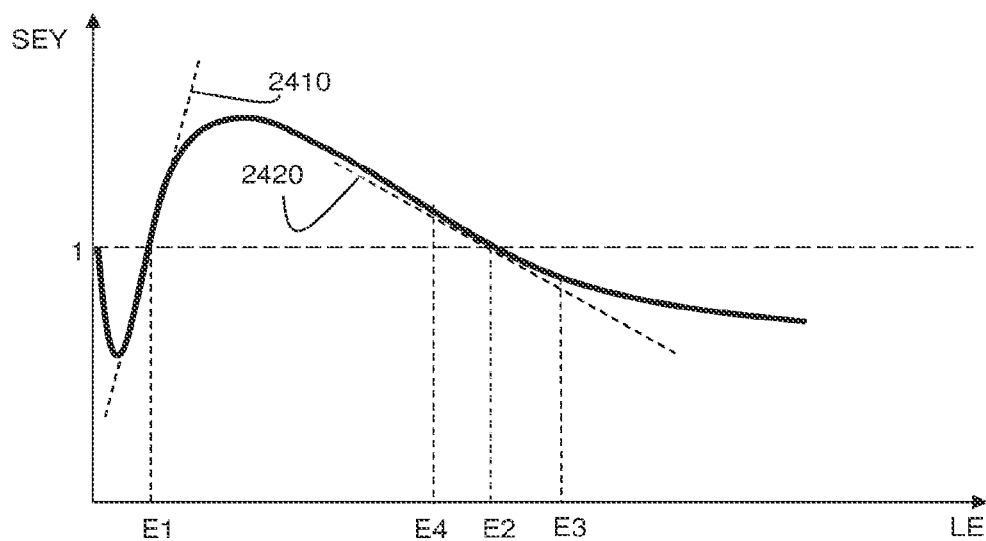
FIG. 24 schematically shows an SEY vs. LE graph.

FIG. 24 schematically shows a typical SEY vs. LE characteristic 2400, i.e. a characteristic of the secondary electron yield (SEY) as a function of the landing energy (LE) of electrons of a particle beam. As can be seen, the graph or characteristic 2400 has two energy levels, E1 and E2 which result in an SEY substantially equal to 1. In case of a characteristic have more than one energy level resulting in an SEY substantially equal to 1, it is important to select, as the required landing energy LE, the energy level around which the graph or characteristic 2400 has a negative slope. As illustrated in FIG. 24, the graph 2400 has a positive slope 2410 around energy level E1 and a negative slope 2420 around the energy level E2. Or, phrased differently, a derivative of the SEY with respect to the landing energy is positive around energy level E1 and negative around energy level E2.

When a landing energy E2 is applied, i.e. the energy value around which the graph 2400 has a negative slope or negative derivative, this can result in a reduction or neutralisation of any residual charges on a surface. This can be explained as follows: In case there are no surface charges present on the clamping mechanism, the application of a voltage difference between the particle beam source and the clamping mechanism that results in a landing energy E2 will cause, on average, the emission of one secondary electron for each impinging electron. In case this voltage difference is applied to a surface having a positive charge, the electrons will be attracted by said positive charge, resulting in an increased landing energy LE, in particular a landing energy larger than E2, e.g. landing energy E3. As can be seen from graph 2400, such a landing energy E3 will have a corresponding SEY smaller than 1. When the SEY is smaller than 1, the number of electrons supplied to the surface is larger than the number of electrons emitted by the surface, thus resulting in a reduction or neutralisation of the positive surface charge. In case the voltage difference is applied to a surface having a negative charge, the electrons will be repelled more or attracted less by said negative charge, resulting in a reduced landing energy LE, in particular a landing energy smaller than E2, e.g. landing energy E4. As can be seen from graph 2400, such a landing energy E4 will have a corresponding SEY larger than 1. When the SEY is larger than 1, the number of electrons supplied to the surface is smaller than the number of electrons emitted by the surface, thus resulting in a reduction or neutralisation of the negative surface charge.

According to a eighth aspect of the present disclosure, the method 2300 of reducing a surface charge of a clamping mechanism according to the present disclosure may advantageously be executed by a particle beam apparatus according to the present disclosure.

Figure 23:
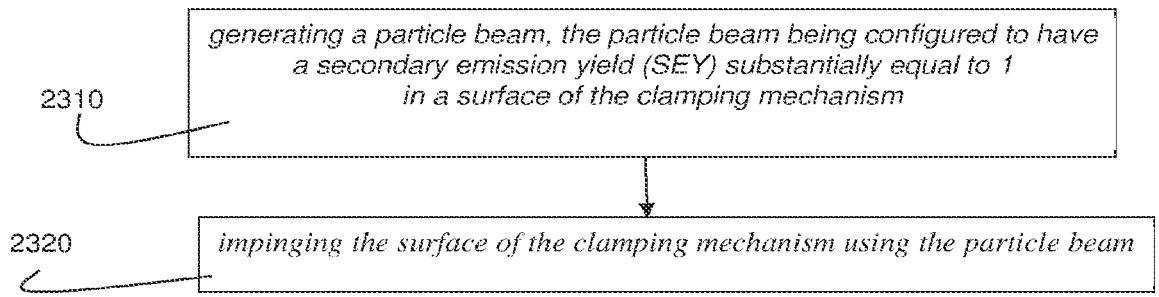
FIG. 23 schematically shows a flowchart of a method of reducing a surface charge of a clamping mechanism.
Figure 25:
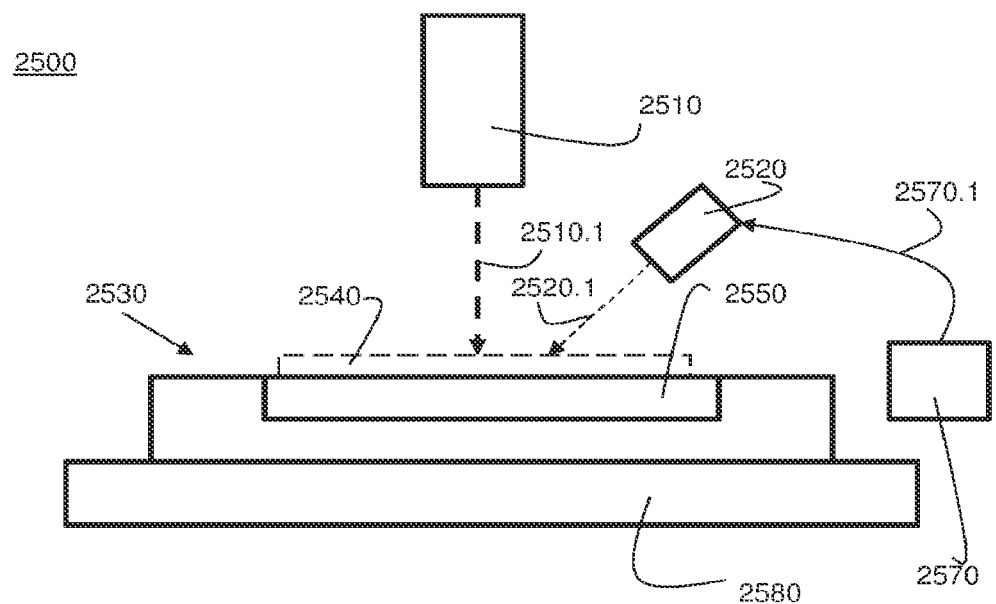
FIG. 25 schematically shows a particle beam apparatus, according to some embodiments of the present disclosure.

Such an apparatus configured to perform the method 2300 as schematically shown in FIG. 23, is shown in FIG. 25.

The apparatus 2500 as schematically shown may have a similar structure as the apparatus 2200 shown in FIG. 22. In the example as shown, the particle beam apparatus 2500 comprises two particle beam generator 2510, 2520. In the example as shown, the apparatus 2500 comprises a first particle beam generator 2510 which can e.g. be used to generate a particle beam 2510.1 such as an electron beam for inspecting an object. The apparatus as shown further comprises a second particle generator 2520 for generating a second particle beam 2520.1 which can e.g. be used to neutralize a charge of an object prior to or after the object has been inspected. Such a particle beam generator 2520 may also be referred to as a flood gun. Note that in general, both particle beam generators 2510, 2520 may be oriented so as to generate a particle beam in a direction substantially perpendicular to the object 2540.

It is submitted that, in order to perform the method reducing a surface charge of a clamping mechanism, either one of the particle beam generators may be used.

In the example as shown, the apparatus 2500 further comprises an object table 2530 for holding an object 2540, the object table 2530 comprising a clamping mechanism 2550 for clamping the object 2540 to the object table 2530. In the example as shown, the apparatus 2500 further comprises a control unit 2570, the control unit 2570 being configured to either one of the particle beam generators 2510, 2520 to generate a particle beam 2510.1, 2520.1 which is configured to have a secondary emission yield (SEY) substantially equal to 1 in a surface of the clamping mechanism 2550. In some embodiments, the particle beam as generated by either one of the particle beam generators comprises one or more electron beams. With reference to the above method 2300, this means that the control unit 2570 is configured to control the particle beam generator 2510 or 2520 such that a landing energy of the particles of the particle beam result in an SEY substantially equal to 1. Such control may involve, as explained above, controlling the voltage difference between the source of the particle beam and the clamping mechanism to a suitable value, so as to obtain the desired landing energy. In the example as shown, reference number 2570.1 e.g. indicates a control signal generated by the control unit 2570 for controlling the particle beam generator 2520 to generate the desired particle beam. In accordance with the present disclosure, the control unit 2570 is further configured to control the particle beam as generated to impinge the surface of the clamping mechanism 2550. By doing so, as explained above with reference to FIG. 24, any residual charge on the clamping mechanism 2550 can at least be reduced.

As a result of this reduction of the residual charge that may have been build up, an unloading or unclamping of object that are inspected by the apparatus, can be facilitated. In the example as shown, the apparatus 2500 further comprises a stage apparatus 2580 that is configured to displace the object table 2530 relative to the particle beam generators. By doing so, the entire surface of the clamping mechanism 2550 or particular portions thereof can be subject to the particle beam, in order to reduce the residual charge on the clamping mechanism.

It can be submitted that the application of the method 2300 according to the present disclosure, in order to reduce an residual charges on the clamping mechanism can be applied periodically. The method can e.g. be applied at predetermined intervals, e.g. each time a particular number of object is processed, e.g. inspected. Alternatively, or in addition, use can be made of indications or observations obtained during the processing of the objects. In particular, the above described methods that enable to determine the residual charge, or an indication thereof such as an increased unloading force, may be applied to trigger the application of the method 2300 to reduce the residual charge on a clamping mechanism such as clamping mechanism 2550. It can further be submitted that the particle beam generator 2510 and/or 2520 can be provided with focusing means for controlling a cross-section of the particle beam impinging the surface of the clamping mechanism 2550. The cross-section of the applied particle beam determines the density of the applied particles to the clamping mechanism. The higher the cross-section of the particle beam, the lower the density of particles. Depending on the actual amount of residual charge that is present at a particular location on the clamping mechanism, said location will require a certain amount of particles in order to neutralize the surface at said location. During a scanning process of the particle beam across the clamping mechanism, the density of the applied particle beam should thus be taken into account when determining the scanning speed, in order to ensure that the residual charge is sufficiently reduced. It has been deduced by the inventors that, when a typical particle beam is applied to a known clamping mechanism, e.g. a particle beam having a cross-section of 5-6 $mm^2$ and a clamping mechanism made from $SiO_2$, the time to remove approx. 95% of a residual charge can be achieved within 0.5 msec. Based on such parameters, a typical clamping mechanism can be substantially neutralised in less than 20 sec.

It should be clear to the person skilled in the art that the method of reducing the surface charge of the clamping mechanism according to the eighth aspect of present disclosure may be initiated based on the predicted, estimated or measured residual force or residual charge according the other aspects of the present disclosure as described in this document.

Figure 26:
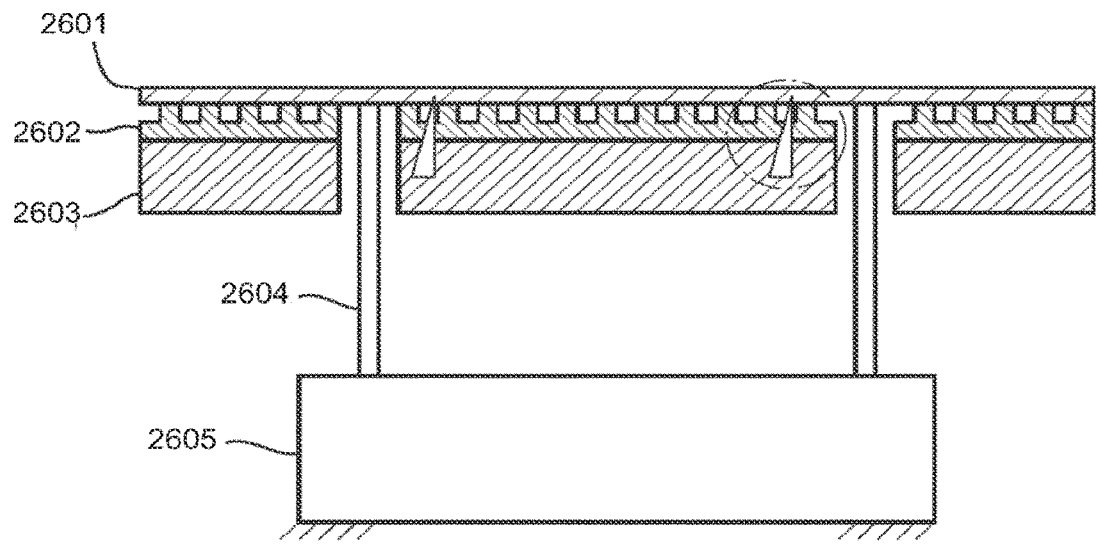
FIG. 26 is a conceptual figure that shows an object on an object table, according to some embodiments of the present disclosure.
Figure 27:
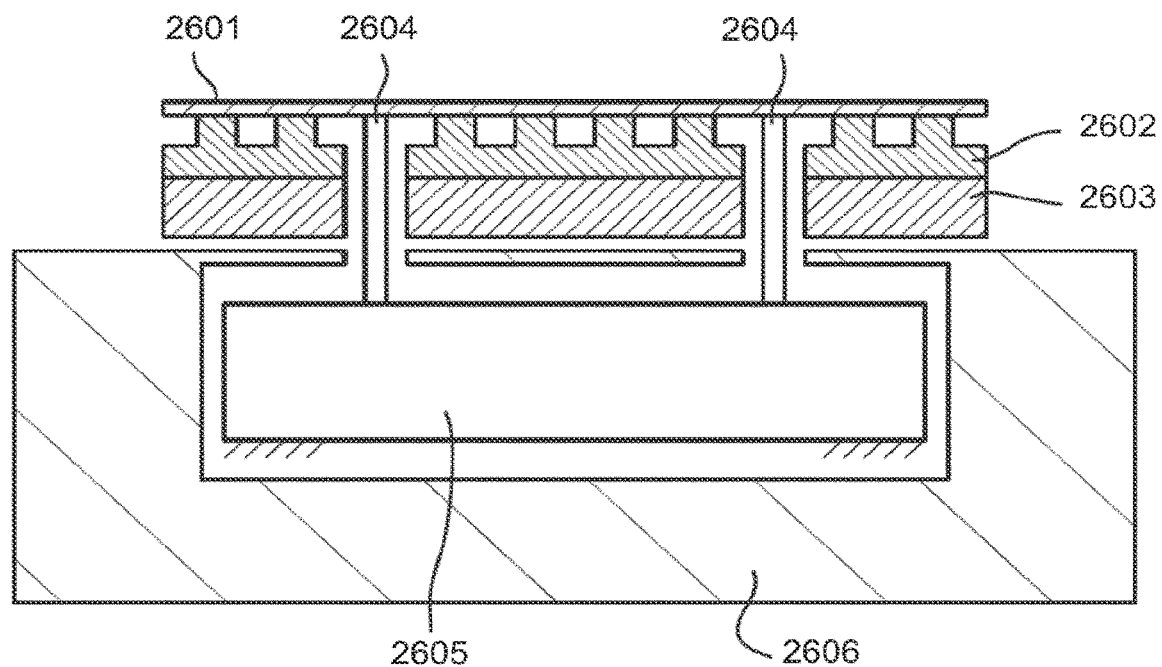
FIG. 27 is a conceptual figure that shows an object on an object table, a positioning device and an object unloading device.

According to a ninth aspect of the present disclosure, when an object 2601 is held by an electrostatic clamp, the object 2601 may be charged to a high voltage by one or more electrodes of the electrostatic clamp that protrude out of the object table 2602 and contact the lower surface of the object 2601. This may be a cause of an electric charge build-up that holds the object 2601 to the object table 2602. In some embodiments, one or more further electrodes, that stick out of the object table 2602 and contact the lower surface of the object 2601, are used to discharge any electric charge that has built up. The number of further electrodes may be, for example, three. These embodiments is shown in FIG. 26. In FIG. 26, the electrode on the left has been used to charge the object 2601 to a high voltage. The electrode on the right has been brought into contact with the object 2601 in order to discharge the electric charge build up. The electrode on the right may be connected at the other end to the end that contacts the object 2601 to a ground potential.

In some embodiments of the ninth aspect of the present disclosure, one or more of the same electrodes that were used to charge the object 2601 also discharge the object 2601. The discharge can therefore be improved by increasing the number of electrodes used to charge the object 2601. The number of electrodes used to charge the object 2601 may be increased in addition to using the one or more further electrodes to discharge the object 2601.

According to a tenth aspect of the present disclosure, the object table is cleaned so as to reduce the residual force that may continue to hold the object 2601 to the object table 2602 due to the charge of the electrostatic clamp after as the electrostatic clamp is controlled to stop holding the object 2601. For example, a cleaning stone may be provided within the system to clean particles and/or contaminations on the object table 2602, especially the surface of the electrostatic clamp, that may cause or enhance the charge build-up on the surface of the electrostatic clamp. The cleaning stone may be rotated and/or translated on the object table 2602, especially on the surface of the electrostatic clamp. Alternatively, the cleaning stone may be stationary and the object table 2602 moved so that it is rotated and/or translated relative to the cleaning stone. Both the object table 2602 and the cleaning stone may also be moved during a cleaning operation so that the object table 2602, especially the surface of the electrostatic clamp, is cleaned. By providing the cleaning stone within the system, the cleaning operations by the stone can be performed without the disruption caused by opening the system.

According to an eleventh aspect of the present disclosure, unloading of the object 2601 from the object table 2602 may be performed while the residual force, or at least part of it, continue to hold the object 2601 to the object table 2602 remains.

In some embodiments, the elevation pin positioning device 2605 is more powerful than known implementations of an elevation pin positioning device. The elevation pin positioning device 2605 moves the elevation pins 2604 with an increased force so that a larger force is used to raise the object 2601. This is expected to achieve the effect of the force applied by the elevation pins 2604 being sufficient to overcome the residual force that is preventing the object 2601 from being raised from the object table 2602.

In another example, the elevation pin positioning device 2605 vibrates the elevation pins 2604 in the z direction so that the ends of the elevation pins 2604 impact the object 2601. The vibrational movement of the elevation pins 2604 that contact the object 2601 is expected to achieve the effect of the raising of the object 2601 above the object table 2602 by the elevation pins 2604 being easier.

In yet another example, the primary positioning device 506 vibrates in a direction in the x-y plane and/or in the x-y plane. The vibrational movement of the primary positioning device 506 applies a horizontal vibrational force to the object 2601 via the elevation pins 2604. This is expected to achieve the effect of the raising of the object 2601 above the object table 2602 by the elevation pins 2604 being easier.

In yet another example, the table positioning device 2603 vibrates the object table 2602 in one or more of a direction in the x-y plane, x-y plane and the z direction. Additionally, or alternatively, the vibrating movement may also be rotational with the movement being about one or more of the x-axis, the y-axis and the z-axis. The vibrational movement of the object table 2602 is expected to achieve the effect of the raising of the object 2601 above the object table 2602 by the elevation pins 2604 being easier.

In the above embodiments, the applied vibrational movement may be along one or more of a direction in the x-y plane, the x-y plane and the z direction. The applied vibrational movement may in addition, or alternatively, be rotational with the movement about any of the x-axis, the y-axis and the z-axis. The table positioning device 2603, elevation pin positioning device 2605 and a positioning device 2606 may make any possible movements to apply the vibrations. For example, if the positioning device 2606 is able to move the z direction then the positioning device 2606 may apply a vibrational movement in the z direction.

The vibrational movement may be dependent on any of a number of different types of control signal. For example, the signal may be a sawtooth wave, sinusoidal wave, a noise signal and/or a pseudo-noise signal.

Figure 28:
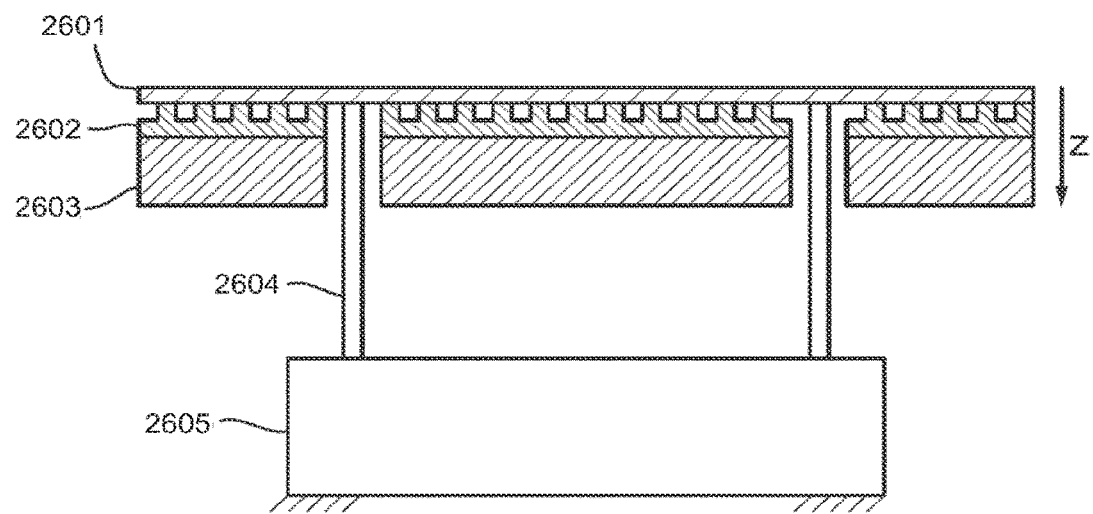
FIG. 28 is a conceptual figure that shows an object on an object table, according to some embodiments of the present disclosure.

Yet another example is shown in FIG. 28. In the yet another example, the table positioning device 2603 moves the object table 2602 in the z direction in a direction towards the elevation pin positioning device 2605, as shown by the arrow in FIG. 28. The position of the elevation pins 2604 in the z direction may be mechanically locked so that the movement of the elevation pins 2604 in the z direction is prevented. The effect of this is that the object 2601 is forced against the ends of the elevation pins 2604 and this is expected to achieve the effect of the object 2601 being removed, or made easier to remove, from the object table 2602.

In the example, the actuators of the table positioning device 2603 may be more powerful than those of the elevation pin positioning device 2605. The actuators of the table positioning device 2603 may also have a larger servo bandwidth than those of the elevation pin positioning device 2605 and this would allow the force applied by the table positioning device 2603 to be controlled faster than that of the elevation pin positioning device 2605. In an alternative implementation of the example, the table positioning device 2603 may move the object table 2602 in the z direction in a direction towards the elevation pin positioning device 2605 and the elevation pin positioning device 2605 may also control the elevation pins 2604 to move in the z direction towards the object 2601.

In some embodiments, the table positioning device 2603 can be designed with more powerful actuators than known table positioning devices and the elevation pin positioning device 2605 to be designed with less powerful actuators than known elevation pin positioning devices. This would simplify the design and implementation of the elevation pin positioning device 2605. In addition to being able to apply a higher force than the elevation pin positioning device 2605, the table positioning device 2603 may also comprise more actuators than the elevation pin positioning device 2605. A table positioning device 2603 typically comprises 3 or 4 actuators for applying movements in the z direction.

In yet another example, the object 2601 may effectively be peeled off the object table 2602.

Figure 29:
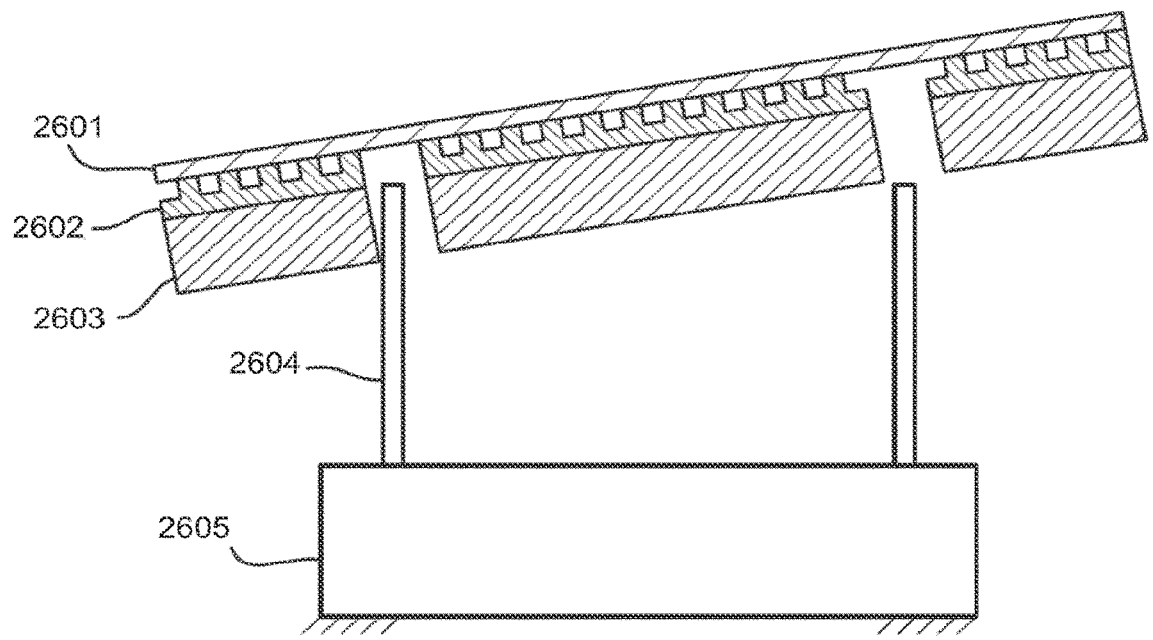
FIG. 29 is a conceptual figure that shows an object on an object table, according to some embodiments of the present disclosure.

The example is shown in FIG. 29. In the example, the table positioning device 2603 rotates the object table 2602 about the x-axis and/or y-axis. The extent of the angle of rotation shown in FIG. 29 is large so that the rotation is clearly illustrated. The actual angle of rotation may be a lot less than that shown in FIG. 7. The position of one or more of the elevation pins 2604 in the z direction may be mechanically locked so the movement of the elevation pin(s) 2604 in the z direction is prevented. Alternatively, the position of one or more of the elevation pins 2604 in the z direction are not mechanically locked. One or more of the elevation pins 2604 may move in the z direction to increase the force applied to the object 2601. The effect of this is that the object 2601 is forced against the ends of one or more of the elevation pins 2604. This is expected to achieve the effect of the object 2601 being removed, or made easier to remove, from the object table 2602 because the object 2601 may effectively be peeled off the object table 2602.

In some embodiments, one or more, but not all, of the elevation pins 2604 are controlled to apply a force for raising the object 2601. Alternatively, all of the elevation pins 2604 may be controlled to apply a force for raising the object 2601 but some of the elevation pins 2604 controlled to apply a larger force than others. The effect of this is that the elevation pins 2604 may apply a greater force on one side of the object 2601 than the other side of the object 2601. This is expected to achieve the effect of the object 2601 being removed, or made easier to remove, from the object table 2602 because the object 2601 may effectively be peeled off the object table 2602.

In the above embodiments of the aspect of the present disclosure also include increasing the force that can be applied by each of the elevation pins 2604 over that applied according to known techniques. There may be any number of elevation pins 2604. For example, the number of elevation pins 2604 may be 3, 6, 12, or more. Embodiments include making the ends of the elevation pins 2604 that contact the object 2601 with an increased diameter from known elevation pins 2604. Both this, and increasing the number of elevation pins 2604, improves the spread of the force applied by the elevation pins 2604 over the surface of the object 2601 and thereby reduces the risk of the object 2601 being damaged by the applied forces.

In the embodiments of the aspect of the present disclosure, the vibrations preferably have a small magnitude so that they result in only small movements. Any of the techniques of the embodiments of the aspect of the present disclosure can be combined with each other. For example the elevation pins 2604 may be vibrated in the z direction as the table positioning device 2603 rotates the object table 2602 relative to the z direction. In this implementation according to some embodiments the vibrated elevation pins 2604 would not be mechanically locked in position.

Further embodiments may be described in the following clauses:

1. An object table comprising
    a clamping mechanism for holding an object;
    a loading/unloading mechanism configured to contact the object to load or unload the object;
    an electrical conductor configured to electrically connect the object to a voltage source or an electrical ground to apply a predetermined voltage to the object during at least part of an unloading sequence of the object.
2. The object table according to clause 1, wherein the electrical conductor is configured to form a low mechanical stiffness connection when the object is held on the object table.
3. The object table according to clause 1 or clause 2, wherein the electrical conductor has a cross-section and wherein a mechanical stiffness of the electrical conductor is lower than a mechanical stiffness of an electric wire having the same cross-section.
4. The object table according to clause 2, wherein the mechanical stiffness is substantially zero at least part of a time span when the object is held on the object table.
5. The object table according to any of the preceding clauses, wherein the electrical conductor is configured to disconnect the object from the voltage source or electrical ground when the object is held on the object table.
6. The object table according to any of the preceding clauses, wherein the electrical conductor comprises an electric wire having a coil shaped portion.
7. The object table according to clause 6, wherein the coil shaped portion comprises one or more windings or turns.
8. The object table according to clause 6 or 7, wherein the coil shaped portion is arranged in a spiraling manner around a pin-shaped member of the loading/unloading mechanism.
9. The object table according to clause 8, wherein an end of the coil shaped portion is connected to the pin-shaped member.
10. The object table according to any of the preceding clauses, further comprising an electrode.
11. The object table according to clause 10, wherein the electrode is mounted at or near a top surface of the object table.
12. The object table according to clause 10 or 11, wherein the electrode substantially surrounds the clamping mechanism.
13. The object table according to any of the clauses 10 to 12, wherein the electrical conductor is configured to electrically connect the object to the electrode or to the electric ground.
14. The object table according to any of the clauses 10 to 13, wherein an elevated voltage is configured to be applied to the electrode during said at least part of an unloading sequence.
15. The object table according to any of the clauses 10 to 14, wherein the electrode is electrically isolated from the object during said at least part of an unloading sequence.
16. The object table according to any of the clauses 10 to 15, wherein
17. the electrode is configured to be moved away from the object before said at least part of an unloading sequence.

18. The object table according to any of the clauses 10 to 16, wherein the clamping mechanism is configured to be moved away from the electrode before said at least part of an unloading sequence.
19. The object table according to any of the clauses 10 to 17, wherein the loading/unloading mechanism comprises one or more pin-shaped members for contacting the object to unload the object.
20. The object table according to clause 18, wherein the electrical conductor electrically connects at least one of the one or more pin-shaped members with the electrode or the electric ground.
21. The object table according to clause 19, wherein at least part of the electric conductor is electrically shielded.
22. The object table according to clause 20, wherein the object table comprises an electrical shield configured to shield at least a part from the electrical conductor, the electrical shield being electrically connected to the electrode.
23. The object table according to any of the clauses 1 to 8, wherein the electrical conductor comprises a pin-shaped member for contacting the object during the at least part of the unloading sequence of the object.
24. The object table according to clause 22, further comprising an electrode, wherein the electrical conductor is retractable when the electrode is charged so as to avoid a discharge from the electrode to the electrical conductor.
25. The object table according to clause 23, wherein the electrical conductor is retractable to a position whereby the electrical conductor is not surrounded by the clamp mechanism.
26. The object table according to any of the preceding clauses, wherein the loading/unloading mechanism comprises one or more pin-shaped members for contacting the object to unload the object, at least one of the one or more pin-shaped members forms at least a part of the electrical conductor.
27. The object table according to any of the clauses 22 to 25, wherein the pin-shaped member comprises an ionisable gas.
28. The object table according to clause 26, wherein the pin-shaped member is configured to receive an ionisable gas.
29. The object table according to clause 26 or 27, wherein the ionisable gas comprises Ar or Ne.
30. The object table according to any of the preceding clauses, wherein the electrical connector comprises a first connector member and a second connector member, whereby the first connector member and the second connector member are configured to form an electrical connection during the at least part of the unloading sequence of the object.
31. The object table according to clause 29, wherein the first connector member or the second connector member comprises a cantilever.
32. The object table according to clause 30, wherein the cantilever comprises a bendable electrical conductor.
33. The object table according to clause 29, wherein the first connector member comprises an aperture and the second connector member is configured to protrude through the aperture.
34. The object table according to clause 32, wherein the first connector member or the second connector member comprise a plurality of brush like conductive wires to form the electrical connection when the second connector member protrudes the aperture.
35. The object table according to any of the preceding clauses, wherein the electrical connector comprises the end effector gripper.
36. An object table comprising
a support structure;
a clamping mechanism for holding an object, clamping mechanism being arranged on the support structure;
a loading/unloading mechanism configured to contact the object to load or unload the object;
an electrode mounted to the support structure;
an electrical conductor configured to electrically connect the object to the electrode during at least part of an unloading sequence of the object.
37. The object table according to clause 35, wherein the electrode substantially surrounds the clamping mechanism.
38. The object table according to clause 35, wherein the electrical conductor comprises a flexible portion, configured to deform during the at least part of an unloading sequence of the object, so as to maintain in contact with the object.
39. An object table comprising:
an electrostatic clamp configured to hold an object;
a measurement unit configured to determine one or more electric characteristics of the electrostatic clamp, the one or more electric characteristics being representative of one or more charge states of the electrostatic clamp;
a control unit configured to control, before and/or during an unloading of the object, one or more power supplies of the electrostatic clamp, based on the determined one or more electric characteristics.
40. The object table according to clause 38, wherein the electrostatic clamp comprising one or more electrodes for generating one or more electric fields between the object and the electrostatic clamp.
41. The object table according to clause 38 or 39, wherein the measurement unit is configured to measure one or more voltages of the electrostatic clamp as the one or more electric characteristic.
42. The object table according to clause 40 when dependent on clause 39, wherein the one or more voltages of the electrostatic clamp comprises one or more voltages of the one or more electrodes.
43. The object table according to any of clauses 38 to 41, wherein the measurement unit is configured to measure one or more currents supplied to the electrostatic clamp as the one or more electric characteristics.
44. The object table according to clause 42 when dependent on clause 39, wherein the one or more currents supplied to the electrostatic clamp comprises one or more currents supplied to the one or more electrodes.
45. The object table according to any of the clauses 38 to 43, wherein the measurement unit is configured to measure one or more voltages of the object and/or one or more currents supplied from/to the object.
46. The object table according to clause 44, wherein the object table comprises a connecting pin configured to electrically connect to the object when the object is positioned on the object table and wherein the measurement unit is configured to measure at least one of the one or more voltages of the object via the connecting pin.

47. The object table according to any of the clauses 38 to 45, wherein the object table comprises a loading/unloading mechanism for loading and unloading the object.
48. The object table according to clause 46, wherein the loading/unloading mechanism comprises a lifting mechanism configured to lift the object from the electrostatic clamp.
49. The object table according to any of the clauses 38 to 47, wherein the measurement unit is configured to measure the one or more electric characteristic of the electrostatic clamp during a loading or unloading of the object.
50. The object table according to any of the clauses 38 to 48, wherein the object table further comprises an electrode surrounding the electrostatic clamp.
51. The object table according to any of the clauses 38 to 49, wherein the one or more charge states comprises a surface charge on a surface of the electrostatic clamp or a surface charge distribution on the surface of the electrostatic clamp.
52. The object table according to clause 50, wherein the control unit is configured to control one or more power supplies of the electrostatic clamp so as to generate one or more electric fields that are configured to at least partly compensate an electric field as generated by the surface charge to at least partly compensate a sticking of the object caused by the surface charge of the electrostatic clamp.
53. The object table according to any of clauses 1 to 37, wherein the wherein the at least part of the electric conductor is electrically shielded.
54. An object table for holding an object, comprising:
an electrostatic clamp for clamping the object on the object table;
an ionizer device for providing an ionized flow of gas;
a control unit arranged to control the ionizer device to provide the ionized flow of gas to the electrostatic clamp.
55. Object table of clause 53, wherein the control unit is arranged to receive an information signal representative of a residual force or a residual charge, wherein the residual force is applied by the electrostatic clamp on the object during unloading of the object from the electrostatic clamp, and wherein the residual charge is an electrostatic charge present on the electrostatic clamp when no charge voltage is applied to the electrostatic clamp, and wherein the control unit is arranged to control the ionizer device based on the information signal.
56. Object table according to clause 54, comprising a measurement unit for providing a measurement signal representative of the residual force or the residual charge, wherein the information signal comprises the measurement signal, and wherein the control unit is arranged to control the ionizer device based on the measurement signal.
57. An object table for holding an object, comprising:
an electrostatic clamp for clamping the object on the object table;
a control unit arranged to provide to the electrostatic clamp a charge voltage to clamp the object on the electrostatic clamp and a discharge voltage to unclamp the object from the electrostatic clamp,
wherein the control unit is arranged to receive an information signal representative of a residual force or a residual charge,
wherein the control unit is arranged to provide the discharge voltage based on the information signal.
58. Object table according to clause 56, wherein the discharge voltage has a polarity opposite to the charge voltage.
59. Object table according to clauses 56 or 57, comprising an ionizer device for providing an ionized flow of gas to the electrostatic clamp, wherein the control unit is arranged to control the ionizer device based on the information signal.
60. Object table according to clauses 53-58, wherein the information signal comprises at least one of measurement information and/or estimated information.
61. Object table according to any of clauses 56-59, wherein, during unloading, the control unit is arranged to receive an updated information signal representative of an updated residual force or an updated residual charge, wherein the control unit is arranged to adjust the discharge voltage based on the updated information signal or the control unit is arranged to adjust the control of the ionizer device based on the updated information signal.
62. Object table according to any clauses 53-60, comprising an unloading mechanism, wherein the measurement unit is arranged to monitor a lift force applied by the unloading mechanism on the object to lift the object from the electrostatic clamp during unloading, wherein the measurement signal comprises a measurement of the lift force.
63. Object table according to clause 61, wherein the measurement unit comprises a force sensor to provide the measurement of the lift force.
64. Object table according to clause 62, wherein the unloading mechanism comprises at least one lift pin arranged to push the object away from the electrostatic clamp during unloading, wherein the lift pin comprises the force sensor.
65. Object table according to any of clauses 53-63, wherein the measurement unit comprises a gap sensor arranged to provide the measurement signal based on the object in a first state and the object in a second state, wherein, in the first state, the object is on the electrostatic clamp, and wherein, in the second state, the object is away from the electrostatic clamp.
66. Object table according to clause 64, wherein the object performs a movement from the first state to the second state, wherein the measurement signal is representative of the movement.
67. Object table according to clause 64 or 65 wherein the gap sensor comprises a capacitance sensor.
68. Object table according to any of clauses 53-66, wherein the control unit is arranged to compare the information signal with a threshold value.
69. An apparatus comprising the object table of any of clauses 53-67, wherein the apparatus is one of a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus and a metrology apparatus.
70. Method for unloading an object from an electrostatic clamp, the method comprising:
unloading the object from the electrostatic clamp;
providing an ionized flow of gas to the electrostatic clamp.

71. Method for unloading an object from an electrostatic clamp, the method comprising:
providing an information signal representative of a residual force or a residual charge, wherein the residual force is applied by the electrostatic clamp on the object during unloading of the object from the electrostatic clamp, and wherein the residual charge is present on the electrostatic clamp when no charge voltage is applied to the electrostatic clamp;
providing a discharge voltage to unclamp the object from the electrostatic clamp based on the information signal.

72. Method according to clause 70, comprising the step of providing an ionized flow of gas to the electrostatic clamp based on the information signal.

73. Method for clamping an object on an electrostatic clamp, the method comprising:
i) providing the object on the electrostatic clamp;
ii) increasing a clamping voltage until a clamped state is detected in which the object is clamped on the electrostatic clamp;
iii) determining a first clamping voltage ($V_{max}$) being the clamping voltage at the clamped state;
iv) providing a second clamping voltage ($V_{final}$) to the electrostatic clamp, which is less than the first clamping voltage ($V_{max}$).

74. Method of clause 72, wherein the clamped state is detected when a clamping parameter is within a threshold.

75. Method of clause 73, wherein, the clamping parameter comprises one of a flatness of the object, a change in shape of the object caused by a change in the clamping voltage, and a center portion of the object being in contact with the electrostatic clamp.

76. Method of clause 74, comprising in between steps iii) and iv):
v) decreasing the clamping voltage until the clamped state is no longer detected;
vi) determining a third clamping voltage ($V_{min}$) being the clamping voltage at which the clamped state is no longer detected;
vii) providing the second clamping voltage ($V_{final}$) to the electrostatic clamp, which is higher than the third clamping voltage ($V_{min}$).

77. Method of clause 75, comprising in between steps vi) and vii):
viii) increasing the clamping voltage to the first clamping voltage ($V_{max}$).

78. Method of clause 75 or 76, wherein the second clamping voltage ($V_{final}$) is less than 150% of the third clamping voltage ($V_{min}$), for example less than 140% or less than 130% or less than 120% or less than 110% or less than 105%.

79. Method of clause 72, comprising:
ix) during step iii), determining a clamping force between the object and the electrostatic clamp, and
x) providing the second clamping voltage ($V_{final}$) based on the clamping force.

80. An object table for holding an object, wherein the object table is arranged to perform the method of the preceding clauses 72 to 78.

81. Object table of clause 79, wherein the object table comprises:
the electrostatic clamp for clamping the object; and
a control unit for providing the clamping voltage to the electrostatic clamp.

82. Object table according to clause 80, comprising a measurement unit for providing to the control unit a measurement signal representative of the clamping parameter.

83. Object table according to clause 81, wherein the measurement unit is arranged to determine whether the object is flat or bow-shaped.

84. Object table according to clause 81 or 82, wherein the measurement unit is arranged to determine a gap or a capacitance between the object and the electrostatic clamp.

85. Object table according to any of clauses 81-83, wherein the measurement unit is arranged to determine a height of the object.

86. Object table according to any of clauses 79-84, comprising a force sensor, wherein in during step iii) the force sensor is arranged to detect a clamping force with which the object is clamped on the electrostatic clamp while the first clamping voltage ($V_{max}$) is applied to the electrostatic clamp.

87. Object table according to clause 85, wherein the force sensor is movable so as to be in contact with the object during step iii) and so as to be not in contact with the object during step iv).

88. Object table according to clauses 79-86, wherein the control unit comprises a machine learning unit arranged to predict the third clamping voltage ($V_{min}$) based on the clamping voltage and the clamping parameter.

89. An apparatus comprising the object table of any of clauses 79-87, wherein the apparatus is one of a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus and a metrology apparatus.

90. The apparatus of clause 88, comprising a lifting pin for moving the object from and onto the electrostatic clamp, wherein the control unit is arranged to determine the clamping parameter based on a position of the lifting pin.

91. The apparatus of clause 88 or 89, comprising a height sensor for determining a height of the object, wherein the control unit is arranged to determine the clamping parameter based on a height signal from the height sensor.

92. A method of determining a residual charge of a clamping mechanism of an object table, the method comprising:
impinging a surface of the clamping mechanism using a particle beam;
detecting a response of the clamping mechanism caused by the impinging of the surface, and
determining the residual charge of the clamping mechanism, based on the response.

93. The method according to clause 91, wherein the particle beam comprises one or more electron beams.

94. The method according to clause 91 or 92, wherein the step of detecting the response comprises detecting secondary electrons or scattered electrons emitted by the clamping mechanism.

95. The method according to clause 93, wherein the step of detecting secondary electrons comprises measuring an energy spectrum of the secondary electrons.

96. The method according any of the clauses 91 to 94, wherein the step of impinging the surface of the clamp- 97. The method according to any of the clauses 91 to 95, wherein the clamping mechanism comprises an electrostatic clamp.
98. The method according to clause 96, wherein the electrostatic clamp comprises one or more electrodes.
99. The method according to clause 97, wherein the one or more electrodes are embedded in the surface of the electrostatic clamp.
100. The method according to any of the clauses 91 to 98, wherein the step of impinging the surface comprises impinging the surface at a plurality of locations on the surface, and wherein the step of determining the residual charge comprises determining a residual charge distribution across the surface of the clamping mechanism.
101. The method according to any of the clauses 91 to 99, further comprising the step of applying one or more voltage to the clamping mechanism to at least partially cancel the residual charge of the clamping mechanism, based on the response.
102. A particle beam apparatus configured to perform the method according to any of the clauses 91 to 100.
103. A particle beam apparatus comprising:
   a particle beam generator;
   an object table for holding an object, the object table comprising a clamping mechanism for clamping the object to the object table;
   a detector;
   a control unit, the control unit being configured to:
      control the particle beam generator to cause a particle beam to impinge on a surface of the clamping mechanism;
   the detector being configured to detect a response of the clamping mechanism, caused by the clamping mechanism being impinged by the particle beam;
   the control unit further being configured to:
      receive a detector signal from the detector, the detector signal representing the response of the clamping mechanism;
      determine a residual charge on the clamping mechanism, based on the detector signal.
104. The particle beam apparatus according to clause 102, wherein the particle beam comprises one or more electron beams.
105. The particle beam apparatus according to clause 102 or 103, wherein the apparatus further comprises a positioning device for positioning the object table relative to the particle beam generator.
106. The particle beam apparatus according to any of the clauses 102 to 104, wherein the response comprises secondary electrons or scattered electrons emitted by the clamping mechanism.
107. The particle beam apparatus according to clause 105, wherein the detector is configured to measure an energy spectrum of the secondary electrons.
108. The particle beam apparatus according any of the clauses 102 to 106, wherein the positioning device is configured to position the clamping mechanism in an operating range of the particle beam, prior to the impinging of the surface by the particle beam.
109. The particle beam apparatus according to any of the clauses 102 to 107, wherein the clamping mechanism comprises an electrostatic clamp.
110. The method according to clause 108, wherein the electrostatic clamp comprises one or more electrodes.
111. The method according to clause 109, wherein the one or more electrodes are embedded in the surface of the electrostatic clamp.
112. The method according to any of the clauses 102 to 110, wherein the control unit is configured to control the particle beam to impinge the surface at a plurality of locations on the surface, and wherein the control unit is configured to determine a residual charge distribution across the surface of the clamping mechanism.
113. The method according to any of the clauses 102 to 111, wherein the control unit is further configured to further comprising the step of applying one or more voltage to the clamping mechanism to at least partially cancel the residual charge of the clamping mechanism, based on the response.
114. A method of reducing a surface charge of a clamping mechanism, the method comprising:
   generating a particle beam, the particle beam being configured to have a secondary emission yield (SEY) substantially equal to 1 in a surface of the clamping mechanism;
   impinging the surface of the clamping mechanism using the particle beam.
115. The method according to clause 113, wherein the SEY is considered to be substantially equal to 1 when the surface of the clamping mechanism is in a neutral state.
116. The method according to clause 113 or 114, whereby the step of generating the particle beam comprises:
   determining a voltage difference between a source of the particle beam and the clamping mechanism required to obtain the SEY to be substantially equal to 1, and
   generating the particle beam by applying the determined voltage difference.
117. The method according to clause 115, whereby the voltage difference is based on a material characteristic of the clamping mechanism.
118. The method according to clause 115 or 116, whereby the voltage difference is selected to have particles of the particle beam having a landing energy (LE) corresponding to the SEY to be substantially equal to 1 when the surface of the clamping mechanism is in a neutral state.
119. The method according to clause 100, whereby the voltage difference is selected based on a derivative of the SEY with respect to the LE of the clamping mechanism, whereby the derivative of the SEY is negative around the landing energy (LE).
120. The method according to any of the clauses 113 to 118, further comprising scanning the particle beam across the surface of the clamping mechanism.
121. The method according to clause 119, whereby the particle beam comprises one or more electron beams.
122. The method according to any of the clauses 113 to 120, wherein a material of the clamping mechanism comprises $SiO_2$.
123. A particle beam apparatus comprising:
   a particle beam generator;
   an object table for holding an object, the object table comprising a clamping mechanism for clamping the object to the object table;
   a control unit, the control unit being configured to:
      control the particle beam generator to generate a particle beam, the particle beam being configured to have a secondary emission yield (SEY) substantially equal to 1 in a surface of the clamping mechanism;
control the particle beam to impinge the surface of the clamping mechanism.
124. The particle beam apparatus according to clause 122, wherein the control unit is further configured to:
determining a voltage difference between a source of the particle beam and the clamping mechanism, the voltage difference being selected to cause the SEY to be substantially equal to 1, and
control the particle beam generator to generate the particle beam by applying the determined voltage difference.
125. The particle beam apparatus according to clause 122 or 123, wherein the particle beam generator comprises an electron beam generator.
126. The particle beam apparatus according to any of the clauses 122 to 124, wherein the particle beam generator comprises a flood gun.
127. The particle beam apparatus according to any of the clauses 122 to 125, further comprising a stage apparatus configured to position the object table relative to the particle beam.
128. The particle beam apparatus according to any of the clauses 122 to 126, wherein the SEY is considered to be substantially equal to 1 when the surface of the clamping mechanism is in a neutral state.
129. The particle beam apparatus according to clause 123 to 127 referring to clause 123, whereby the voltage difference is based on a material characteristic of the clamping mechanism.
130. The particle beam apparatus according to clause 127 or 128, whereby the voltage difference is selected to have particles of the particle beam having a landing energy (LE) corresponding to the SEY to be substantially equal to 1 when the surface of the clamping mechanism is in a neutral state.
131. The particle beam apparatus according to clause 129, whereby the voltage difference is selected based on a derivative of the SEY with respect to the LE of the clamping mechanism, whereby the derivative of the SEY is negative around the landing energy (LE).
132. The particle beam apparatus according to any of the clauses 122 to 130, whereby the control unit is configured to control the particle beam generator to scan the particle beam across the surface of the clamping mechanism.
133. The particle beam apparatus according to clause 131, whereby the particle beam comprises one or more electron beams.
134. The particle beam apparatus according to any of the clauses 122 to 132, wherein a material of the clamping mechanism comprises $SiO_2$.
135. An electron beam apparatus comprising a particle beam apparatus according to any of the clauses 122 to 132.
136. An electron beam apparatus comprising a particle beam apparatus according to any of the clauses 122 to 132, the particle beam apparatus comprising a first electron beam generator for processing the object and a second electron beam generator to at least partially cancel or neutralize a charge of the surface of the clamping mechanism.
137. An object table for holding an object comprising:
an electrostatic clamp arranged to clamp the object on the object table;
one or more elevation pins arranged to lift the object up from the object table; and
a controller configured to send an actuation signal to one or more elevation pin
positioning device so as to vibrate the one or more elevation pins and/or at least part of the object table.
138. The object table according to clause 136, wherein vibrating the one or more elevation pins and/or the at least part of the object table comprises:
moving the one or more elevation pins and/or the at least part of the object table in a direction that is substantially orthogonal to a surface of the electrostatic clamp; and/or moving the one or more elevation pins and/or the at least part of the object table in a direction that is substantially parallel to the surface of the electrostatic clamp.
139. The object table according to clause 136 or 137, further comprising a positioning system that comprises the one or more actuators.
140. The object table according to clause 138, wherein the positioning system comprises:
an elevation pin positioning device comprising at least one actuator arranged to move each of the one or more elevation pins;
an object table positioning device comprising at least one actuator arranged to move the electrostatic clamp; and/or
a primary positioning device comprising at least one actuator arranged to move the table positioning device.
141. An object table comprising:
an electrostatic clamp arranged to clamp the object on the object table;
one or more elevation pins arranged to lift the object up from the object table; and
a controller configured to send an actuation signal to one or more actuators to move at least part of the object table so that, when the object is on the electrostatic clamp, the object is forced against the one or more elevation pins to thereby move the object away from the electrostatic clamp.
142. The object table according to clause 140, further comprising a locking system arranged to prevent the one or more elevation pins from moving when the object is forced against the one or more elevation pins.
143. The object table according to clause 141, wherein the locking system comprises one or more mechanical locks.
144. The object table according to any of clauses 140 to 142, wherein one or more elevation pins and/or at least part of the object table are arranged to vibrate in response to an actuation signal from the controller.
145. An object table comprising:
an electrostatic clamp arranged to clamp the object on the object table;
a plurality of elevation pins arranged to lift the object up from the object table; and
a controller configured to send an actuation signal to one or more actuators to control the movement of at least part of the object table and/or at least one of the plurality of elevation pins such that, when the object is on the surface of the support structure, at least one of the elevation pins contact the object and not all of the plurality of elevation pins simultaneously apply the same force against the object.
146. The object table according to clause 144, wherein, when the object is on the electrostatic clamp, the object table and/or plurality of elevation pins are arranged to tilt the object relative to the electrostatic clamp when removing the object from the electrostatic clamp in response to the actuation signal sent by the controller.

147. The object table according to clause 145, further comprising a locking system arranged to prevent the one or more elevation pins from moving when the object is rotated.

148. The object table according to clause 146, wherein the locking system comprises one or more mechanical locks.

149. The object table according to any of clauses 144 to 147, wherein the controller is configured to send an actuation signal to one or more actuators to control the movement of the object table and/or plurality of pins such that, when the object is on the electrostatic clamp, the object is rotationally vibrated.

150. The object table according to any of clauses 144 to 148, wherein one or more elevation pins and/or at least part of the object table are arranged to vibrate in response to the actuation signal and/or a further actuation signal from the controller.

151. An object table comprising:
an electrostatic clamp arranged to clamp the object on the object table; and
one or more electrodes arranged to charge the object;
wherein a first set of the one or more electrodes is arranged to apply an electric charge to the object; and
a second set of the one or more electrodes is arranged to electrically discharge the object.

152. The object table according to clause 150, wherein the second set of the one or more electrodes is used to electrically discharge the object but not used to apply an electric charge to the object.

153. The object table according to clause 150 or 151, further comprising one or more elevation pins configured to lift the object away from the electrostatic clamp.

154. An object table comprising:
an electrostatic clamp arranged to clamp the object on the object table; and
a cleaning device;
wherein the cleaning device is arranged to clean the electrostatic clamp.

155. The object table according to clause 153, wherein, when in use with an object, the cleaning device is arranged to clean a surface of the object.

156. The object table according to clause 153 or 154, further comprising one or more elevation pins configured to lift the object away from the electrostatic clamp.

157. An object table for holding an object, comprising:
an electrostatic clamp arranged to clamp the object on the object table;
a neutralizer arranged to neutralize a residual charge of the electrostatic clamp;
a control unit arranged to control the neutralizer.

158. The object table according to clause 156, wherein the control unit is arranged to receive an information signal representative of a residual force or the residual charge, wherein the residual force is applied by the electrostatic clamp on the object during unloading of the object from the electrostatic clamp, wherein the residual charge is an electrostatic charge present on the electrostatic clamp when no voltage is applied to the electrostatic clamp and wherein the control unit is arranged to control the neutralizer based on the information signal.

159. The object table according to clause 157, wherein the information signal comprises at least one of measurement information, estimated information and internal signal information.

160. The object table according to clause 157 or 158, further comprising a measurement unit, wherein the measurement unit comprises a force sensor configured to provide a measurement of the residual force and/or a gap sensor configured to provide a measurement of a gap between the object and the electrostatic clamp.

161. The object table according to clause 157 or 158, further comprising a further measurement unit, wherein the further measurement unit is configured to determine the information signal representing the residual charge of the electrostatic clamp, the one or more electric characteristics being representative of the residual charge of the electrostatic clamp, and wherein the further measurement unit is configured to measure one or more voltages of the electrostatic clamp as the one or more electric characteristics, or the further measurement unit is configured to measure one or more currents supplied to the electrostatic clamp as the one or more electric characteristics.

162. The object table according to clause 157 or 158, further comprising
a particle beam generator configured to generate a particle beam;
a detector configured to detect the particle beam;
wherein the control unit is configured to control the particle beam generator to impinge the particle beam on a surface of the electrostatic clamp,
wherein the detector is configured to detect a response of the electrostatic clamp, caused by the electrostatic clamp being impinged by the particle beam, and
wherein the control unit is further configured to:
receive a detector signal from the detector, the detector signal representing the response of the electrostatic clamp, and
determine the information signal representing the residual charge on the electrostatic clamp based on the detector signal.

163. The object table according to clause 156, wherein the neutralizer comprises a power source configured to apply a discharge voltage to the electrostatic clamp, and wherein the control unit is arranged to control the discharge voltage to the power source.

164. The object table according to any of clauses 157 to 161, wherein the neutralizer comprises a power source configured to apply a discharge voltage to the electrostatic clamp, and wherein the control unit is arranged to control the discharge voltage to the power source based on the information signal representing the residual charge.

165. The object table according to any of clauses 157 to 161, wherein the neutralizer is an ionizer device arranged to provide an ionized flow of gas and wherein the control unit is arranged to control the ionizer device to provide the ionized flow of gas to the electrostatic clamp.

166. An apparatus comprising the object table according to any of clauses 156 to 164, wherein the apparatus is one of a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus and a metrology apparatus.

167. Method for unloading an object from an electrostatic clamp, the method comprising:
unloading the object from the electrostatic clamp;
neutralizing a residual charge of the electrostatic clamp before, during, and/or after the unloading step.

168. Method according to clause 166, the method comprising:
providing an information signal representative of a residual force or the residual charge, wherein the residual force is applied by the electrostatic clamp on the object during unloading of the object from the electrostatic clamp, wherein the residual charge is present on the electrostatic clamp when no charge voltage is applied to the electrostatic clamp, and wherein the step neutralizing the residual charge is based on the information signal.

169. Method according to clause 167, wherein the information signal comprises at least one of measurement information, estimated information and internal signal information.

170. Method according to any of clauses 166 to 168 the method comprising a step of providing an ionized flow of gas to the electrostatic clamp based on the information signal and/or a step of providing a discharge voltage to the electrostatic clamp based on the information signal.

Although specific reference is made to the electrostatic clamp in this document, the present disclosure may be applicable to any electrical clamps which utilize similar electrical phenomenon.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the present disclosure in the context of a lithographic apparatus, embodiments of the present disclosure may be used in other apparatus. Embodiments of the present disclosure may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may be made in this text to embodiments of the present disclosure in the context of an inspection apparatus, the object table may be suitable for use in: an electron beam apparatus, a scanning electron microscope, an electron beam direct writer, an electron beam projection lithography apparatus, an electron beam inspection apparatus, an electron beam defect verification apparatus, or an electron beam metrology apparatus.

Although the present disclosure has been explained in relation to its preferred embodiments, it is to be understood that other modifications and variation can be made without departing the spirit and scope of the present disclosure as hereafter claimed.

What is claimed is:

1. An object table for holding an object, comprising:
an electrostatic clamp configured to clamp the object on the object table;
an unloading unit configured to unload the object from the object table;
a neutralizer configured to at least partially neutralize a charge of the electrostatic clamp, wherein the neutralizer is configured to at least partially neutralize the charge while the unloading unit is unloading the object; and
a sensor for obtaining information on the charge, wherein the sensor is configured to provide a first measurement associated with the object in a first state and a second measurement associated with the object in a second state, wherein, in the first state, the object is on the object table, and wherein, in the second state, the object is away from the object table.

2. The object table according to claim 1,
wherein the charge is a residual charge and/or a surface charge.

3. The object table according to claim 1,
wherein the neutralizer is configured to at least partially neutralize the charge by providing a discharge voltage to the electrostatic clamp.

4. The object table according to claim 3,
wherein the object table is configured to apply a charge voltage to the electrostatic clamp to clamp the object, wherein the discharge voltage has a polarity opposite to the charge voltage.

5. The object table according to claim 3,
wherein the sensor is configured to obtain information on a force between the object and the electrostatic clamp.

6. The object table according to claim 5,
wherein the sensor is configured to monitor a lift force applied by the unloading unit on the object to lift the object from the object table during unloading.

7. The object table according to claim 6, wherein the sensor comprises a force sensor for measuring the lift force.

8. The object table according to claim 7, wherein the unloading unit comprises at least one lift pin configured to push the object away from the object table during unloading, wherein the lift pin comprises the force sensor.

9. The object table according to claim 3, wherein the sensor comprises at least one of a gap sensor, a height sensor, and a deformation sensor.

10. The object table according to claim 3, wherein, in use, when the object moves from the first state to the second state, the measurement is representative of a movement of the object from the object table.

11. The object table according to claim 3,
wherein the neutralizer is configured to determine the discharge voltage based on information obtained by the sensor.

12. The object table according to claim 3,
wherein, during unloading, the neutralizer is configured to receive an updated information signal representative of an updated force or an updated charge, wherein the neutralizer is configured to adjust the discharge voltage based on the updated information signal.

13. The object table according to claim 3,
wherein the neutralizer is configured to determine the discharge voltage based on at least one of measurement information, estimated information and internal signal.

14. The object table according to claim 1,
wherein the unloading comprises lifting the object from the object table.

15. An apparatus comprising the object table of claim 1, wherein the apparatus is one of a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus, a metrology apparatus, and an apparatus comprising a vacuum chamber.

16. The apparatus according to claim 15,
- wherein the neutralizer is configured to at least partially neutralize the charge by providing a discharge voltage to the electrostatic clamp,
- wherein the sensor is configured to obtain information on a force between the object and the electrostatic clamp, and
- wherein, during unloading, the neutralizer is configured to receive an updated information signal representative of an updated force or an updated charge, wherein the neutralizer is configured to adjust the discharge voltage based on the updated information signal.

* * * * *